US011977777B2

(12) United States Patent
Yasuda

(10) Patent No.: US 11,977,777 B2
(45) Date of Patent: May 7, 2024

(54) SEMICONDUCTOR DEVICE INCLUDING RELAY CHIP

(71) Applicant: Kioxia Corporation, Tokyo (JP)

(72) Inventor: Yohei Yasuda, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 170 days.

(21) Appl. No.: 17/681,423

(22) Filed: Feb. 25, 2022

(65) Prior Publication Data

US 2022/0398043 A1 Dec. 15, 2022

(30) Foreign Application Priority Data

Jun. 9, 2021 (JP) ................................ 2021-096711

(51) Int. Cl.

| | |
|---|---|
| ***G11C 7/00*** | (2006.01) |
| ***G06F 3/06*** | (2006.01) |
| ***G11C 7/10*** | (2006.01) |
| ***G11C 7/22*** | (2006.01) |
| ***G11C 16/10*** | (2006.01) |

(52) U.S. Cl.

CPC .......... *G06F 3/0659* (2013.01); *G06F 3/0604* (2013.01); *G06F 3/0679* (2013.01); *G11C 7/1063* (2013.01); *G11C 7/109* (2013.01); *G11C 7/22* (2013.01); *G11C 16/10* (2013.01)

(58) Field of Classification Search

CPC .... G06F 3/0659; G06F 3/0604; G06F 3/0679; G06F 3/061; G06F 3/0635; G06F 3/0688; G11C 5/04; G11C 16/10; G11C 16/26

USPC ........................................................ 365/194

See application file for complete search history.

(56) References Cited

U.S. PATENT DOCUMENTS

| | | | | |
|---|---|---|---|---|
| 8,412,880 | B2 * | 4/2013 | Leibowitz | G06F 3/0688 711/E12.008 |
| 9,799,402 | B2 * | 10/2017 | Kim | G11C 16/10 |
| 11,404,097 | B2 * | 8/2022 | Park | G11C 16/26 |
| 11,507,310 | B2 * | 11/2022 | Kim | G06F 13/1689 |
| 11,562,803 | B2 * | 1/2023 | Hwang | G11C 16/102 |
| 2018/0314629 | A1 | 11/2018 | Chen et al. | |
| 2020/0293198 | A1 | 9/2020 | Anazawa | |

FOREIGN PATENT DOCUMENTS

| | | |
|---|---|---|
| JP | 5453661 B2 | 3/2014 |
| JP | 2020-149588 A | 9/2020 |

* cited by examiner

*Primary Examiner* — Tha-O H Bui
(74) *Attorney, Agent, or Firm* — Foley & Lardner LLP

(57) ABSTRACT

A semiconductor device includes a relay chip configured to be connected to a host; a first chip connected to the relay chip via a first channel; and a second chip connected to the relay chip via a second channel. The relay chip is configured to receive, from the host, a first enable signal for selecting the first channel and a second enable signal for selecting the second channel. During a first period in which the first enable signal is maintained at a non-active level and the second enable signal is maintained at an active level, the relay chip is configured to perform, in parallel, a first data transfer operation via the first channel and a first command issuing operation via the second channel.

20 Claims, 31 Drawing Sheets

SEMICONDUCTOR DEVICE INCLUDING RELAY CHIP

CROSS-REFERENCE TO RELATED APPLICATION(S)

This application is based upon and claims the benefit of priority from Japanese Patent Application No. 2021-096711, filed Jun. 9, 2021, the entire contents of which are incorporated herein by reference.

FIELD

Embodiments described herein relate generally to a semiconductor device.

BACKGROUND

A semiconductor device in which a relay chip is interposed between an external terminal connected to a host and a plurality of chips is known. In such a semiconductor device, an access from the host to the plurality of chips is performed via the relay chip. It is generally desired to access the chips with a high speed.

DETAILED DESCRIPTION

Figure 1:
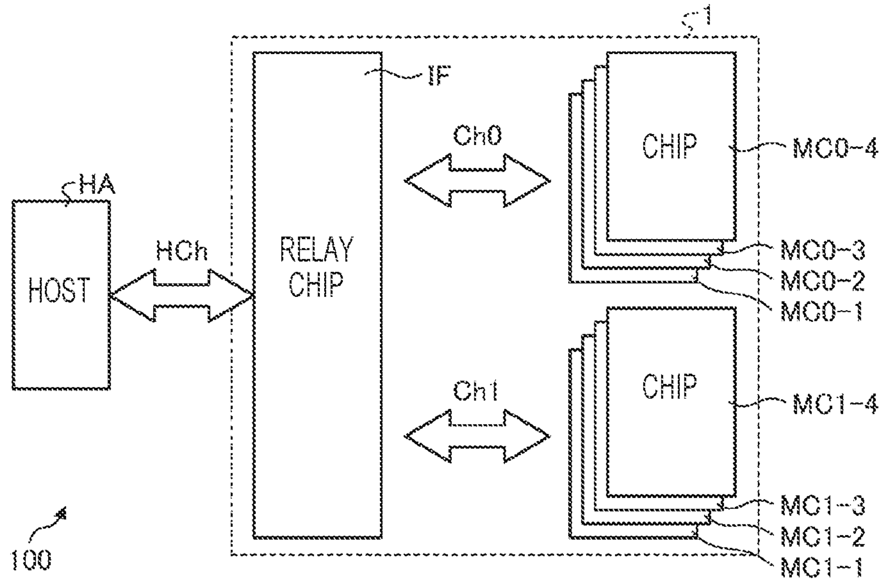
FIG. 1 is a diagram illustrating a configuration of a memory system that includes a semiconductor device according to a first embodiment.

Embodiments provide a semiconductor device capable of accessing a plurality of chips at a high speed.

In general, according to one embodiment, a semiconductor device includes a relay chip configured to be connected to a host; a first chip connected to the relay chip via a first channel; and a second chip connected to the relay chip via a second channel. The relay chip is configured to receive, from the host, a first enable signal for selecting the first channel and a second enable signal for selecting the second channel. During a first period in which the first enable signal is maintained at a non-active level and the second enable signal is maintained at an active level, the relay chip is configured to perform, in parallel, a first data transfer operation via the first channel and a first command issuing operation via the second channel.

Hereinafter, semiconductor devices according to embodiments will be described in detail with reference to the accompanying drawings. The present disclosure is not limited to the embodiments.

First Embodiment

A semiconductor device according to a first embodiment is equipped with a plurality of chips and may be connected to a host via a communication path. The semiconductor device is, for example, a nonvolatile memory device including a NAND flash memory, and includes a plurality of chips each of which is, for example, a NAND flash memory chip.

With the speed of the communication path increasing, there is a demand for an increase in the number of chips connected to the communication path to increase the capacity of the semiconductor device. Recently, the number of chips mounted on the semiconductor device has been increasing to improve the mounting density, and the mounting density is improved by stacking the chips. At this time, a relay chip called a frequency boosting interface (FBI) chip may be added between the communication path and the plurality of chips. In such a semiconductor device, the relay chip is configured to be connected to the communication path, and the relay chip and the plurality of chips are configured to communicate with each other via a plurality of channels. As a result, the load of a transmission line may be distributed and a high-speed operation is possible even when a large number of chips are mounted on the semiconductor device.

However, in this configuration, data between the host and the plurality of chips is transferred via the relay chip. At this time, in the semiconductor device, if data transfer cannot be performed via one of the plurality of channels while another one of the plurality of channels is being selected, the latency in the data transfer tends to increase. This might deteriorate the data transfer performance between the host and the plurality of chips.

Therefore, in the semiconductor device of the present embodiment, the relay chip enables the operation of accessing the plurality of chips in parallel via the plurality of channels (inter-channel interleaving operation), thereby improving the data transfer performance between the host and the plurality of chips via the relay chip.

Specifically, the relay chip that may be connected to the host is connected to a first chip via a first channel, and connected to a second chip via a second channel, to configure the semiconductor device. The relay chip receives a first enable signal and a second enable signal from the host. The first enable signal is a signal for selecting the first channel. The second enable signal is a signal for selecting the second channel. During a first period in which the first enable signal is maintained at a non-active level and the second enable signal is maintained at an active level, the relay chip is able to perform, in parallel, a data transfer operation via the first channel and a command issuing operation via the second channel As a result, the data transfer between the host and the plurality of chips via the relay chip may be efficiently performed. That is, the data transfer performance between the host and the plurality of chips may be improved.

More specifically, a memory system 100 that includes a semiconductor device 1 is configured as illustrated in FIG. 1. FIG. 1 is a diagram illustrating the configuration of the memory system 100 that includes the semiconductor device 1.

The memory system 100 includes a host HA and the semiconductor device 1. The semiconductor device 1 includes a relay chip IF and a plurality of chips MC0-1 to MC0-4 and MC1-1 to MC1-4. Hereinafter, any one of the plurality of chips MC0-1 to MC0-4 may be referred to as a chip MC0. Similarly, any one of the plurality of chips MC1-1 to MC1-4 may be referred to as a chip MC1. In the semiconductor device 1, the chips MC0-1 to MC0-4 may be stacked and the chips MC1-1 to MC1-4 may be stacked separately from the chips MC0-1 to MC0-4. In the semiconductor device 1, the periphery of the relay chip IF and the plurality of chips MC0-1 to MC0-4 and MC1-1 to MC1-4 may be sealed with a mold resin. FIG. 1 illustrates a configuration where the four chips MC0-1 to MC0-4 are connected to the relay chip IF via a channel Ch0, and the four chips MC1-1 to MC1-4 are connected to the relay chip IF via a channel Ch1. That is, the semiconductor device 1 may be configured as a multi-chip module including the plurality of (here, eight) chips MC0-1 to MC0-4 and MC1-1 to MC1-4. For example, the semiconductor device 1 is a nonvolatile memory such as a NAND flash memory, and each of the chips MC0-1 to MC0-4 and MC1-1 to MC1-4 is a memory chip.

The host HA may be a device such as a controller, or a processor provided in an electronic apparatus such as a computer or a mobile terminal to control the semiconductor device 1. The semiconductor device 1 may be connected to the host HA via a communication path. The communication path is, for example, a serial bus. The communication path functions as a channel which is a collection of communication paths between the host HA and the semiconductor device 1. Hereinafter, the communication path will be referred to as a host channel HCh to distinguish from the channels (e.g., Ch0 and Ch1) inside the semiconductor device 1. The semiconductor device 1 and the host HA are connected to each other via the host channel HCh configured based on a predetermined standard. When the host is a computer, a mobile terminal, or the like and each of the chips MC0-1 to MC0-4 and MC1-1 to MC1-4 is a NAND flash memory, the predetermined standard is, for example, an eMMC standard, a PCIe standard, an M-PHY standard, or the like. For example, the host channel HCh functions as an eMMC interface. When the host is a memory controller, and each of the chips MC0-1 to MC0-4 and MC1-1 to MC1-4 is a NAND flash memory, the predetermined standard is, for example, a toggle DDR standard, an ONFI standard, or the like. For example, the host channel HCh functions as a toggle DDR interface.

The relay chip IF is electrically connected between the host channel HCh and a plurality of (here, two) channels Ch0 and Ch1. The relay chip IF may be electrically connected to the host HA via the host channel HCh. The plurality of chips MC0-1 to MC0-4 and MC1-1 to MC1-4 are connected to the relay chip IF via the plurality of channels Ch0 and Ch1. The relay chip IF and each of the chips MC0-1 to MC0-4 and MC1-1 to MC1-4 are connected via the channels Ch0 and Ch1 respectively that are configured based on a predetermined standard.

Figure 2:
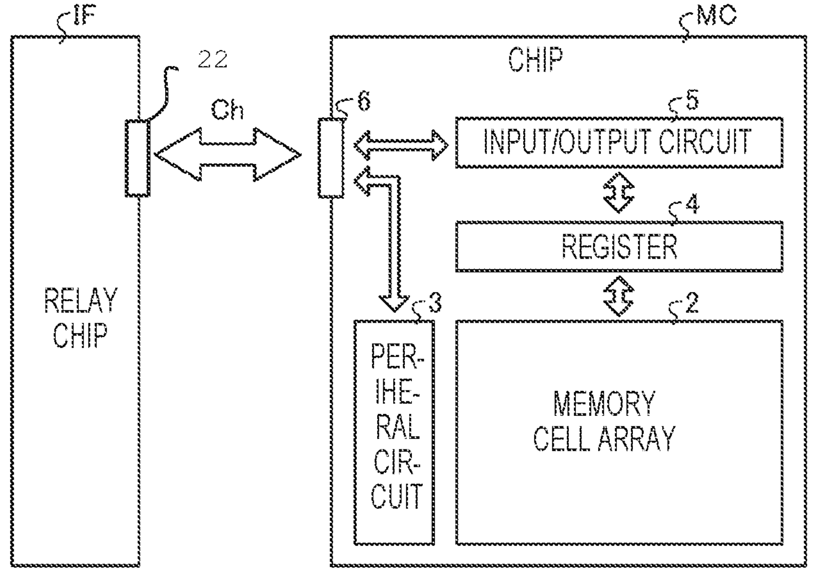
FIG. 2 is a diagram illustrating a configuration of a memory chip in the first embodiment.

Each chip MC may be configured as illustrated in FIG. 2. FIG. 2 is a diagram illustrating an example of the configuration of a chip MC.

The chip MC is, for example, a memory chip and includes a memory cell array 2, a peripheral circuit 3, a register 4, an input/output circuit 5, and a terminal group 6. The terminal group 6 of the chip MC and a terminal group 22 of the relay chip IF are connected via the channel Ch.

In the memory cell array 2, a plurality of memory cells are arranged two-dimensionally or three-dimensionally. The peripheral circuit 3 and the register 4 are respectively arranged around the memory cell array 2 and connected to the memory cell array 2. The peripheral circuit 3 may be disposed between the register 4, the input/output circuit 5, and the terminal group 6, and connected to the register 4, the input/output circuit 5, and the terminal group 6. The input/output circuit 5 may be disposed between the register 4 and the terminal group 6, and connected to the register 4 and the terminal group 6.

The peripheral circuit 3 controls an access to each memory cell of the memory cell array 2, by using the register 4 and the input/output circuit 5, in response to a command received from the relay chip IF via the channel Ch and the terminal group 6. When the peripheral circuit 3 receives a read command from the relay chip IF via the channel Ch and the terminal group 6, the peripheral circuit 3 performs a read process to each memory cell of the memory cell array 2.

Figures 3A, 3B:
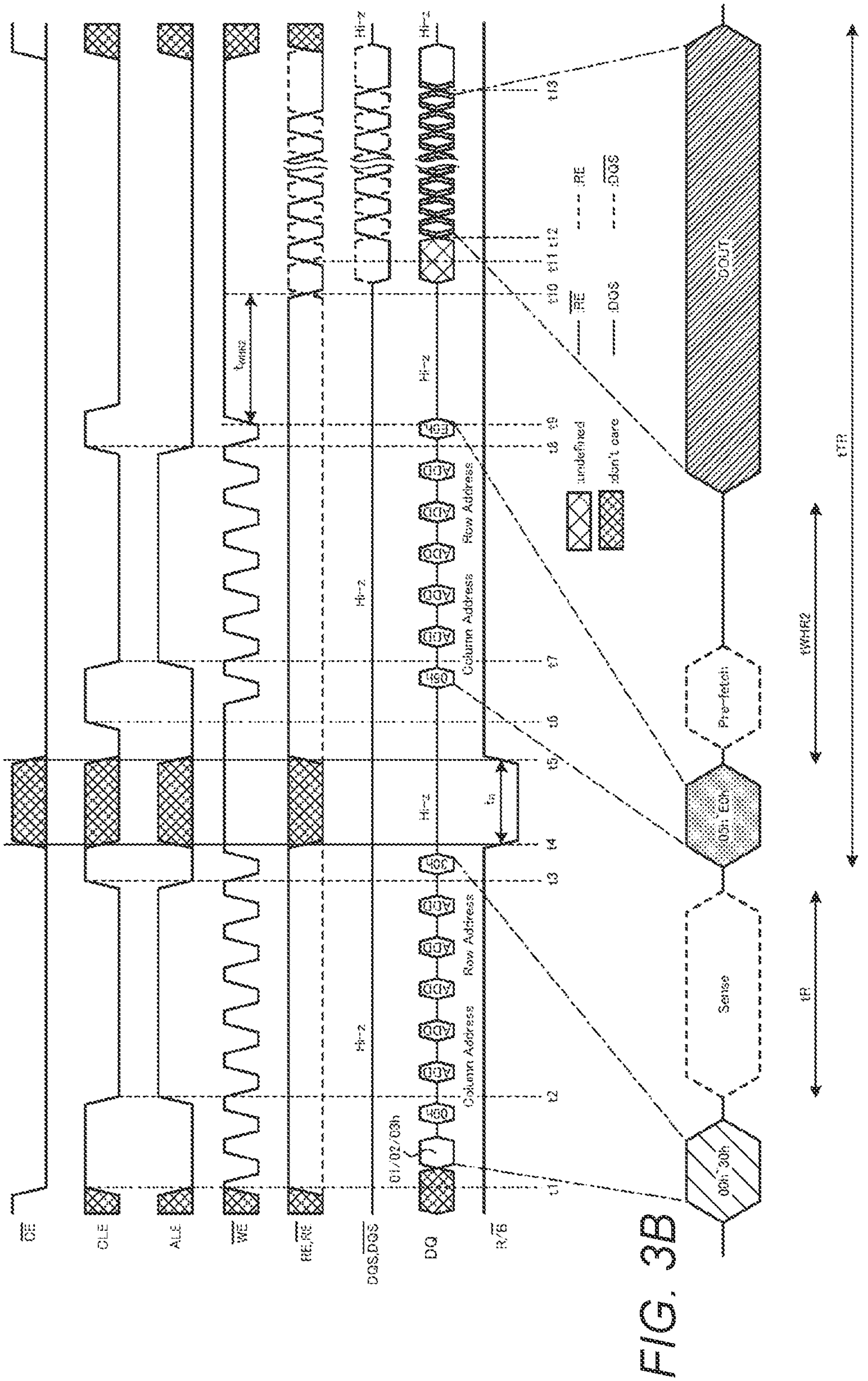
FIGS. 3A and 3B are diagrams illustrating a sequence of a read process in the first embodiment.

For example, the read process for the memory cell array 2 is performed in a sequence illustrated in FIGS. 3A and 3B. FIGS. 3A and 3B are diagrams illustrating the sequence of the read process. FIGS. 3A and 3B represent a waveform of each signal exchanged between the host HA and the semiconductor device 1 in the read process.

A chip enable signal $CE^-$ is a signal for enabling a chip at an active level (low(L) level). A command latch enable signal CLE is a signal for notifying that a data signal DQ is a command at an active level (high(H) level). An address latch enable signal ALE is a signal for notifying that the data signal DQ is an address at an active level (H level). The write enable signal $WE^-$ is a signal for enabling a write access at an active level (L level). Read enable signals $RE^-$/RE are a signal for enabling a read process at an active level (L level/H level). The read enable signal $RE^-$ and the read enable signal RE form a pair of differential signals. Data strobe signals DQS/$DQS^-$ are a timing signal for notifying the host HA to fetch transferred data in read process. The data strobe signal DQS and the data strobe signal $DQS^-$ form a pair of differential signals. The data signal DQ is a data signal exchanged between the host HA and the semiconductor device 1. A ready busy signal R/$B^-$ is a signal indicating whether or not the semiconductor device 1 is accessible. The ready busy signal R/$B^-$ indicates that the semiconductor device 1 is in a ready state (accessible) at an H level, and indicates that the semiconductor device 1 is in a busy state (inaccessible) at an L level.

In the sequence of the read process, each signal transitions as illustrated in FIG. 3A. At timing t1, when the chip enable signal $CE^-$ is asserted, and the command latch enable signal CLE is asserted, a page designation command "01h/02h/03h" to designate a read target page (e.g., lower page, middle page, or upper page) and a sense operation command "00h" are transferred in this order as the data signal DQ from the host HA to the semiconductor device 1.

At timing t2, when the command latch enable signal CLE is de-asserted, and the address latch enable signal ALE is asserted, addresses "ADD" such as a column address and a row address are transferred as the data signal DQ from the host HA to the semiconductor device 1.

At timing t3, when the address latch enable signal ALE is de-asserted, and the command latch enable signal CLE is asserted, a sense start command "30h" is transferred as the data signal DQ from the host HA to the semiconductor device 1.

In response to the sense start command "30h", in a period tR of timing t4 to t5, the peripheral circuit 3 of the chip MC sets the voltage of a selected word line to a read voltage, and sets the voltage of a non-selected word lines to a non-selective voltage. The peripheral circuit 3 of the chip MC performs a sense operation on a designated page of a memory cell group designated by the row address. The peripheral circuit 3 of the chip MC transfers data for one page read by the sense operation to the register 4, and stores the data in the register 4. During the period tR, the ready busy signal R/$B^-$ is maintained busy (low level). Meanwhile, before and after the period tR, the ready busy signal R/$B^-$ is maintained as ready (high level).

At timing t6, when the command latch enable signal CLE is asserted, a transfer command "05h" is transferred as the data signal DQ from the host HA to the semiconductor device 1.

At timing t7, when the command latch enable signal CLE is de-asserted, and the address latch enable signal ALE is asserted, addresses "ADD" such as a column address and a row address are transferred as the data signal DQ from the host HA to the semiconductor device 1.

At timing t8, when the address latch enable signal ALE is de-asserted, and the command latch enable signal CLE is asserted, an output start command "E0h" is transferred as the data signal DQ from the host HA to the semiconductor device 1.

In response to the output start command "E0h", the relay chip IF performs a prefetch operation during a period tWHR2 of timings t9 to t10. That is, the peripheral circuit 3 of the chip MC transfers data in the register 4 designated by the column address to the input/output circuit 5, and transfers at least some of the data which have been transferred to the input/output circuit 5, to the relay chip IF via the terminal group 6, the channel Ch, and the terminal group 22. The relay chip IF stores (prefetches) the transferred data in a predetermined circuit.

At timing t11, the read enable signals $RE^-$/RE from the host HA to the semiconductor device 1 start to be toggled.

In response to the read enable signals $RE^-$/RE, during a period from timing t12 to t13, the relay chip IF toggles the data strobe signals DQS/$DQS^-$ according to the read enable signal $RE^-$/RE, outputs the data strobe signals DQS/$DQS^-$ to the host HA, and outputs the data signal DQ which is transferred from the chip MC to the host HA.

In the following, the command sequence of the read process illustrated in FIG. 3A is simplified as illustrated in FIG. 3B. That is, the commands of the timings t1 to t4 are represented by "00h to 30h", the commands of the timings t6 to t9 are represented by "05h to E0h", and the operations of the timings t12 to t13 are represented by "DOUT". The sense operation according to "00h to 30h" is performed in the period tR of the timings t4 to t5. The prefetch operation according to "05h to E0h" is performed in the period tWHR2 of the timings t9 to t10. Further, a period that includes the period of "05h to E0h", the period tWHR2, and a period of "DOUT" is defined as tTR. During the period of "05h to E0h", a command for data transfer is issued. In the period tWHR2, the data transfer (prefetch) operation from the chip MC to the relay chip IF via the channel Ch is performed. During the period of "DOUT", the data transfer operation from the chip MC or the predetermined circuit to the host HA via the channel Ch and the relay chip IF is performed. Hereinafter, a process including the command issuing operation for the data transfer and the data transfer operation is called a data transfer process. The period tTR is a period during which the data transfer process is performed.

Figure 4:
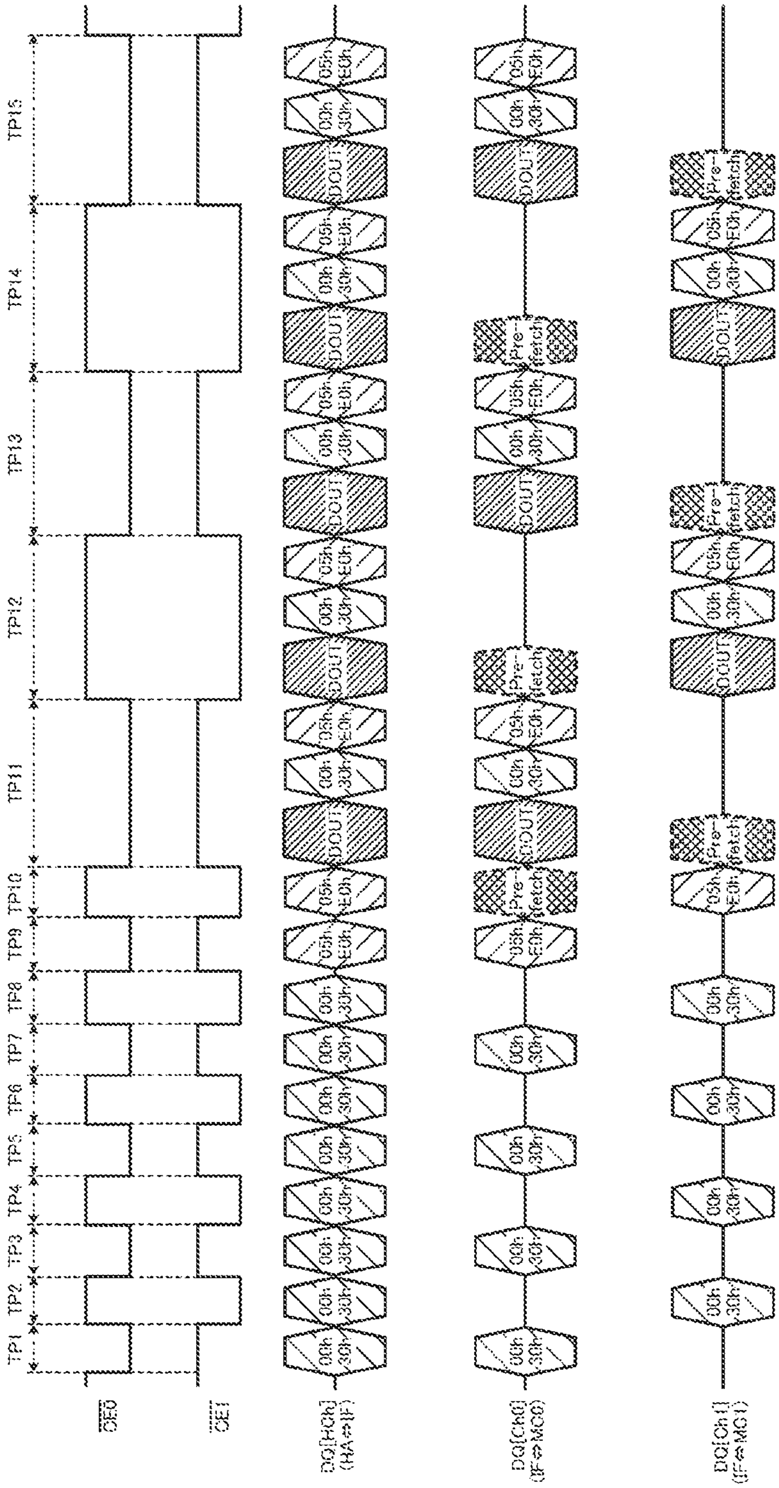
FIG. 4 is a waveform diagram illustrating an operation of the semiconductor device according to the first embodiment.

As illustrated in FIG. 4, the semiconductor device 1 is able to perform an inter-channel interleaving operation. FIG. 4 is a diagram illustrating the operation of the semiconductor device 1, and represents the inter-channel interleaving operation performed while alternately selecting the channels Ch0 and Ch1 for the read process. In FIG. 4, the illustration of the sense operation is omitted for the sake of simplicity.

The host HA generates different chip enable signals $CE0^-$ and $CE1^-$ for the channels Ch0 and Ch1 and transmits the chip enable signals to the semiconductor device 1 via the host channel HCh. The chip enable signal $CE0^-$ is transmitted as a signal for selecting the channel Ch0 from the host HA. The chip enable signal $CE0^-$ indicates that the channel Ch0 should be selected at an active level (e.g., low level) and that the channel Ch0 should be non-selected at a non-active level (e.g., high level). The chip enable signal $CE1^-$ is transmitted as a signal for selecting the channel Ch1 from the host HA. The chip enable signal CE1⁻ indicates that the channel Ch1 should be selected at an active level (e.g., low level) and that the channel Ch1 should be non-selected at a non-active level (e.g., high level).

When the chip enable signals CE0⁻ and CE1⁻ are received from the host HA via the host channel HCh, the semiconductor device 1 performs an operation according to the levels of the chip enable signals CE0⁻ and CE1.

For example, when a period TP1 starts, the relay chip IF selects the channel Ch0 according to the transition of the chip enable signal CE0⁻ to the active level, and keeps the channel Ch1 non-selected as the chip enable signal CE1⁻ is maintained at the non-active level. In this state, the relay chip IF transfers the commands "00h to 30h" received via the host channel HCh to the chip MC0 as a data signal DQ[Ch0] via the channel Ch0.

When the period TP1 ends and a period TP2 starts, the relay chip IF non-selects the channel Ch0 according to the transition of the chip enable signal CE0⁻ to the non-active level, and selects the channel Ch1 according to the transition of the chip enable signal CE1⁻ to the active level. In this state, the relay chip IF transfers the commands "00h to 30h" received via the host channel HCh to the chip MC1 as a data signal DQ[Ch1] via the channel Ch1.

In periods TP3 to TP8, the same operation as the period TP1 and the same operation as the period TP2 are alternately performed.

When the period TP8 ends and a period TP9 starts, the relay chip IF selects the channel Ch0 according to the transition of the chip enable signal CE0⁻ to the active level and non-selects the channel Ch1 according to the transition of the chip enable signal CE1⁻ to the non-active level. In this state, the relay chip IF transfers the commands "05h to E0h" received via the host channel HCh to the chip MC0 as the data signal DQ[Ch0] via the channel Ch0.

When the period TP9 ends and a period TP10 starts, the relay chip IF non-selects the channel Ch0 according to the transition of the chip enable signal CE0⁻ to the non-active level, and selects the channel Ch1 according to the transition of the chip enable signal CE1⁻ to the active level. In this state, the relay chip IF transfers the commands "05h to E0h" received via the host channel HCh to the chip MC1 as the data signal DQ[Ch1] via the channel Ch1.

At this time, the relay chip IF performs a prefetch operation via the non-selected channel Ch0. That is, the peripheral circuit 3 of the chip MC0 transfers the read data in the register 4 designated by the column address to the input/output circuit 5, and transfers at least some of the read data which have been transferred to the input/output circuit 5, to the relay chip IF as the data signal DQ[Ch0] via the terminal group 6 and the channel Ch0. The relay chip IF stores (prefetches) the transferred data signal DQ[Ch0] in a predetermined circuit.

When the period TP10 ends and a period TP11 starts, the relay chip IF selects the channel Ch0 according to the transition of the chip enable signal CE0⁻ to the active level, and non-selects the channel Ch1 according to the transition of the chip enable signal CE1⁻ to the non-active level. In this state, the relay chip IF performs the data transfer operation from the chip MC0 or the predetermined circuit to the host HA via the relay chip IF. During the period TP11, first, the relay chip IF transfers the prefetched data signal DQ[Ch0] to the host HA as the data signal DQ[HCh] via the host channel HCh. In parallel to the transfer of the prefetched data signal DQ[Ch0], the relay chip IF stores the data signal DQ[Ch0] transferred from the chip MC0 via the channel Ch0 in response to the operation "DOUT", and transfers the stored data signal DQ[Ch0] to the host HA as the data signal DQ[HCh] via the host channel HCh.

At this time, the relay chip IF performs a prefetch operation via the non-selected channel Ch1. That is, the peripheral circuit 3 of the chip MC1 transfers the read data in the register 4 designated by the column address to the input/output circuit 5, and transfers at least some of the read data which have been transferred to the input/output circuit 5, to the relay chip IF as the data signal DQ[Ch1] via the terminal group 6 and the channel Ch1. The relay chip IF stores (prefetches) the transferred data signal DQ[Ch1] in a predetermined circuit.

When the data transfer to the host HA is completed, the relay chip IF transfers the commands "00h to 30h" received via the host channel HCh to the chip MC0 as the data signal DQ[Ch0] via the channel Ch0. Further, the relay chip IF transfers the commands "05h to E0h" received via the host channel HCh to the chip MC0 as the data signal DQ[Ch0] via the channel Ch0.

When the period TP11 ends and a period TP12 starts, the relay chip IF non-selects the channel Ch0 according to the transition of the chip enable signal CE0⁻ to the non-active level, and selects the channel Ch1 according to the transition of the chip enable signal CE1⁻ to the active level. In this state, the relay chip IF performs the data transfer operation from the chip MC1 or the predetermined circuit to the host HA via the relay chip IF. During the period TP12, first, the relay chip IF transfers the prefetched data signal DQ[Ch1] to the host HA as the data signal DQ[HCh] via the host channel HCh. In parallel to the transfer of the prefetched data signal DQ[Ch1], the relay chip IF stores the data signal DQ[Ch1] transferred from the chip MC1 via the channel Ch1 in response to the operation "DOUT", and transfers the stored data signal DQ[Ch1] to the host HA as the data signal DQ[HCh] via the host channel HCh.

At this time, the relay chip IF performs a prefetch operation via the non-selected channel Ch0. That is, the peripheral circuit 3 of the chip MC0 transfers the read data in the register 4 designated by the column address to the input/output circuit 5, and transfers at least some of the read data which have been transferred to the input/output circuit 5, to the relay chip IF as the data signal DQ[Ch0] via the terminal group 6 and the channel Ch0. The relay chip IF stores (prefetches) the transferred data signal DQ[Ch0] in a predetermined circuit.

When the data transfer to the host HA is completed, the relay chip IF transfers the commands "00h to 30h" received via the host channel HCh to the chip MC1 as the data signal DQ[Ch1] via the channel Ch1. Further, the relay chip IF transfers the commands "05h to E0h" received via the host channel HCh to the chip MC1 as the data signal DQ[Ch1] via the channel Ch1.

In periods TP13 to TP15, the same operation as the period TP11 and the same operation as the period TP12 are alternately performed.

Figure 5:
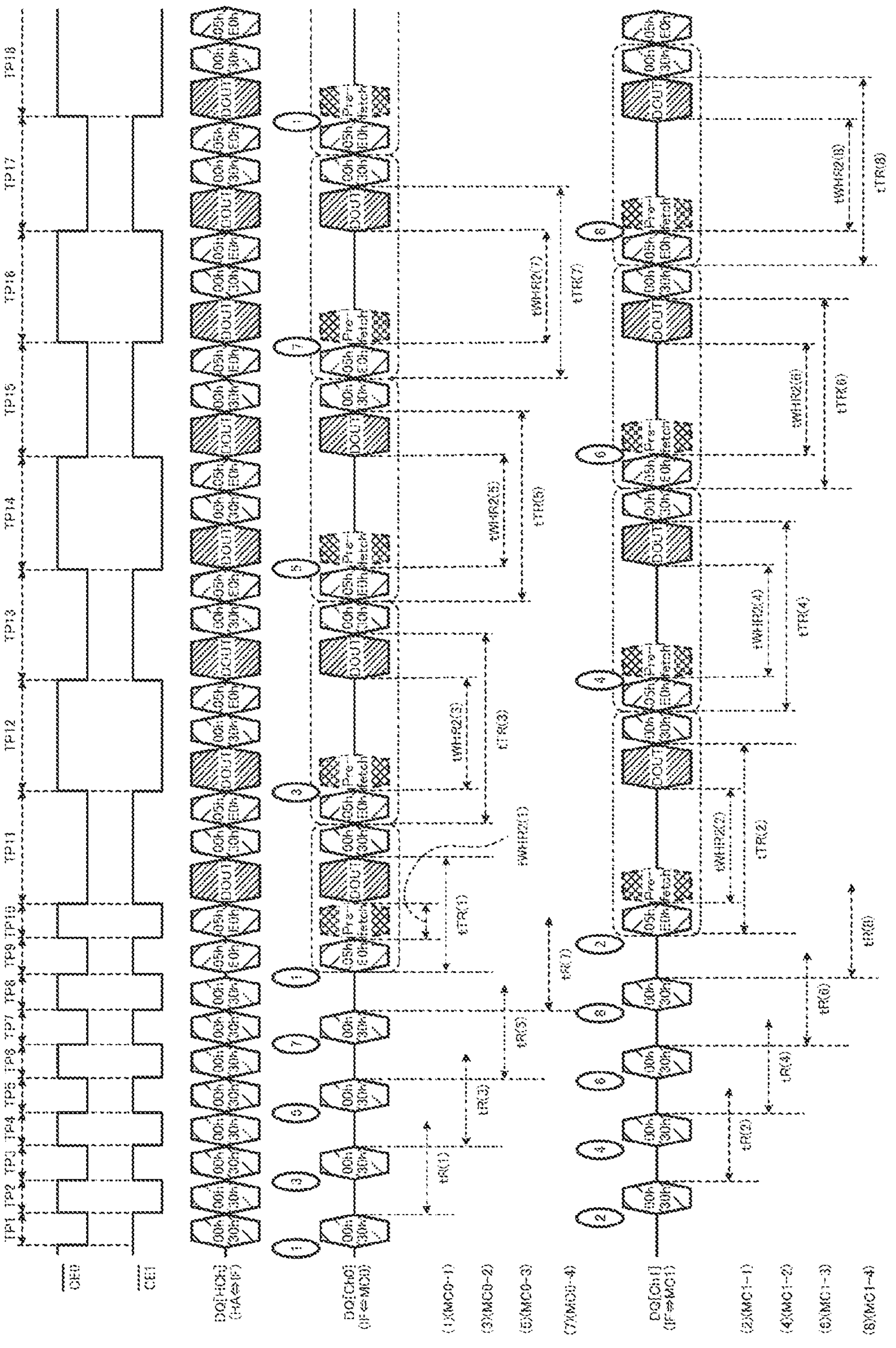
FIG. 5 is a waveform diagram illustrating the operation of the semiconductor device according to the first embodiment.

The operation illustrated in FIG. 4 may be represented for each chip as illustrated in FIG. 5. FIG. 5 is a waveform diagram illustrating the operation of the semiconductor device 1 for each chip. For the sake of simplicity, the chips MC0-1, MC0-2, MC0-3, and MC0-4 connected to the channel Ch0 are also referred to as chips (1), (3), (5), and (7), respectively, and the chips MC1-1, MC1-2, MC1-3, and MC1-4 connected to the channel Ch1 are also referred to as chips (2), (4), (6), and (8), respectively.

The chip (1) of the channel Ch0 is addressed by the commands "05h to E0h" of the period TP9. The chip (2) of the channel Ch1 is addressed by the commands "05h to E0h"

of the period TP10. The chip (3) of the channel Ch0 is addressed by the commands "05h to E0h" in the second half of the period TP11. The chip (4) of the channel Ch1 is addressed by the commands "05h to E0h" in the second half of the period TP12. The chip (5) of the channel Ch0 is addressed by the commands "05h to E0h" in the second half of the period TP13. The chip (6) of the channel Ch1 is addressed by the commands "05h to E0h" in the second half of the period TP14. The chip (7) of the channel Ch0 is addressed by the commands "05h to E0h" in the second half of the period TP15. The chip (8) of the channel Ch1 is addressed by the commands "05h to E0h" in the second half of the period TP16.

Here, the period tWHR2 for performing the prefetch operation is assigned the chip number (N: N=1 to 8) to be expressed as tWHR2(N). That is, a period tWHR2(1) is the period TP10, a period tWHR2(2) is the period TP11, a period tWHR2(3) is the period TP12, a period tWHR2(4) is the period TP13, a period tWHR2(5) is the period TP14, a period tWHR2(6) is the period TP15, a period tWHR2(7) is the period TP16, and a period tWHR2(8) is the period TP17.

As illustrated in FIG. 5, the periods tWHR2(1) to tWHR2(8) are exclusively and sequentially started and ended. The periods tWHR2(1) to tWHR2(8) are alternately started and ended for the channel Ch0 and the channel Ch1. In the periods tWHR2(1) to tWHR2(8), the prefetch operation is performed via a non-selected channel Ch, and the command issuance or the like is performed via a selected channel Ch. As a result, the periods tWHR2(1) to tWHR2(8) can be concealed from the data signal DQ[HCh].

Similarly to the period tWHR2, here, the period tTR during which the data transfer process is performed is assigned the chip number (N: N=1 to 8) to be expressed as tTR(N). That is, a period tTR(1) is from the period TP9 to the first half of the period TP11, a period tTR(2) is from the period TP10 to the first half of the period TP12, a period tTR(3) is from the second half of the period TP11 to the first half of the period TP13, a period tTR(4) is from the second half of the period TP12 to the first half of the period TP14, a period tTR(5) is from the second half of the period TP13 to the first half of the period TP15, a period tTR(6) is from the second half of the period TP14 to the first half of the period TP16, a period tTR(7) is from the second half of the period TP15 to the first half of the period TP17, and a period tTR(8) is from the second half of the period TP16 to the first half of the period TP18.

As illustrated in FIG. 5, the periods tTR(1) to tTR(8) start sequentially in a pipeline-manner, progress partially in parallel, and end in sequence. The periods tTR(1) to tTR(8) start and end alternately for the channel Ch0 and the channel Ch1. As a result, the data transfer process of the plurality of chips (1) to (8) may be efficiently performed while concealing the periods tWHR2(1) to tWHR2(8) from the data signal DQ[HCh].

Similarly to the commands "05h to E0h", the chip (1) of the channel Ch0 is addressed by the commands "00h to 30h" of the period TP1. The chip (2) of the channel Ch1 is addressed by the commands "00h to 30h" of the period TP2. The chip (3) of the channel Ch0 is addressed by the commands "00h to 30h" of the period TP3. The chip (4) of the channel Ch1 is addressed by the commands "00h to 30h" of the period TP4. The chip (5) of the channel Ch0 is addressed by the commands "00h to 30h" of the period TP5. The chip (6) of the channel Ch1 is addressed by the commands "00h to 30h" of the period TP6. The chip (7) of the channel Ch0 is addressed by the commands "00h to 30h" of the period TP7. The chip (8) of the channel Ch1 is addressed by the commands "00h to 30h" of the period TP8.

Here, the period tR for performing the sense operation is expressed as tR(N) by assigning the chip number (N: N=1 to 8). The periods tR(1) to tR(8) start sequentially in a pipeline-manner, progress in parallel with each other, and end in sequence. The periods tR(1) to tR(8) start and end alternately for the channel Ch0 and the channel Ch1. As a result, the sense operation of the plurality of chips (1) to (8) may be performed in parallel between the channel Ch0 and the channel Ch1.

Figure 6:
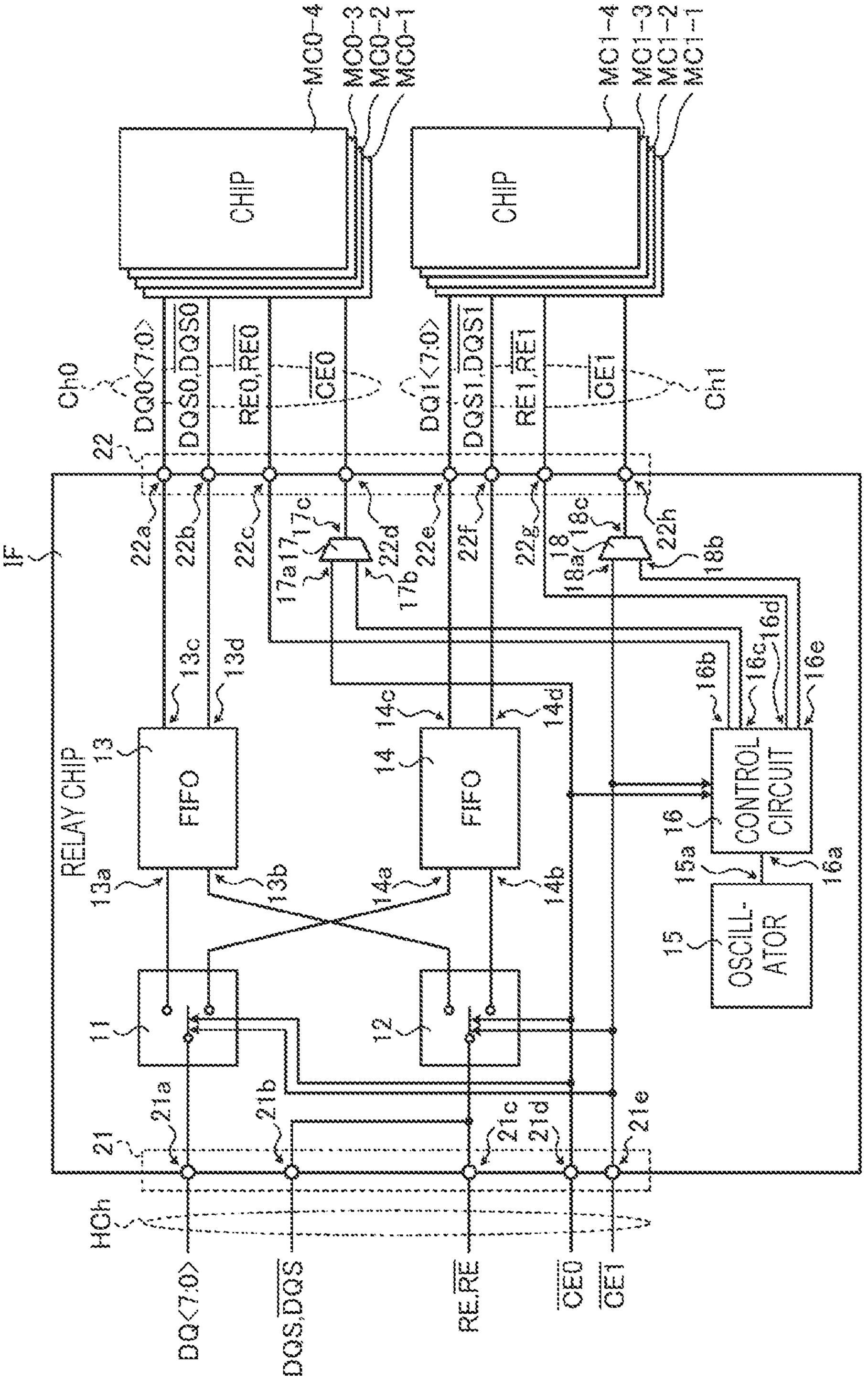
FIG. 6 is a diagram illustrating a configuration of a relay chip in the first embodiment.

Next, the configuration of the relay chip IF for performing the inter-channel interleaving operation in the read process will be described with reference to FIG. 6. FIG. 6 is a diagram illustrating the configuration of the relay chip IF.

The relay chip IF includes a switching circuit 11, a switching circuit 12, a first-in-first-out (FIFO) circuit 13, a FIFO circuit 14, an oscillator 15, a control circuit 16, a selector 17, a selector 18, a terminal group 21, and the terminal group 22.

The terminal group 21 may be connected to the host HA via the host channel HCh. The host channel HCh includes a data signal line DQ<7:0>, strobe signal lines DQS and DQS_, read enable signal lines RE and RE_, and chip enable signal lines CE0¯ and CE1¯. Correspondingly, the terminal group 21 includes a terminal group 21*a* for the data signal DQ<7:0>, a terminal group 21*b* for the strobe signals DQS and DQS¯, a terminal group 21*c* for the read enable signals RE and RE¯, a terminal 21*d* for the chip enable signal CE0¯, and a terminal 21*e* for the chip enable signal CE1¯.

The terminal group 22 may be connected to the chip MC0 via the channel Ch0, and may be connected to the chip MC1 via the channel Ch1. The channel Ch0 includes a data signal line DQ0<7:0>, strobe signal lines DQS0 and DQS0¯, read enable signal lines RE0 and RE0¯, and a chip enable signal line CE0¯. Correspondingly, the terminal group 22 includes a terminal group 22*a* for the data signal DQ0<7:0>, a terminal group 22*b* for the strobe signals DQS0 and DQS0¯, a terminal group 22*c* for the read enable signals RE0 and RE0¯, and a terminal 22*d* for the chip enable signal CE0. The channel Ch1 includes a data signal line DQ1<7:0>, strobe signal lines DQS1 and DQS1¯, read enable signal lines RE1 and RE1¯, and a chip enable signal line CE1¯. Correspondingly, the terminal group 22 includes a terminal group 22*e* for the data signal DQ1<7:0>, a terminal group 22*f* for the strobe signals DQS1 and DQS1¯, a terminal group 22*g* for the read enable signals RE1 and RE1¯, and a terminal 22*h* for the chip enable signal CE1¯.

The FIFO circuit 13 is disposed between the terminal groups 21*a*, 21*b*, and 21*c* and the terminal groups 22*a* and 22*b*, and electrically connected between the switching circuits 11 and 12 and the terminal groups 22*a* and 22*b*. On the FIFO circuit 13, a data node 13*a* may be connected to the terminal group 21*a* via the switching circuit 11, a clock node 13*b* may be connected to the terminal group 21*c* via the switching circuit 12, a data node 13*c* is connected to the terminal group 22*a*, and a clock node 13*d* is connected to the terminal group 22*b*.

The FIFO circuit 13 is a bidirectional circuit and has a plurality of queue entries. The FIFO circuit 13 performs a bypass connection between the data nodes 13*a* and 13*c* for the plurality of queue entries in response to the read enable signals RE and RE¯ received at the clock node 13*b* being maintained at the non-active level. That is, when the data signal DQ is received at the data node 13*a* while the read enable signals RE and RE¯ are maintained at the non-active level, the FIFO circuit 13 transfers the data signal DQ from the data node 13*c* to the terminal group 22*a* via the bypass connection. Alternatively, when the data signal DQ is received at the data node 13*c* while the read enable signals RE and RE$^-$ are maintained at the non-active level, the FIFO circuit 13 transfers the data signal DQ from the data node 13*a* to the terminal group 21*a* via the bypass connection. In the read process, the FIFO circuit 13 cancels the bypass connection in response to the toggle of the read enable signals RE and RE$^-$ received at the clock node 13*b*. That is, the FIFO circuit 13 enqueues, in response to the toggle of the data strobe signals DQS0 and DQS0$^-$, the data signal DQ received at the data node 13*c* in the head of the queue entries. The FIFO circuit 13 shifts, in response to the toggle of the read enable signals RE and RE$^-$, the data signal DQ enqueued in each queue entry by one entry. The FIFO circuit 13 also dequeues, in response to the toggle of the read enable signals RE and RE$^-$, the data signal DQ from the tail of the queue entries and transfers the dequeued data signal DQ from the data node 13*a* to the terminal group 21*a*.

The FIFO circuit 14 is disposed between the terminal groups 21*a*, 21*b*, and 21*c* and the terminal groups 22*e* and 22*f*, and electrically connected between the switching circuits 11 and 12 and the terminal groups 22*e* and 22*f*. On the FIFO circuit 14, a data node 14*a* may be connected to the terminal group 21*a* via the switching circuit 11, a clock node 14*b* may be connected to the terminal group 21*c* via the switching circuit 12, a data node 14*c* is connected to the terminal group 22*e*, and a clock node 14*d* is connected to the terminal group 22*f*.

The FIFO circuit 14 is a bidirectional circuit and has a plurality of queue entries. The FIFO circuit 14 performs a bypass connection between the data nodes 14*a* and 14*c* for the plurality of queue entries in response to the read enable signals RE and RE$^-$ received at the clock node 14*b* being maintained at the non-active level. That is, when the data signal DQ is received at the data node 14*a* while the read enable signals RE and RE$^-$ are maintained at the non-active level, the FIFO circuit 14 transfers the data signal DQ from the data node 14*c* to the terminal group 22*e* via the bypass connection. Alternatively, when the data signal DQ is received at the data node 14*c* while the read enable signals RE and RE$^-$ are maintained at the non-active level, the FIFO circuit 14 transfers the data signal DQ from the data node 14*a* to the terminal group 21*a* via the bypass connection. In the read process, the FIFO circuit 14 cancels the bypass connection in response to the toggle of the read enable signals RE and RE$^-$ received at the clock node 14*b*. That is, the FIFO circuit 14 enqueues, in response to the toggle of the data strobe signals DQS1 and DQS1$^-$, the data signal DQ received at the data node 14*c* in the head of the queue entries. The FIFO circuit 14 shifts, in response to the toggle of the read enable signals RE and RE$^-$, the data signal DQ enqueued in each queue entry by one entry. The FIFO circuit 14 also dequeues, in response to the toggle of the read enable signals RE and RE$^-$, the data signal DQ from the tail of the queue entries and transfers the dequeued data signal DQ from the data node 14*a* to the terminal group 21*a*.

The switching circuit 11 switches between a first connection state and a second connection state according to the chip enable signal CE0$^-$ and the chip enable signal CE1. The first connection state is a state in which the terminal group 21*a* and the data node 13*a* of the FIFO circuit 13 are connected. The second connection state is a state in which the terminal group 21*a* and the data node 14*a* of the FIFO circuit 14 are connected. The switching circuit 11 switches to the first connection state in response to the chip enable signal CE0$^-$ being at the active level and the chip enable signal CE1$^-$ being at the non-active level, and switches to the second connection state in response to the chip enable signal CE0$^-$ being at the non-active level and the chip enable signal CE1$^-$ being at the active level.

The switching circuit 12 switches between a third connection state and a fourth connection state according to the chip enable signal CE0$^-$ and the chip enable signal CE1$^-$. The third connection state is a state in which the terminal group 21*c* and the clock node 13*b* of the FIFO circuit 13 are connected. The fourth connection state is a state in which the terminal group 21*c* and the clock node 14*b* of the FIFO circuit 14 are connected. The switching circuit 12 switches to the third connection state in response to the chip enable signal CE0$^-$ being at the active level and the chip enable signal CE1$^-$ being at the non-active level, and switches to the fourth connection state in response to the chip enable signal CE0$^-$ being at the non-active level and the chip enable signal CE1$^-$ being at the active level.

On the oscillator 15, an output node 15*a* is electrically connected to the control circuit 16. On the control circuit 16, an input node 16*a* is connected to the oscillator 15, an output node group 16*b* is connected to the terminal group 22*c*, an output node 16*c* is connected to the selector 17, an output node group 16*d* is connected to the terminal group 22*g*, and an output node 16*e* is connected to the selector 18. On the selector 17, an input node 17*a* is connected to the terminal 21*d*, an input node 17*b* is connected to the control circuit 16, and an output node 17*c* is connected to the terminal 22*d*. On the selector 18, an input node 18*a* is connected to the terminal 21*e*, an input node 18*b* is connected to the control circuit 16, and an output node 18*c* is connected to the terminal 22*h*.

In response to the chip enable signal CE0$^-$ being at the active level and the chip enable signal CE1$^-$ being at the non-active level, the control circuit 16 generates the read enable signals RE0 and RE0$^-$ to be toggled and supplies the generated signals to the chip MC0, and generates the read enable signals RE1 and RE1$^-$ to be toggled and the chip enable signal CE1$^-$ of the active level, and supplies the generated signals to the chip MC1. In response to the chip enable signal CE0$^-$ being at the non-active level and the chip enable signal CE1$^-$ being at the active level, the control circuit 16 generates the read enable signals RE0 and RE0$^-$ to be toggled and the chip enable signal CE0$^-$ of the active level, and supplies the generated signals to the chip MC0, and generates the read enable signals RE1 and RE1$^-$ to be toggled and supplies the generated signals to the chip MC1.

As a result, the relay chip IF may supply an active level chip enable signal to the chip MC connected to a non-selected channel Ch. Further, the relay chip IF may supply the read enable signals RE0, RE0$^-$, RE1, and RE1$^-$ generated by the control circuit 16, instead of the read enable signals RE and RE$^-$ received from the host HA, to the chips MC0 and MC1. That is, the relay chip IF may replace the read enable signals, which are to be supplied to the chip MC via the channel Ch, from the read enable signal RE and RE$^-$ of the host HA to the read enable signal RE0, RE0$^-$, RE1, and RE1$^-$ of the control circuit 16.

The relay chip IF may operate as illustrated in FIGS. 7A to 7D. FIGS. 7A to 7D are diagrams illustrating examples of the operation of the relay chip IF. FIGS. 7A to 7D illustrate examples of the operation of the relay chip IF during the periods TP11 to TP12 illustrated in FIG. 4.

Figure 7A:
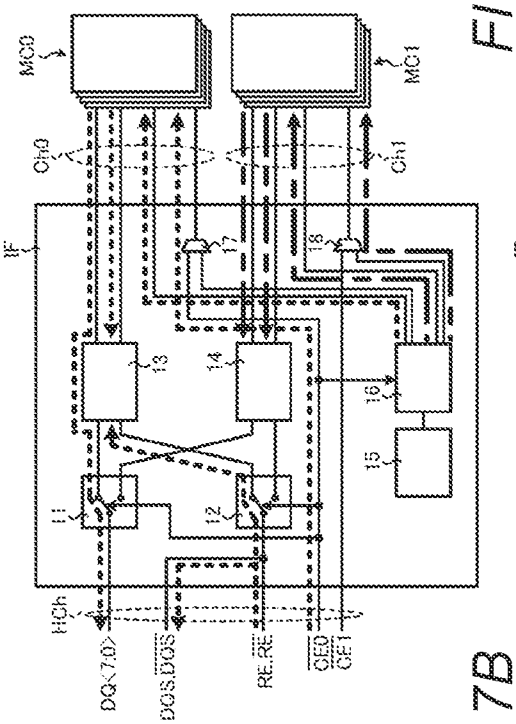
FIGS. 7A to 7D are diagrams illustrating an operation of the relay chip in the first embodiment.

At the period TP11, as illustrated in FIG. 7A, according to the transition of the chip enable signal CE0$^-$ to the active level and the transition of the chip enable signal CE1$^-$ to the non-active level, the switching circuit 11 switches to the first connection state and the switching circuit 12 switches to the third connection state.

The read enable signals RE and RE$^-$ are toggled. The relay chip IF returns the read enable signals RE and RE$^-$ as the data strobe signals DQS/DQS$^-$ to the host HA. The selector 17 selects the input node 17*a*, and transfers the chip enable signal CE0$^-$ received at the terminal 21*d* to the chip MC0 via the channel Ch0. The FIFO circuit 13 transmits some of the prefetched read data to the host HA in response to the toggled read enable signals RE and RE$^-$. Further, the control circuit 16 uses an oscillation signal from the oscillator 15 to generate the toggled read enable signals RE0 and RE0$^-$, and supplies the signals to the chip MC0 via the channel Ch0. The chip MC0 transfers the remaining portion of the read data and the data strobe signals DQS0 and DQS0$^-$ to the FIFO circuit 13 via the channel Ch0. The FIFO circuit 13 stores the transferred read data according to the data strobe signals DQS0 and DQS0$^-$ and transmits the stored read data to the host HA according to the toggled read enable signals RE and RE$^-$.

In parallel, the control circuit 16 uses the oscillation signal to generate the toggled read enable signals RE1 and RE1$^-$ and also generate the active level chip enable signal CE1. The control circuit 16 transfers the read enable signals RE1 and RE1$^-$ to the chip MC1 via the channel Ch1. The selector 18 selects the input node 18*b*, and transfers the chip enable signal CE1$^-$ generated by the control circuit 16 to the chip MC1 via the channel Ch1. In response, the chip MC1 transfers at least some of the read data and the data strobe signals DQS1 and DQS1$^-$ to the FIFO circuit 14 via the channel Ch1. The FIFO circuit 14 stores (prefetches) the transferred read data in response to the data strobe signals DQS1 and DQS1$^-$.

Figure 7B:
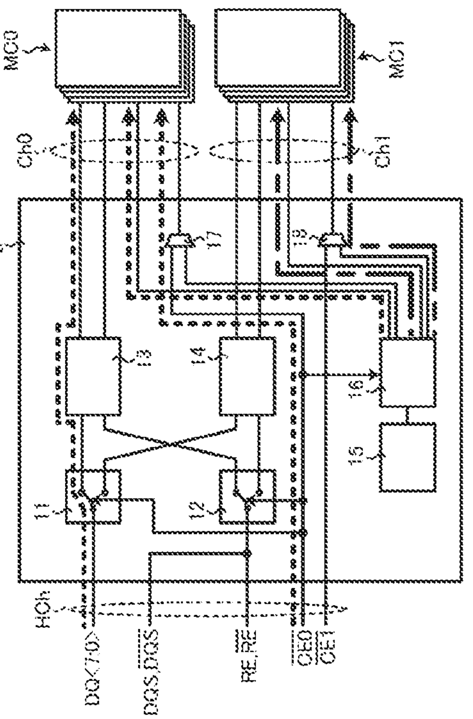

In the second half of the period TP11, as illustrated in FIG. 7B, the read enable signals RE and RE$^-$ end to be toggled and are maintained at the non-active level. The selector 17 selects the input node 17*a*, and transfers the chip enable signal CE0$^-$ received at the terminal 21*d* to the chip MC0 via the channel Ch0. In response to the read enable signals RE and RE$^-$ being maintained at the non-active level, using the bypass connection, the FIFO circuit 13 sequentially transfers the commands "00h to 30h" and the commands "05h to E0h", which are received at the terminal group 21*a*, to the chip MC0 via the channel Ch0 as the data signal DQ0.

At this time, the FIFO circuit 14 completes the prefetch of the read data transferred via the channel Ch1.

Figure 7C:
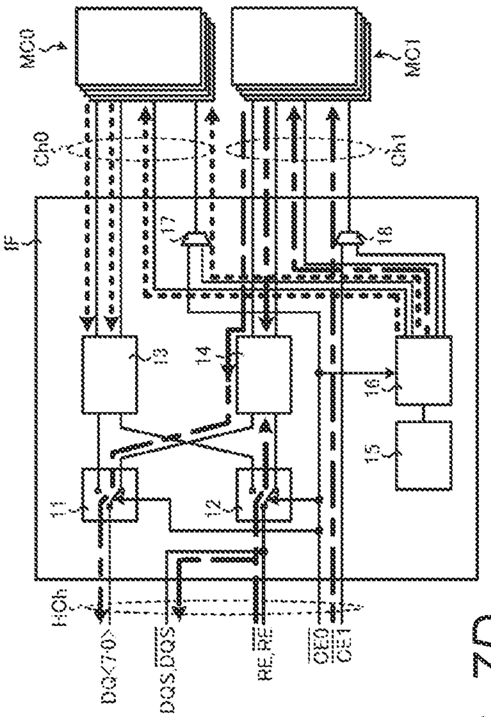

At the period TP12, as illustrated in FIG. 7C, according to the transition of the chip enable signal CE0$^-$ to the non-active level and the transition of the chip enable signal CE1$^-$ to the active level, the switching circuit 11 switches to the second connection state and the switching circuit 12 switches to the fourth connection state.

The read enable signals RE and RE$^-$ are toggled. The relay chip IF returns the read enable signals RE and RE$^-$ as the data strobe signals DQS/DQS$^-$ to the host HA. The selector 18 selects the input node 18*a*, and transfers the chip enable signal CE1$^-$ received at the terminal 21*e* to the chip MC1 via the channel Ch1. The FIFO circuit 14 transmits some of the prefetched read data to the host HA in response to the toggled read enable signals RE and RE$^-$. Further, the control circuit 16 uses the oscillation signal from the oscillator 15 to generate the toggled read enable signals RE1 and RE1$^-$, and supplies the signals to the chip MC1 via the channel Ch1. The chip MC1 transfers the remaining portion of the read data and the data strobe signals DQS1 and DQS1$^-$ to the FIFO circuit 14 via the channel Ch1. The FIFO circuit 14 stores the transferred read data according to the data strobe signals DQS1 and DQS1$^-$ and transmits the stored read data to the host HA according to the toggled read enable signals RE and RE$^-$.

In parallel, the control circuit 16 uses the oscillation signal to generate the toggled read enable signals RE0 and RE0$^-$ and also generate the active level chip enable signal CE0$^-$. The control circuit 16 transfers the read enable signals RE0 and RE0$^-$ to the chip MC0 via the channel Ch0. The selector 17 selects the input node 17*b*, and transfers the chip enable signal CE0$^-$ generated by the control circuit 16 to the chip MC0 via the channel Ch0. In response, the chip MC0 transfers at least some of the read data and the data strobe signals DQS0 and DQS0$^-$ to the FIFO circuit 13 via the channel Ch0. The FIFO circuit 13 stores (prefetches) the transferred read data in response to the data strobe signals DQS0 and DQS0$^-$.

Figure 7D:
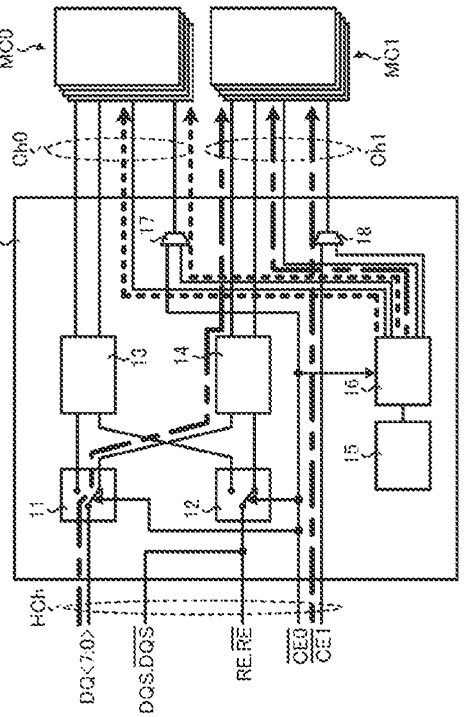

In the second half of the period TP12, as illustrated in FIG. 7D, the read enable signals RE and RE$^-$ end to be toggled and are maintained at the non-active level. The selector 18 selects the input node 18*a*, and transfers the chip enable signal CE1$^-$ received at the terminal 21*e* to the chip MC1 via the channel Ch1. In response to the read enable signals RE and RE$^-$ being maintained at the non-active level, using the bypass connection, the FIFO circuit 14 sequentially transfers the commands "00h to 30h" and the commands "05h to E0h", which are received at the terminal group 21*a*, to the chip MC1 via the channel Ch1 as the data signal DQ1.

As described above, in the first embodiment, in the semiconductor device 1, the relay chip IF enables an access operation (that is, the inter-channel interleaving operation) for the plurality of chips MC0 and MC1 in parallel via the plurality of channels Ch0 and Ch1. Thereby, for example, in the read process, the data transfer between the host HA and the plurality of chips MC0 and MC1 via the relay chip IF can be implemented while concealing the period tWHR2 for the prefetch operation. As a result, the data transfer performance between the host HA and the plurality of chips MC0 and MC1 via the relay chip IF can be improved.

Figure 8:
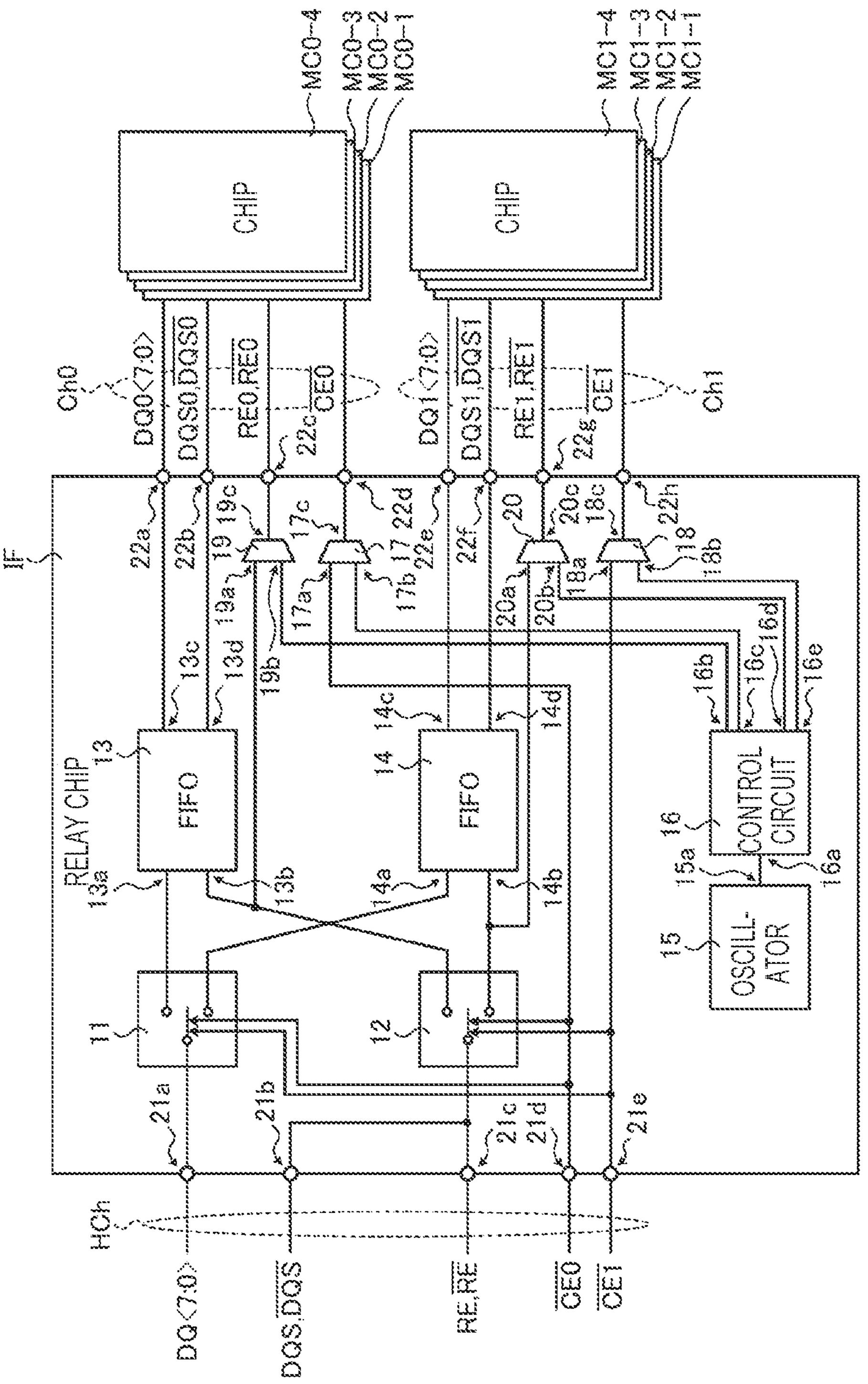
FIG. 8 is a diagram illustrating a configuration of a relay chip in a modification of the first embodiment.

Note that, the relay chip IF for performing the inter-channel interleaving operation in the read process may be configured to pass the read enable signals RE and RE$^-$ of the host HA, as illustrated in FIG. 8. FIG. 8 is a diagram illustrating the configuration of the relay chip IF in a modification of the first embodiment. The relay chip IF illustrated in FIG. 8 is different from the relay chip IF illustrated in FIG. 6 in that a selector 19 and a selector 20 are added, a line extending from the switching circuit 12 to the FIFO circuit 13 branches and extends to the selector 19, and a line extending from the switching circuit 12 to the FIFO circuit 14 branches and extends to the selector 20. On the selector 19, an input node 19*a* is connected to the switching circuit 12, an input node 19*b* is connected to the control circuit 16, and an output node 19*c* is connected to the terminal 22*c*. On the selector 20, an input node 20*a* is connected to the switching circuit 12, an input node 20*b* is connected to the control circuit 16, and an output node 20*c* is connected to the terminal 22*g*.

When the switching circuit 12 switches to the third connection state, the selector 19 selects the input node 19*a*, the relay chip IF passes the read enable signals RE and RE$^-$ from the host HA to the chip MC0 as the read enable signals RE0 and RE0 via the channel Ch0. When the switching circuit 12 switches to the fourth connection state, the selector 20 selects the input node 20*a*, the relay chip IF passes the read enable signals RE and RE‾ from the host HA to the chip MC1 as the read enable signals RE1 and RE1‾ via the channel Ch1.

Further, as illustrated in FIGS. 9A to 9D, the operation of the relay chip IF illustrated in FIG. 8 is different from that of the relay chip IF illustrated in FIG. 6 in the following points. FIGS. 9A to 9D represent an example of the operation of the relay chip IF during the periods TP11 to TP12 illustrated in FIG. 4. The description about the same portions as those in FIGS. 7A to 7D will be omitted.

Figures 9A, 9B, 9C, 9D:
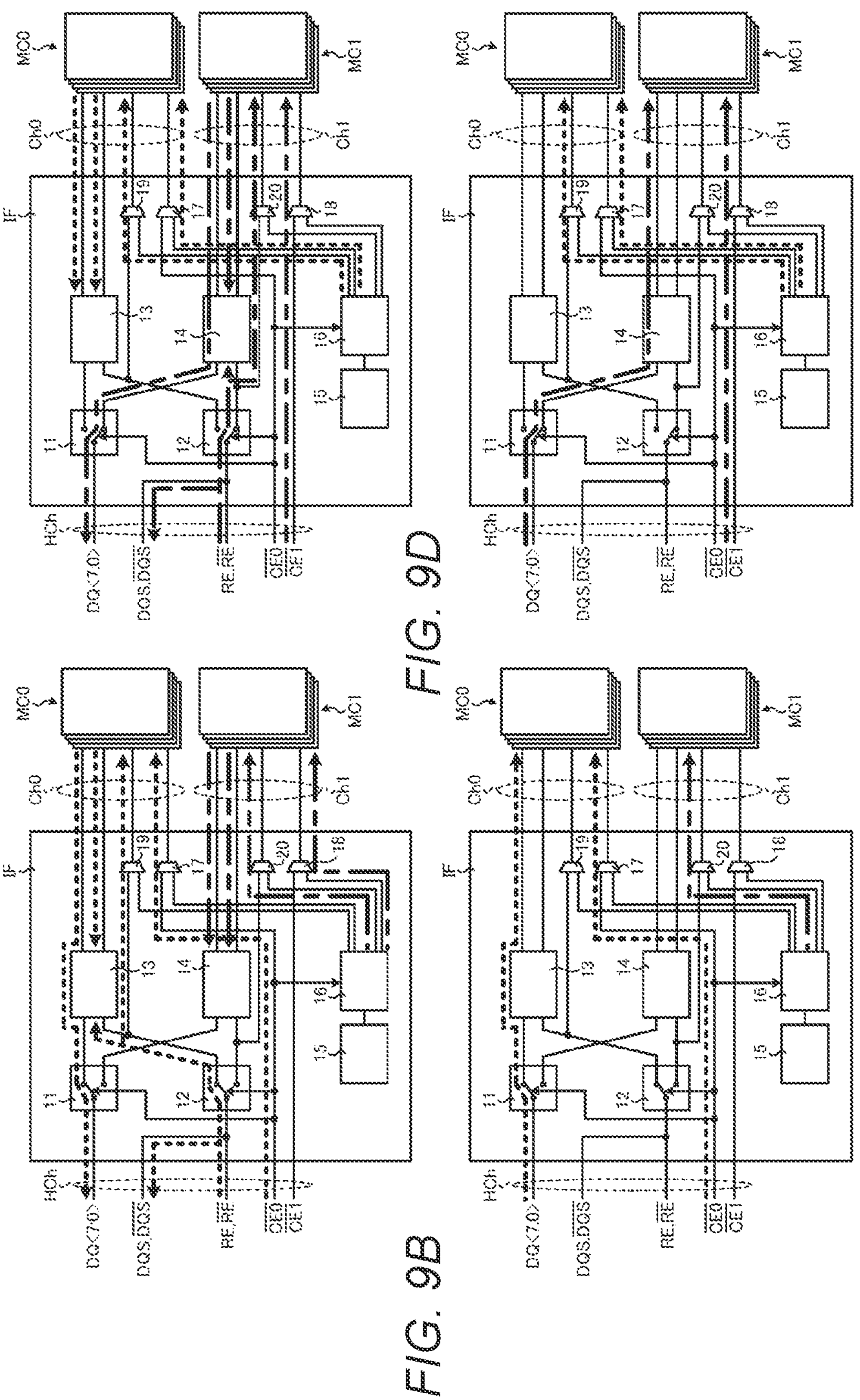
FIGS. 9A to 9D are diagrams illustrating an operation of the relay chip in the modification of the first embodiment.

At the period TP11, as illustrated in FIG. 9A, when the read enable signals RE and RE‾ are toggled, the relay chip IF returns the toggled read enable signals RE and RE‾ to the host HA as the data strobe signals DQS/DQS‾ and transfers the toggled read enable signals RE and RE‾ to the FIFO circuit 13 via the switching circuit 12. This is the same as the relay chip IF illustrated in FIG. 6. The relay chip IF supplies the toggled read enable signals RE and RE‾ to the selector 19 via the switching circuit 12. The selector 19 selects the input node 19*a*, and transfers the toggled read enable signals RE and RE‾ to the chip MC0 as the read enable signals RE0 and RE0‾ via the channel Ch0.

At this time, the selector 20 selects the input node 20*b*, receives the toggled read enable signals RE1 and RE1‾ from the control circuit 16, and transfers the signals to the chip MC1 via the channel Ch1. In response, the chip MC1 transfers at least some of the read data to the FIFO circuit 14 via the channel Ch1, and the FIFO circuit 14 stores (prefetches) the read data transferred via the channel Ch1. This is the same as the relay chip IF illustrated in FIG. 6.

Thereafter, as illustrated in FIG. 9B, the read enable signals RE and RE‾ end to be toggled and are maintained at the non-active level. At this time, the selector 20 selects the input node 20*b*, receives the toggled read enable signals RE1 and RE1 from the control circuit 16, and transfers them to the chip MC1 via the channel Ch1.

At the period TP12, as illustrated in FIG. 9C, when the read enable signals RE and RE‾ are toggled, the relay chip IF returns the toggled read enable signals RE and RE‾ to the host HA as the data strobe signals DQS/DQS‾, and transfers the toggled read enable signals RE and RE‾ to the FIFO circuit 14 via the switching circuit 12. This is the same as the relay chip IF illustrated in FIG. 6. The relay chip IF supplies the toggled read enable signals RE and RE‾ to the selector 20 via the switching circuit 12. The selector 20 selects the input node 20*a*, and transfers the toggled read enable signals RE and RE‾ to the chip MC1 as the read enable signals RE1 and RE1‾ via the channel Ch1.

At this time, the selector 19 selects the input node 19*b*, receives the toggled read enable signals RE0 and RE0‾ from the control circuit 16, and transfers the signals to the chip MC0 via the channel Ch0. In response, the chip MC0 transfers at least some of the read data to the FIFO circuit 13 via the channel Ch0, and the FIFO circuit 13 stores (prefetches) the read data transferred via the channel Ch0. This is the same as the relay chip IF illustrated in FIG. 6.

Thereafter, as illustrated in FIG. 9D, the read enable signals RE and RE‾ end to be toggled and are maintained at the non-active level. At this time, the selector 19 selects the input node 19*b*, receives the toggled read enable signals RE0 and RE0 from the control circuit 16, and transfers the signals to the chip MC0 via the channel Ch0.

In this way, the inter-channel interleaving operation in the read process can be performed by the relay chip IF illustrated in FIG. 8.

Second Embodiment

Next, a semiconductor device 1 according to a second embodiment will be described. Hereinafter, portions different from the first embodiment will be mainly described.

In the first embodiment, the operation of concealing the period tWHR2 of the read process by the function of the inter-channel interleaving operation is illustrated. In the second embodiment, an operation of increasing the speed of the data transfer of the read process by the function of the inter-channel interleaving operation is illustrated.

Figure 10:
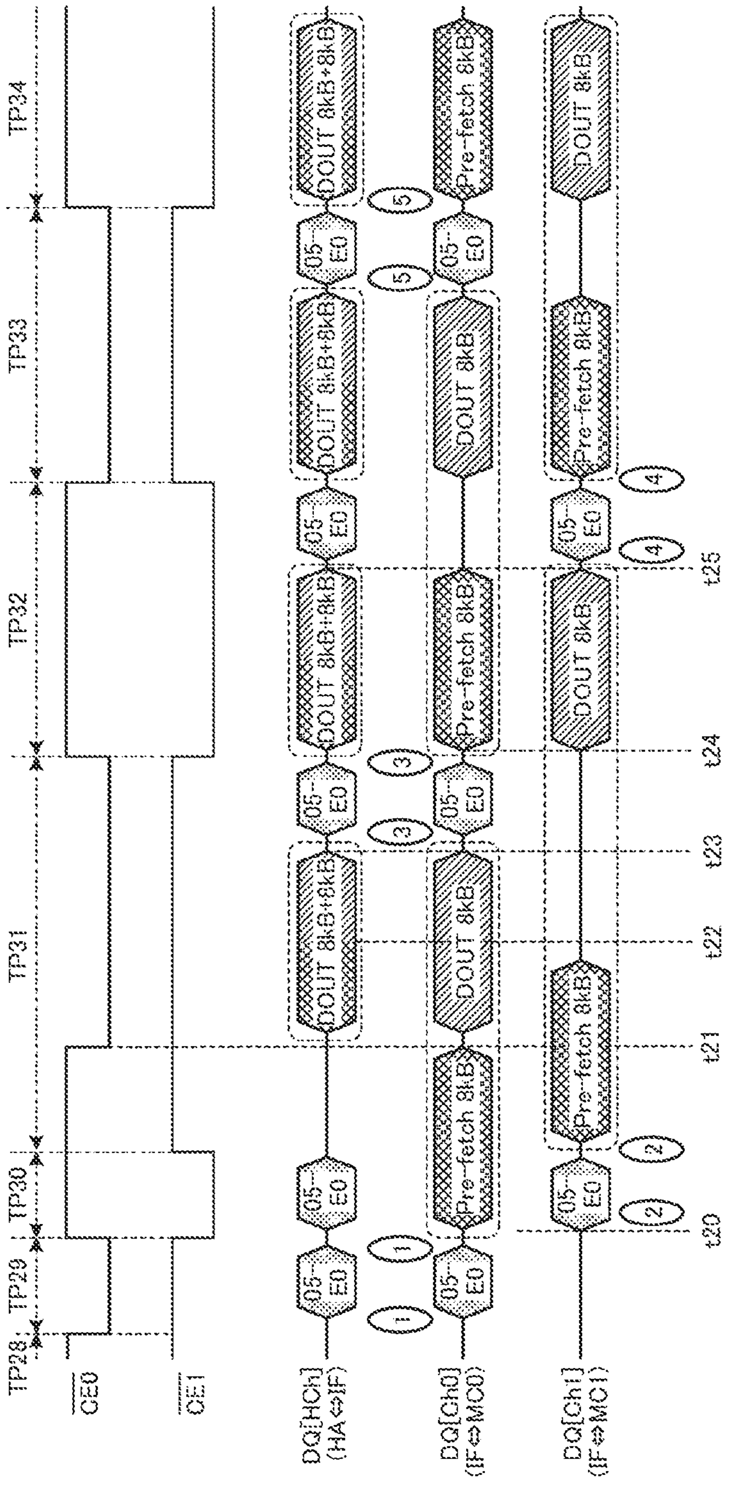
FIG. 10 is a waveform diagram illustrating an operation of a semiconductor device according to a second embodiment.

For example, when the maximum speed of the host channel HCh is twice the maximum speed of each of the channels Ch0 and Ch1, the semiconductor device 1 may double the speed of the data transfer in the semiconductor device 1 by an operation illustrated in FIG. 10. FIG. 10 is a waveform diagram illustrating the operation of the semiconductor device 1 according to the second embodiment. FIG. 10 illustrates the operations of periods corresponding to the periods TP9 to TP14 illustrated in FIGS. 4 and 5.

In FIG. 10, the end timing of the operation "DOUT" designed to be almost the same for each channel Ch and the host channel HCh. Considering that the maximum speed of the host channel HCh is twice the maximum speed of the channel Ch, the amount of data prefetched by the relay chip IF in a period is half the amount of data transferred to the host HA in the same period. FIG. 10 illustrates a case where the amount of data transferred to the host HA is 16 kB, and the amount of data prefetched by the relay chip IF is 8 kB.

In FIG. 10, the illustration of the commands "00h to 30h" is omitted for the sake of simplicity. The operations of periods TP28 to TP34 illustrated in FIG. 10 correspond to the operations of the periods TP8 to TP14 illustrated in FIG. 5. However, the operation of the period TP31 is different from the operation of the period TP11 in that the timing at which the chip enable signal CE0‾ transitions from the non-active level to the active level is timing t21 delayed from the start of the period TP31.

When the period TP28 ends and the period TP29 starts, the relay chip IF selects the channel Ch0 according to the transition of the chip enable signal CE0‾ to the active level, and non-selects the channel Ch1 according to the transition of the chip enable signal CE1‾ to the non-active level. In this state, the relay chip IF transfers the commands "05h to E0h" received via the host channel HCh to the chip (1) as the data signal DQ[Ch0] via the channel Ch0.

At timing t20, the period TP29 ends, and the period TP30 starts. The relay chip IF non-selects the channel Ch0 according to the transition of the chip enable signal CE0‾ to the non-active level, and selects the channel Ch1 according to the transition of the chip enable signal CE1‾ to the active level. In this state, the relay chip IF transfers the commands "05h to E0h" received via the host channel HCh to the chip (2) as the data signal DQ[Ch1] via the channel Ch1.

At this time, the relay chip IF starts the prefetch operation for the chip (1) via the non-selected channel Ch0. That is, the chip (1) transfers at least some of the read data to the relay chip IF as the data signal DQ[Ch0] via the channel Ch0. The relay chip IF starts storing (prefetching) the transferred data signal DQ[Ch0] in the FIFO circuit 13.

When the period TP30 ends and the period TP31 starts, the chip enable signal CE0‾ is maintained at the non-active level because the prefetch operation is continuing for the chip (1). In response, the relay chip IF keeps the channel Ch0 non-selected. At the same time, the relay chip IF non-selects the channel Ch1 according to the transition of the chip enable signal CE1‾ to the non-active level.

At this time, the relay chip IF starts the prefetch operation for the chip (2) via the non-selected channel Ch1. That is, the chip (2) transfers at least some of the read data to the relay chip IF as the data signal DQ[Ch1] via the channel Ch1. The relay chip IF starts storing (prefetching) the transferred data signal DQ[Ch1] in the FIFO circuit 14.

At the timing t21, the prefetch operation for the chip (1) is completed. The relay chip IF keeps channel Ch1 non-selected because the chip enable signal $CE1^-$ is maintained at the non-active level, and selects the channel Ch0 according to the transition of the chip enable signal $CE0^-$ to the active level. The relay chip IF transfers the prefetched data signal DQ[Ch0] to the host HA as the data signal DQ[HCh] via the host channel HCh. At the same time, in response to the operation "DOUT", the relay chip IF continues storing in the FIFO circuit 13 the data signal DQ[Ch0] transferred from the chip (1) via the channel Ch0 and internally shifts the stored data signal DQ[Ch0] between the plurality of queue entries. Also at this time, the relay chip IF continues the prefetch operation for the chip (2).

At timing t22, the transfer of the prefetched data signal DQ[Ch0] to the host HA is completed. The relay chip IF starts transferring the stored data signal DQ[Ch0], which has started to be stored from timing t21, to the host HA as the data signal DQ[HCh] via the host channel HCh. At this time, the relay chip IF completes the prefetch operation for the chip (2).

At timing t23, the transfer of the data signal DQ[Ch0] from the chip (1) to the relay chip IF via the channel Ch0 is completed. The relay chip IF internally shifts the data signal DQ[Ch0], which have been transferred from the chip (1) via the channel Ch0 and stored in the FIFO circuit 13, between the plurality of queue entries, and then, completes the transfer of the stored data signal DQ[Ch0] to the host HA. Since the period of the internal shift operation of the data signal DQ[Ch0] in the FIFO circuit 13 is so short to be ignored, the timing of the completion of transfer of the data signal DQ[Ch0] of the chip (1) to the relay chip IF and the timing of the completion of transfer of the stored data signal DQ[Ch0] to the host HA may be considered to be substantially at the same time.

As described above, for the data signal DQ[Ch0] of the chip (1), the relay chip IF prefetches half of the amount of data to be transferred, during a non-selection period of the channel Ch0 (e.g., the period of the timings t20 to t21), and uses a selection period of the channel Ch0 (e.g., the period from the timing t21 to t23) for the data transfer to the host HA. As a result, the amount of data transferred from the relay chip IF to the host HA during the period from the timing t21 to t23 can be 16 kB which is double of the amount of data (8 kB) transferred from the chip (1) to the relay chip IF via the channel Ch0 in the same period. That is, in the read process, the data transfer via the channel Ch0 in the semiconductor device 1 may be substantially doubled beyond the maximum speed of the channel Ch0.

For the data signal DQ[Ch1] of the chip (2), the relay chip IF prefetches half of the amount of data to be transferred, during a non-selection period of the channel Ch1 (e.g., the first half of the period TP31), and uses a selection period of the channel Ch1 (e.g., the period from timing t24 to t25) for the data transfer to the host HA. As a result, the amount of data transferred from the relay chip IF to the host HA during the period from the timing t24 to t25 can be 16 kB which is double of the amount of data (8 kB) transferred from the chip (2) to the relay chip IF via the channel Ch1. That is, in the read process, the data transfer via the channel Ch1 in the semiconductor device 1 may be substantially doubled beyond the maximum speed of the channel Ch1.

The data transfer for the subsequent chips (i.e., chips (3) to (7)) is the same as that for the chip (1) or (2).

As described above, in the semiconductor device 1 of the second embodiment, the data transfer via the channel Ch in the semiconductor device 1 in the read process can be speeded up beyond the maximum speed of the channel Ch by the function of the inter-channel interleaving operation.

Third Embodiment

Next, a semiconductor device 1 according to a third embodiment will be described. Hereinafter, portions different from the first and second embodiments will be mainly described.

An example of the read process by the function of the inter-channel interleaving operation is described in the first and second embodiments describe. In the third embodiment, an example of a write process by the function of the inter-channel interleaving operation will be described.

Figure 11A:
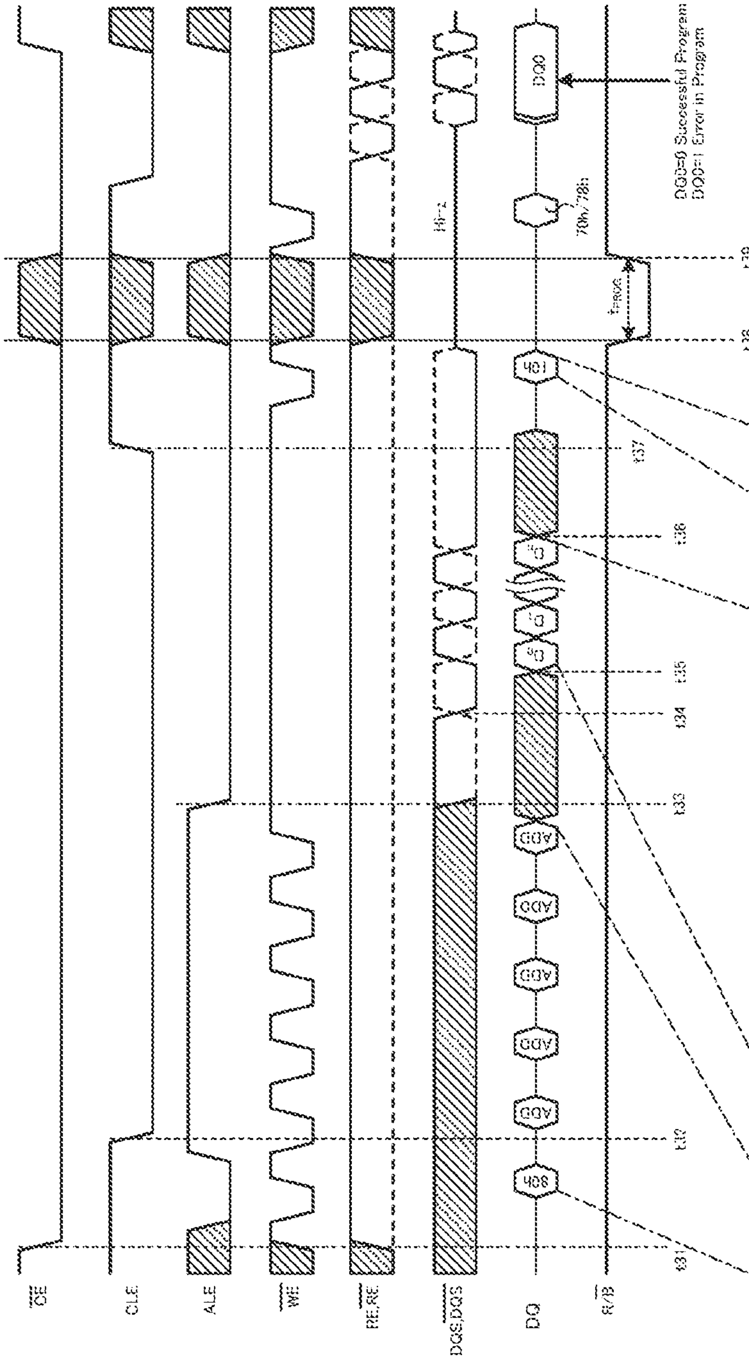
FIGS. 11A and 11B are diagrams illustrating a sequence of a write process in a third embodiment.
Figure 11B:
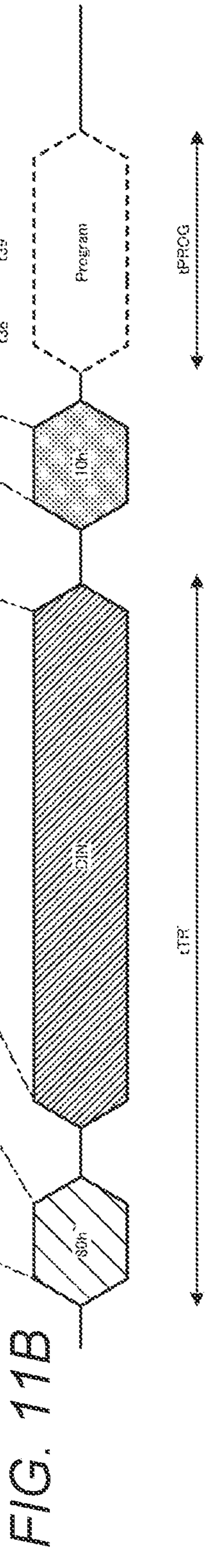

For example, the write process for the memory cell array 2 of each chip MC is performed in a sequence illustrated in FIGS. 11A and 11B. FIGS. 11A and 11B are diagrams illustrating a sequence of the write process, and represent a waveform of each signal exchanged between the host HA and the semiconductor device 1 in the write process.

In the sequence of the write process, each signal transitions as illustrated in FIG. 11A. At timing t31, when the chip enable signal CE is asserted, and the command latch enable signal CLE is asserted, a program start command "80h" is transferred as the data signal DQ from the host HA to the semiconductor device 1.

At timing t32, when the command latch enable signal CLE is de-asserted, and the address latch enable signal ALE is asserted, addresses "ADD" such as a column address and a row address are transferred as the data signal DQ from the host HA to the semiconductor device 1.

At timing t33, the address latch enable signal ALE is de-asserted, and at timing t34, the data strobe signals DQS/DQS from the host HA to the semiconductor device 1 start to be toggled.

Accordingly, in a period from t35 to t36, write data are transferred as the data signal DQ from the host HA to the semiconductor device 1. That is, the peripheral circuit 3 of the chip MC transfers the write data received at the input/output circuit 5 to the register 4 and stores the data in the register 4.

At timing t37, when the command latch enable signal CLE is asserted, a program execution command "10h" is transferred as the data signal DQ from the host HA to the semiconductor device 1.

Accordingly, the semiconductor device 1 performs a program operation in a period tPROG of timings t38 to t39. That is, the peripheral circuit 3 of the chip MC transfers the write data from the register 4 to the memory cell array 2, and performs the program operation. The peripheral circuit 3 of the chip MC writes the write data in a designated page of a memory cell group designated by the row address.

In the following, the command sequence of the write process illustrated in FIG. 11A will be simplified as illustrated in FIG. 11B. That is, the commands of the timings t31 to t33 are represented by "80h-", the operations of the timings t35 to t36 are represented by "DIN", and the commands of the timings t37 to t38 are represented by "10h". The program operation according to "10h" is performed in the period tPROG of the timings t38 to t39.

Further, a period that includes the period of "80h-" and the period of "DIN" is defined as tTR'. During the period of "80h-", a command for data transfer is issued. During the period of "DIN", the data transfer operation from the host HA to the chip MC via the relay chip IF and the channel Ch is performed. Hereinafter, a process including the command issuing operation for the data transfer and the data transfer operation is called a data transfer process. The period tTR' is a period during which the data transfer process is performed.

Figure 12:
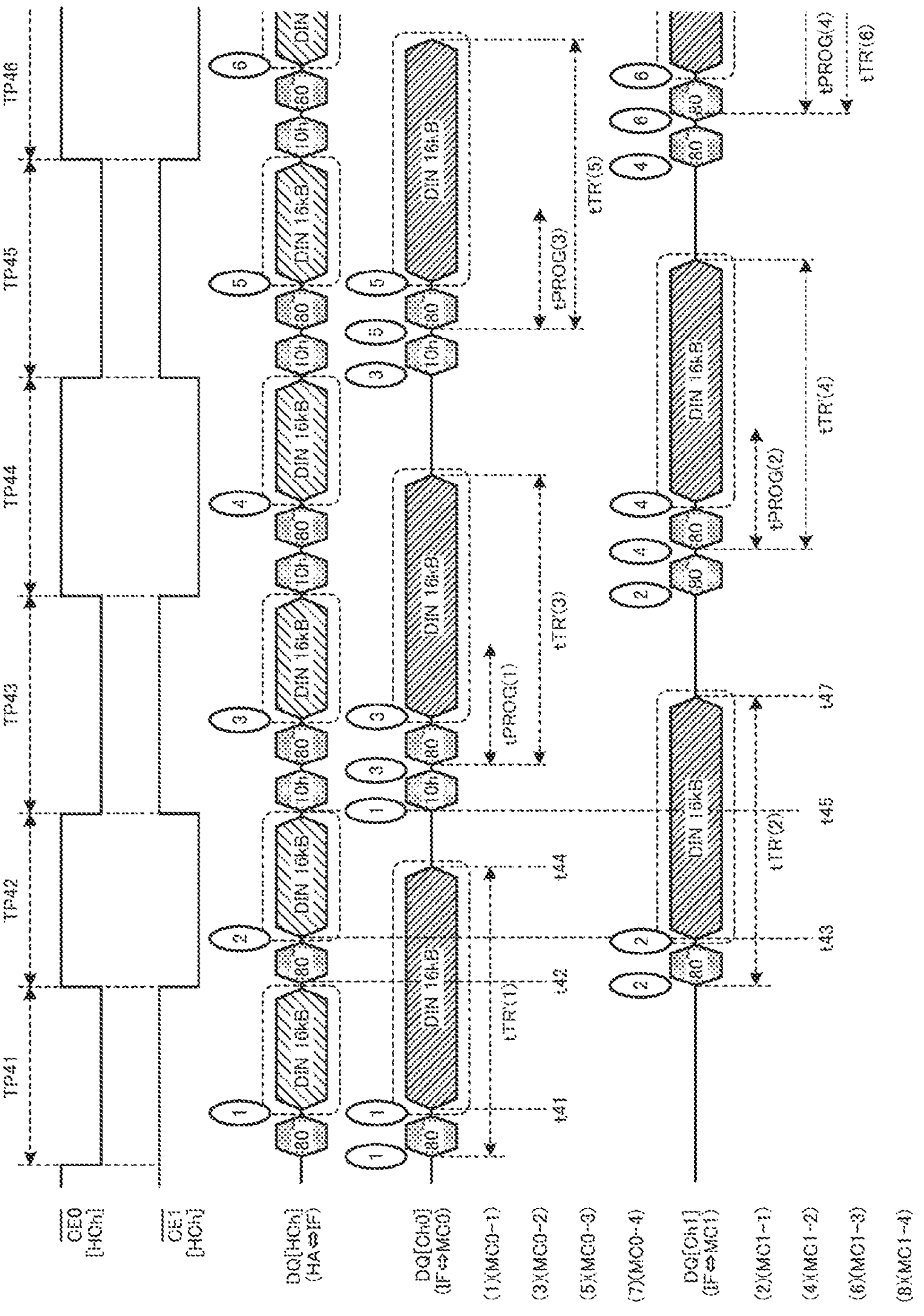
FIG. 12 is a waveform diagram illustrating an operation of a semiconductor device according to the third embodiment.

As illustrated in FIG. 12, the semiconductor device 1 is able to perform the inter-channel interleaving operation for the write process. FIG. 12 is a diagram illustrating the operation of the semiconductor device 1. FIG. 12 exemplifies the inter-channel interleaving operation performed while alternately selecting the channels Ch0 and Ch1 for the write process. In FIG. 12, the program operation is omitted for the sake of simplicity.

The host HA generates different chip enable signals $CE0^-$ and $CE1^-$ for the channels Ch0 and Ch1 and transmits the chip enable signals to the semiconductor device 1 via the host channel HCh. The chip enable signal $CE0^-$ is transmitted a signal for selecting the channel Ch0 from the host HA as. The chip enable signal $CE1^-$ is transmitted as a signal for selecting the channel Ch1 from the host HA. When the chip enable signals CE0 and $CE1^-$ are received from the host HA via the host channel HCh, the semiconductor device 1 performs an operation according to the levels of the chip enable signals $CE0^-$ and $CE1^-$.

In FIG. 12, the start timing of the operation "DIN" is almost the same for the host channel HCh and the channel Ch0. Considering that the maximum speed of the host channel HCh is twice the maximum speed of the channel Ch, the amount of data that the relay chip IF stores therein in a period is to be half or more of the amount of data transferred from the host HA in the same period. FIG. 12 illustrates a case where the amount of data transferred from the host HA is 16 kB, and the amount of data that can be stored in the relay chip IF is 8 kB or more.

FIG. 12 illustrates the operation of the semiconductor device 1 for each chip. For the sake of simplicity, the chips MC0-1, MC0-2, MC0-3, and MC0-4 connected to the channel Ch0 are also referred to as chips (1), (3), (5), and (7), respectively, and the chips MC1-1, MC1-2, MC1-3, and MC1-4 connected to the channel Ch1 are also referred to as chips (2), (4), (6), and (8), respectively.

The chip (1) of the channel Ch0 is addressed by the commands "80h–" of a period TP41. The chip (2) of the channel Ch1 is addressed by the commands "80h–" of a period TP42. The chip (3) of the channel Ch0 is addressed by the commands "80h–" of a period TP43. The chip (4) of the channel Ch1 is addressed by the commands "80h–" of a period TP44. The chip (5) of the channel Ch0 is addressed by the commands "80h–" of a period TP45.

Here, the period tTR' during which the data transfer process is performed is assigned the chip number (N: N=1 to 8) to be expressed as tTR'(N). As partially illustrated in FIG. 12, the periods tTR'(1) to tTR'(8) sequentially start in a pipeline-manner, progress partially in parallel, and end in sequence. The periods tTR'(1) to tTR'(8) start and end alternately for the channel Ch0 and the channel Ch1. As a result, the data transfer operation of the plurality of chips (1) to (8) may be efficiently performed.

For example, when the period TP41 starts, the relay chip IF selects the channel Ch0 as the chip enable signal $CE0^-$ transitions to the active level, and keeps the channel Ch1 non-selected as the chip enable signal $CE1^-$ is maintained at the non-active level. In this state, the relay chip IF transfers the commands "80h–" received via the host channel HCh to the chip (1) as the data signal DQ[Ch0] via the channel Ch0.

At timing t41, the data strobe signals $DQS/DQS^-$ start to be toggled, and the write data for the chip (1) starts to be transferred from the host HA to the relay chip IF via the host channel HCh. In response to the operation "DIN", the relay chip IF starts transferring the write data, which have been received from the host HA via the host channel HCh, to the chip (1) as the data signal DQ[Ch0] via the channel Ch0. That is, the relay chip IF starts the data transfer operation of the write data via the channel Ch0.

At timing t42, the period TP41 ends and the period TP42 starts, in response to the completion of the transfer of the write data from the host HA to the relay chip IF via the host channel HCh. The relay chip IF non-selects the channel Ch0 according to the transition of the chip enable signal $CE0^-$ to the non-active level, and selects the channel Ch1 according to the transition of the chip enable signal $CE1^-$ to the active level. In this state, the relay chip IF transfers the commands "80h–" received via the host channel HCh to the chip (2) as the data signal DQ[Ch1] via the channel Ch1.

At this time, the relay chip IF stores therein the write data of the remaining half of the data amount to be transferred for the chip (1), and continues the data transfer operation of the write data via the non-selected channel Ch0.

At timing t43, the data strobe signals $DQS/DQS^-$ start to be toggled, and the write data for the chip (2) starts to be transferred from the host HA to the relay chip IF via the host channel HCh. In response to the operation "DIN", the relay chip IF starts transferring the write data, which have been received from the host HA via the host channel HCh, to the chip (2) as the data signal DQ[Ch1] via the channel Ch1. That is, the relay chip IF starts the data transfer operation of the write data of the chip (2) via the channel Ch1.

At this time, the relay chip IF continues the data transfer operation of the write data of the chip (1) via the non-selected channel Ch0.

At timing t44, the data transfer operation of the write data of the chip (1) via the non-selected channel Ch0 is completed.

For the chip (1), the relay chip IF receives the total amount of data from the host HA during a selection period of the channel Ch0 (e.g., a period of timings t41 to t42), transfers the half amount of data to the chip (1) within that period, and transfers the remaining half amount of data to the chip (1) during a non-selection period of the channel Ch0 (e.g., a period of timings t42 to t44). As a result, the amount of data transferred from the host HA during the period of timings t41 to t42 can be 16 kB which is double of the amount of data (8 kB) transferred via the channel Ch0. That is, in the write process, the data transfer via the channel Ch0 in the semiconductor device 1 may be substantially doubled beyond the maximum speed of the channel Ch0.

For the chip (2), the relay chip IF receives the total amount of data from the host HA during a selection period of the channel Ch1 (e.g., a period from timings t43 to t45), transfers the half amount of data to the chip (2) within that period, and transfers the remaining half amount of data to the chip (2) during a non-selection period of the channel Ch1 (e.g., a period from timings t45 to t47). As a result, the amount of data transferred from the host HA during the period of timings t43 to t45 can be 16 kB which is double of the amount of data (8 kB) transferred via the channel Ch1. That is, in the write process, the data transfer via the channel Ch1 in the semiconductor device 1 may be substantially doubled beyond the maximum speed of the channel Ch1.

The data transfer for the subsequent chips (i.e., chips (3) to (7)) is the same as that for the chip (1) or (2).

Similarly to the period tTR', here, the period tPROG for performing the program operation is assigned the chip number (N: N=1 to 8) to be expressed as tPROG(N). As partially illustrated in FIG. 12, periods tPROG(1) to tPROG (6), tPROG(7), tPROG(8) overlap the periods tTR' (3) to tTR'(8), tTR'(1), and tTR'(2), respectively. That is, the program operations of the plurality of chips (1) to (8) may be performed in parallel with the data transfer operation from the relay chip IF to the plurality of chips (1) to (8).

Next, the configuration of the relay chip IF for performing the inter-channel interleaving operation in the write process will be described with reference to FIG. 13. FIG. is a diagram illustrating the configuration of the relay chip IF.

Figure 13:
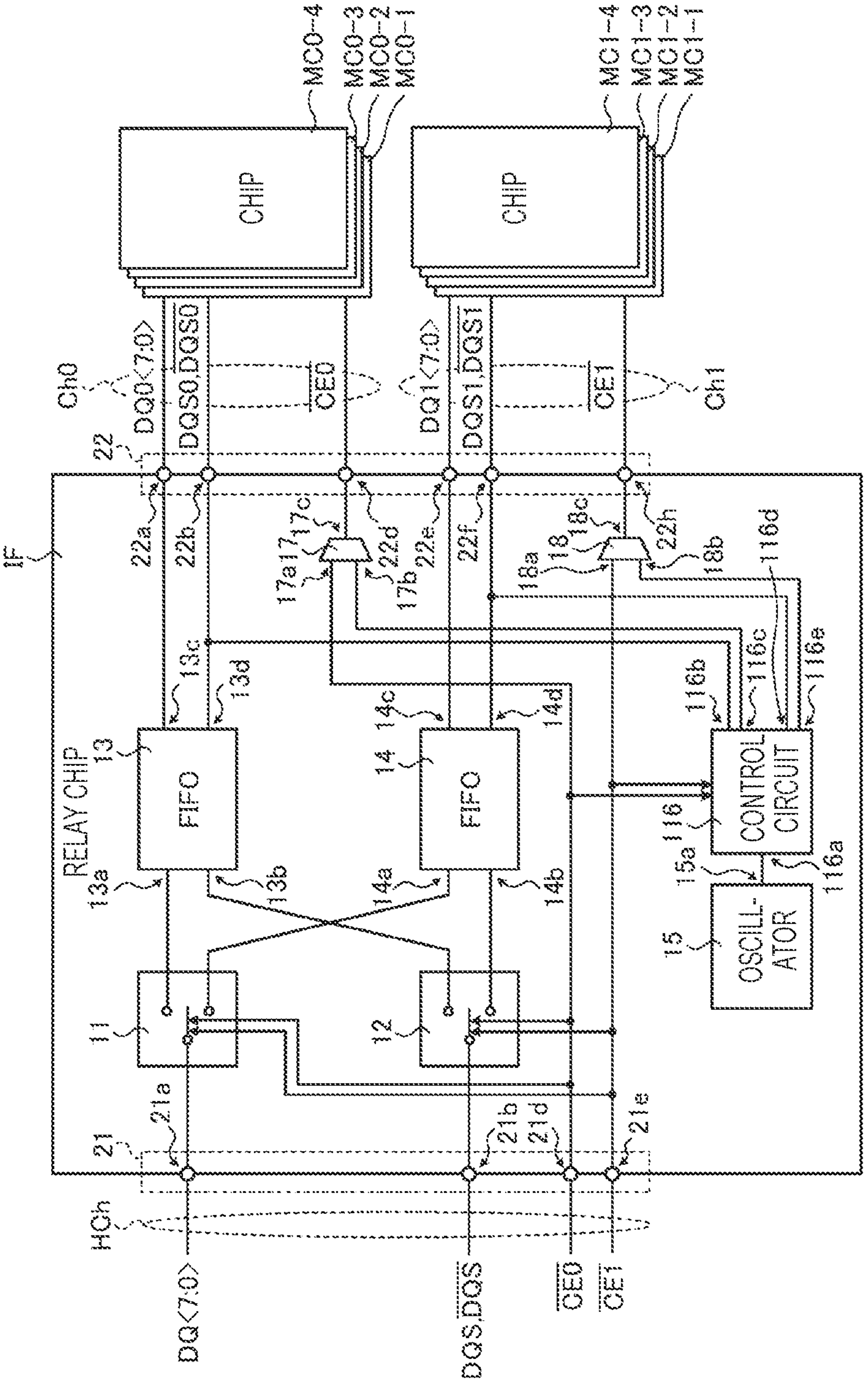
FIG. 13 is a diagram illustrating a configuration of a relay chip in the third embodiment.

The relay chip IF illustrated in FIG. 13 has a control circuit 116, instead of the control circuit 16 (see FIG. 6). In FIG. 13, the illustration of the terminal group 21*c* of the terminal group 21 that is not used in the write process is omitted, and the illustration of the terminal groups 22*c* and 22*g* of the terminal group 22 that are not used in the write process is omitted. On the control circuit 116, an output node group 116*b* is connected to the terminal group 22*b*, and an output node group 116*d* is connected to the terminal group 22*f*.

In response to the chip enable signal CE0¯ being at the active level and the chip enable signal CE1¯ being at the non-active level, the control circuit 116 generates the data strobe signals DQS1 and DQS1¯ to be toggled and the chip enable signal CE1¯ of the active level, and supplies the generated signals to the chip MC1. In response to the chip enable signal CE0¯ being at the non-active level and the chip enable signal CE1¯ being at the active level, the control circuit 116 generates the data strobe signals DQS0 and DQS0¯ to be toggled and the chip enable signal CE0¯ of the active level, and supplies the generated signals to the chip MC0.

The relay chip IF may operate as illustrated in FIGS. 14A to 14D. FIGS. 14A to 14D are diagrams illustrating examples of the operation of the relay chip IF. FIGS. 14A to 14D illustrate examples of the operation of the relay chip IF during the periods TP42 to TP43 illustrated in FIG. 12.

Figure 14A:
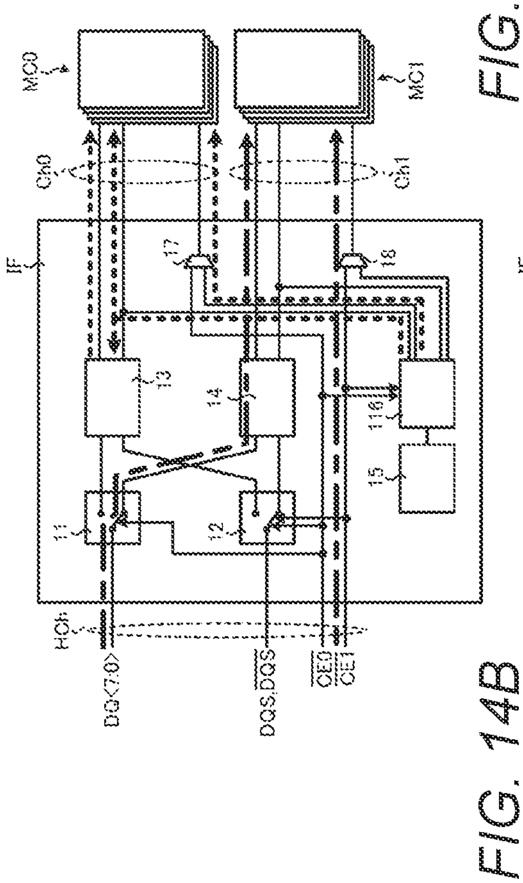
FIGS. 14A to 14D are diagrams illustrating the operation of the relay chip in the third embodiment.

When the period TP41 ends and the period TP42 starts, the chip enable signal CE0¯ transitions to the non-active level and the chip enable signal CE1¯ transitions to the active level, and accordingly, as illustrated in FIG. 14A, the switching circuit 11 switches to the second connection state and the switching circuit 12 switches to the fourth connection state. Note that the fourth connection state in the third embodiment is a state in which the terminal group 21*b* and the clock node 14*b* of the FIFO circuit 14 are connected.

The data strobe signals DQS and DQS¯ are maintained at the non-active level. The selector 18 selects the input node 18*a*, and transfers the chip enable signal CE1¯ received at the terminal 21*e* to the chip MC1 via the channel Ch1. In response, the FIFO circuit 14 transfers the commands “80h–” to the chip MC1 as the data signal DQ via the channel Ch1.

At this time, the control circuit 116 uses an oscillation signal from the oscillator 15 to generate the toggled data strobe signals DQS0 and DQS0, and the chip enable signal CE0¯ of the active level. The control circuit 116 supplies the data strobe signals DQS0 and DQS0¯ to the FIFO circuit 13 and to the chip MC0 via the channel Ch0. The selector 17 selects the input node 17*b*, and transfers the chip enable signal CE0¯ generated by the control circuit 116 to the chip MC0 via the channel Ch0. In response, the FIFO circuit 13 continues to transfer the write data to the chip MC0 via the channel Ch0 while storing the write data received from the host HA at the terminal group 21*a*.

Figure 14B:
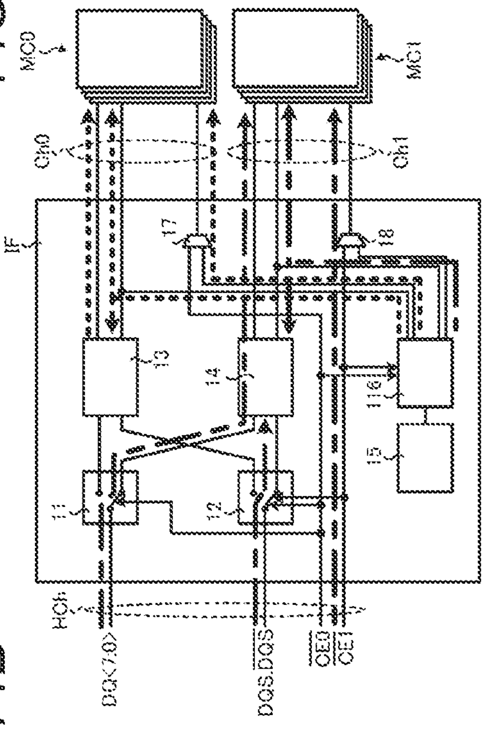

As illustrated in FIG. 14B, when the data strobe signals DQS/DQS¯ start to be toggled, the FIFO circuit 14 transfers the data signal DQ from the host HA to the chip MC1 via the channel Ch1 while storing therein the data signal DQ as the write data, in response to the toggled data strobe signal DQS/DQS¯. At this time, the FIFO circuit 13 continues to transfer the write data stored therein to the chip MC0 via the channel Ch0.

Thereafter, the FIFO circuit 13 completes the transfer of the write data to the chip MC0 via the channel Ch0. At this time, the control circuit 116 uses the oscillation signal from the oscillator 15 to generate the toggled data strobe signals DQS1 and DQS1¯, and supplies the signals to the FIFO circuit 14. The FIFO circuit 14 continues to transfer the write data to the chip MC1 via the channel Ch1 while storing the write data received from the host HA at the terminal group 21*a*.

Figure 14C:
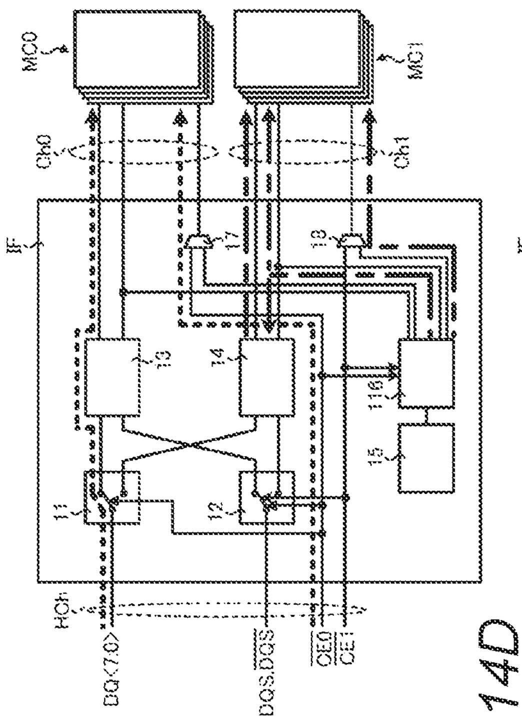

When the period TP42 ends and the period TP43 starts, as illustrated in FIG. 14C, the chip enable signal CE0¯ transitions to the active level and the chip enable signal CE1¯ transitions to the non-active level, and accordingly, the switching circuit switches to the first connection state and the switching circuit 12 switches to the third connection state. Note that the third connection state in the third embodiment is a state in which the terminal group 21*b* and the clock node 13*b* of the FIFO circuit 13 are connected.

The data strobe signals DQS and DQS¯ are maintained at the non-active level. The selector 17 selects the input node 17*a*, and transfers the chip enable signal CE0¯ received at the terminal 21*d* to the chip MC0 via the channel Ch0. In response, the FIFO circuit 13 sequentially transfers the commands “10h–” and “80h–” to the chip MC0 as the data signal DQ via the channel Ch0.

At this time, the control circuit 116 uses the oscillation signal from the oscillator 15 to generate the toggled data strobe signals DQS1 and DQS1¯, and the chip enable signal CE1¯ of the active level. The control circuit 116 supplies the data strobe signals DQS1 and DQS1¯ to the FIFO circuit 14 and to the chip MC1 via the channel Ch1. The selector 18 selects the input node 18*b*, and transfers the chip enable signal CE1¯ generated by the control circuit 116 to the chip MC1 via the channel Ch1. In response, the FIFO circuit 14 continues to transfer the write data to the chip MC1 via the channel Ch1 while storing the write data received from the host HA at the terminal group 21*a*.

Figure 14D:
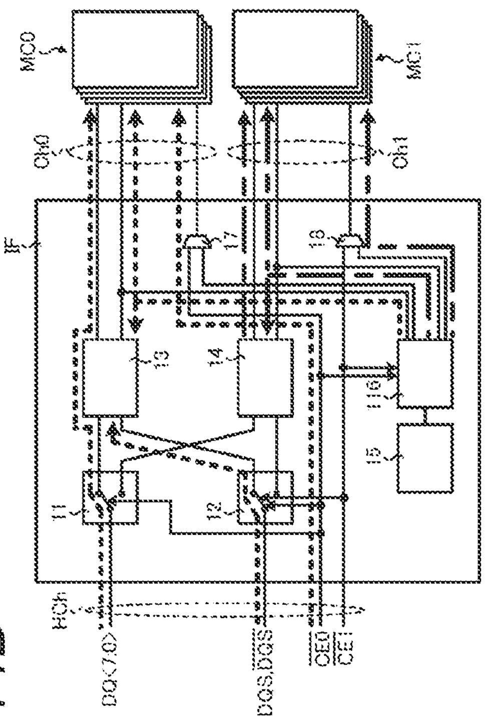
Figures 15A, 15B, 15C, 15D:
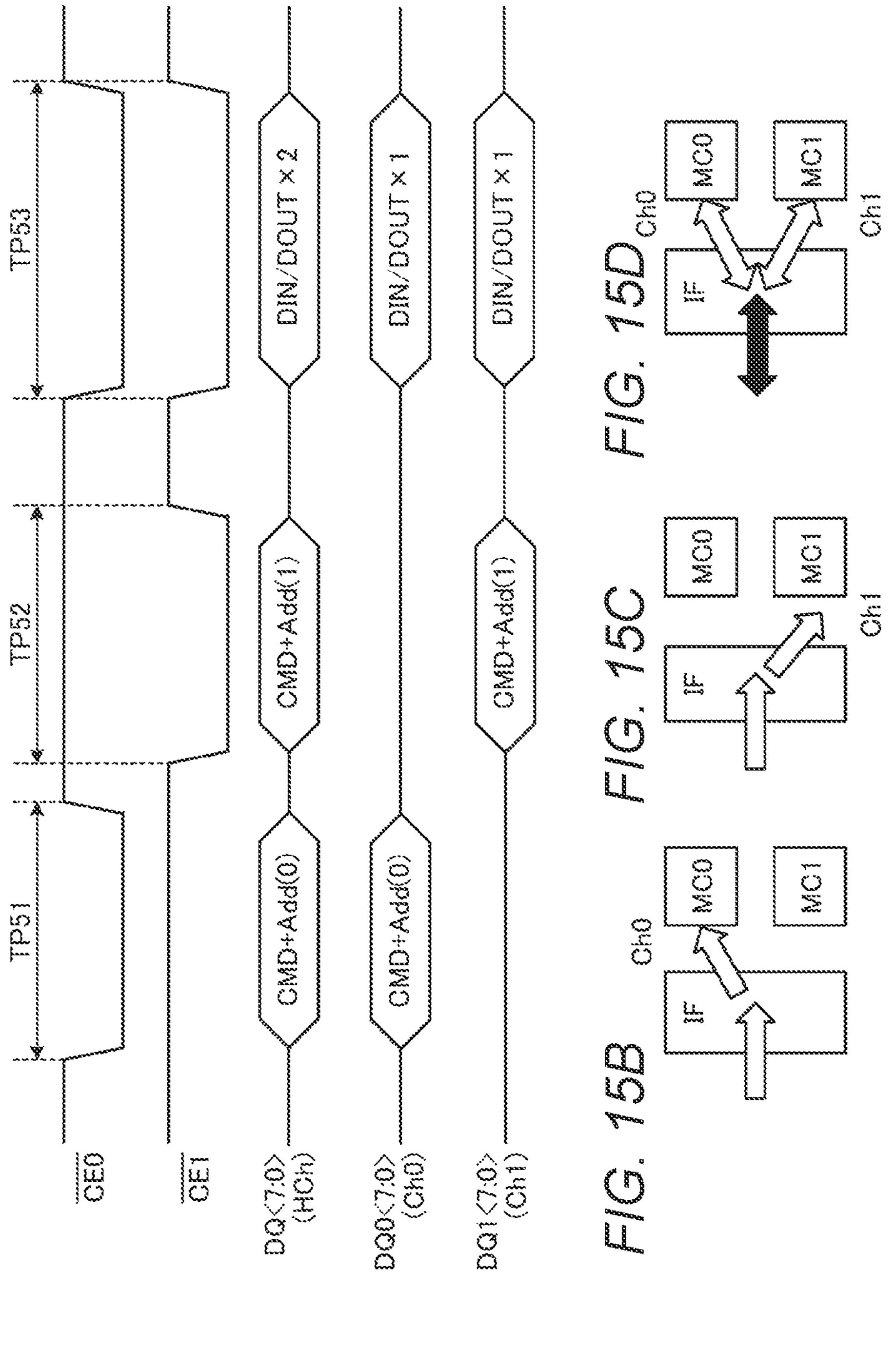
FIGS. 15A to 15D are diagrams illustrating an operation of a semiconductor device according to a fourth embodiment.

As illustrated in FIG. 14D, when the data strobe signals DQS/DQS¯ start to be toggled, the FIFO circuit 13 transfers the data signal DQ from the host HA to the chip MC0 via the channel Ch0 while storing therein the data signal DQ as the write data, in response to the toggled data strobe signal DQS/DQS¯. At this time, the FIFO circuit 14 continues to transfer the write data stored therein to the chip MC1 via the channel Ch1.

Thereafter, the FIFO circuit 14 completes the transfer of the write data to the chip MC1 via the channel Ch1. At this time, the control circuit 116 uses the oscillation signal from the oscillator 15 to generate the toggled data strobe signals DQS0 and DQS0, and supplies the signals to the FIFO circuit 13. The FIFO circuit 13 continues to transfer the write data to the chip MC0 via the channel Ch0 while storing the write data received from the host HA at the terminal group 21*a*.

As described above, in the semiconductor device 1 of the third embodiment, the data transfer via the channel Ch in the semiconductor device 1 in the write process can be speeded up beyond the maximum speed of the channel Ch by the function of the inter-channel interleaving operation.

Fourth Embodiment

Next, a semiconductor device 1 according to a fourth embodiment will be described. Hereinafter, portions different from the first to third embodiments will be mainly described.

In the first embodiment, the inter-channel interleaving operation in the case of alternately selecting the plurality of channels Ch0 and Ch1 is illustrated, but in the fourth embodiment, an inter-channel interleaving operation in a case of simultaneously selecting the plurality of channels Ch0 and Ch1 is illustrated. Hereinafter, the inter-channel interleaving operation in the case of simultaneously selecting the plurality of channels Ch0 and Ch1 will be referred to as a simultaneous-access inter-channel interleaving operation.

The simultaneous-access inter-channel interleaving operation is performed as illustrated in FIGS. 15A to 15D. FIGS. 15A to 15D are diagrams illustrating the operation of the semiconductor device 1. FIGS. 15A to 15D schematically illustrate the simultaneous-access inter-channel interleaving operation.

The relay chip IF receives the chip enable signal CE0¯ for selecting the channel Ch0 and the chip enable signal CE1 for selecting the channel Ch1 from the host HA. The relay chip IF may perform the data transfer operation via the channel Ch0 and the data transfer operation via the channel Ch1 in parallel when the chip enable signal CE0¯ is maintained at the active level and the chip enable signal CE1¯ is maintained at the active level.

When a command "CMD+ADD(0)" is received via the host channel HCh in a period TP51 during which the chip enable signal CE0¯ is maintained at the active level and the chip enable signal CE1¯ is maintained at the non-active level, the relay chip IF issues the command "CMD+ADD (0)" to the chip MC0 via the selected channel Ch0. When a command "CMD+ADD(1)" is received via the host channel HCh in a period TP52 during which the chip enable signal CE0¯ is maintained at the non-active level and the chip enable signal CE1¯ is maintained at the active level, the relay chip IF issues the command "CMD+ADD(1)" to the chip MC1 via the selected channel Ch1. The period TP52 is a period after the period TP51. In a period TP53 during which the chip enable signal CE0¯ is maintained at the active level and the chip enable signal CE1¯ is maintained at the active level, the relay chip IF performs the data transfer operation "DIN/DOUT×1" according to the command "CMD+ADD(0)" via the selected channel Ch0, and performs the data transfer operation "DIN/DOUT×1" according to the command "CMD+ADD(1)" via the selected channel Ch1. The period TP53 is a period after the period TP52. "DIN" represents a data transfer operation performed in the write process, and "DOUT" represents a data transfer operation performed in the read process.

Figure 16:
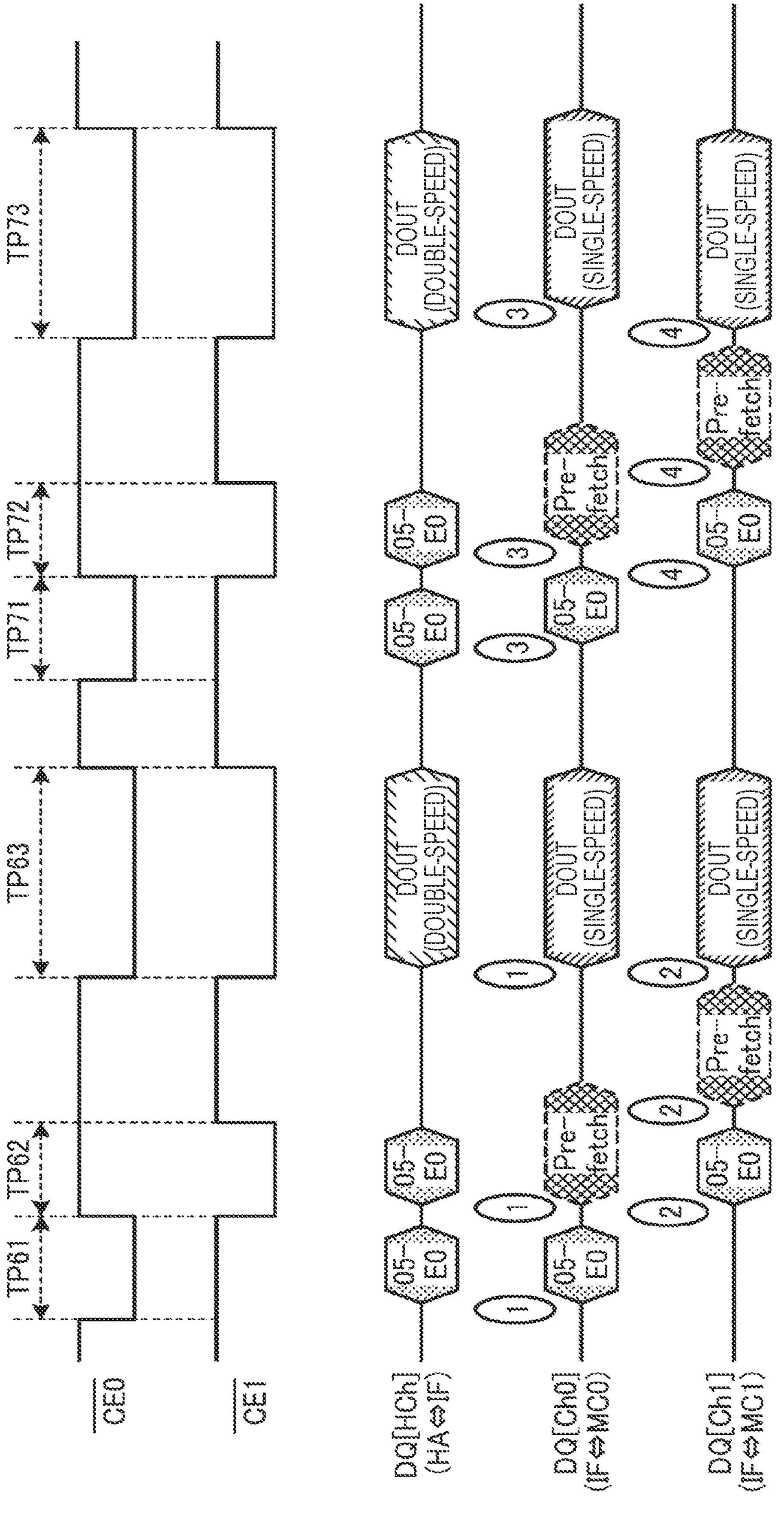
FIG. 16 is a waveform diagram illustrating the operation of the semiconductor device according to the fourth embodiment.

For example, as illustrated in FIG. 16, the semiconductor device 1 may perform the simultaneous-access inter-channel interleaving operation for the read process. FIG. 16 is a diagram illustrating the operation of the semiconductor device 1, and represents the inter-channel interleaving operation performed by simultaneously selecting the channels Ch0 and Ch1 for the read process. FIG. 16 illustrates the operations of periods corresponding to the periods TP9 to TP14 illustrated in FIGS. 4 and 5.

Here, it is assumed as an example that the maximum speed of the host channel HCh is twice the maximum speed of each of the channels Ch0 and Ch1.

When the period TP61 starts, the relay chip IF selects the channel Ch0 as the chip enable signal CE0¯ transitions to the active level, and keeps the channel Ch1 non-selected as the chip enable signal CE1¯ is maintained at the non-active level. In this state, the relay chip IF transfers the commands "05h to E0h" received via the host channel HCh to the chip (1) as the data signal DQ[Ch0] via the channel Ch0.

When the period TP61 ends and a period TP62 starts, the relay chip IF non-selects the channel Ch0 as the chip enable signal CE0¯ transitions to the non-active level, and selects the channel chip Ch1 as the chip enable signal CE1¯ transitions to the active level. In this state, the relay chip IF transfers the commands "05h to E0h" received via the host channel HCh to the chip (2) as the data signal DQ[Ch1] via the channel Ch1.

At this time, the relay chip IF starts the prefetch operation for the chip (1) via the non-selected channel Ch0. That is, the chip (1) transfers at least some of the read data to the relay chip IF as the data signal DQ[Ch0] via the channel Ch0. The relay chip IF starts storing (prefetching) the transferred data signal DQ[Ch0] in the FIFO circuit 13.

When the period TP62 ends, the chip enable signal CE0¯ is maintained at the non-active level because the prefetch operation is being continued for the chip (1). In response, the relay chip IF keeps the channel Ch0 non-selected. At the same time, the relay chip IF non-selects the channel Ch1 as the chip enable signal CE1¯ transitions to the non-active level.

At this time, the relay chip IF starts the prefetch operation for the chip (2) via the non-selected channel Ch1. That is, the chip (2) transfers at least some of the read data to the relay chip IF as the data signal DQ[Ch1] via the channel Ch1. The relay chip IF starts storing (prefetching) the transferred data signal DQ[Ch1] in the FIFO circuit 14.

Thereafter, the prefetch operation for the chip (1) is completed, and further, the prefetch operation for the chip (2) is completed.

When a period TP63 starts, the relay chip IF selects the channel Ch0 as the chip enable signal CE0¯ transitions to the active level, and selects the channel Ch1 as the chip enable signal CE1¯ transitions to the active level. In this state, the relay chip IF transfers the prefetched data signal DQ of the chip (1) and the prefetched data signal DQ of the chip (2) to the host HA in a time-division manner via the host channel HCh. In parallel, the relay chip IF internally shifts the prefetched data signal DQ transferred from the chip (1) between the plurality of queue entries of the FIFO circuit 13, and internally shifts the prefetched data signal DQ transferred from the chip (2) between the plurality of queue entries of the FIFO circuit 14. Then, the relay chip IF transfers the data signal DQ transferred from the chip (1) in the period TP63 and transfers the data signal DQ transferred from the chip (2) in the period TP63, to the host HA in a time-division manner via the host channel HCh.

At the timing when the period TP63 ends, the relay chip IF completes the transfer of the data signal DQ of the chip (1) and the data signal DQ of the chip (2) to the host HA.

Thereafter, in periods TP71 to TP73 as well, the same operations as in the periods TP61 to TP63 are performed.

Here, for the data signals DQ of the chips (1) and (2), the relay chip IF performs the data transfer from the chip (1) to the host HA via the channel Ch0 and the data transfer from the chip (2) to the host HA via the channel Ch1 in a time-divided manner in a selection period (e.g., the period TP63) for the simultaneous access of the channels Ch0 and Ch1. As a result, in the read process, the data transfer from the semiconductor device 1 to the host HA can be substantially doubled beyond the maximum speeds of the channels Ch0 and Ch1.

The data transfer for the subsequent chips (i.e., chips (3) to (7)) are the same as that for the chips (1) and (2).

Figure 17:
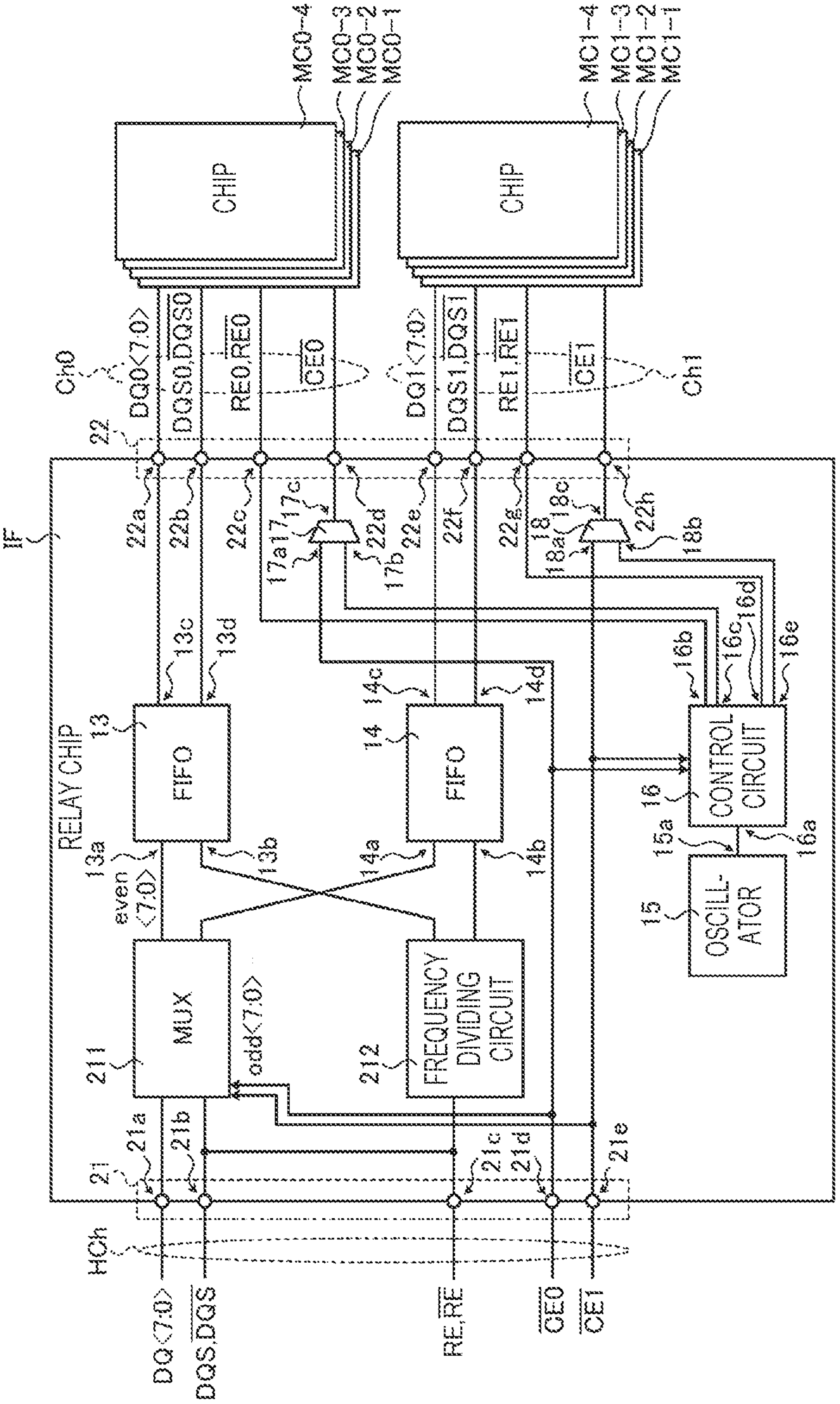
FIG. 17 is a diagram illustrating a configuration of a relay chip in the fourth embodiment.

As illustrated in FIG. 17, the configuration of the relay chip IF for performing the simultaneous-access inter-channel interleaving operation in the read process is different from the first embodiment in the following points. FIG. 17 is a diagram illustrating the configuration of the relay chip IF.

The relay chip IF includes a multiplexer (MUX) 211 and a frequency dividing circuit 212 instead of the switching circuit 11 and the switching circuit 12 (see FIG. 6).

The multiplexer 211 switches between a fifth connection state and a sixth connection state according to the chip enable signal CE0⁻, the chip enable signal CE1⁻, and the read enable signals RE and RE⁻. The fifth connection state is a state in which the terminal group 21*a* and the data node 13*a* of the FIFO circuit 13 are connected to each other. The sixth connection state is a state in which the terminal group 21*a* and the data node 14*a* of the FIFO circuit 14 are connected to each other.

When the chip enable signal CE0⁻ is at the active level, the chip enable signal CE1⁻ is at the active level, and the read enable signals RE and RE⁻ are toggled, the multiplexer 211 switches to the fifth connection state according to the even-numbered edges of the toggle of the read enable signals RE and RE⁻, and switches to the sixth connection state according to the odd-numbered edges of the toggle of the read enable signals RE and RE⁻.

The multiplexer 211 operates in the same way as the switching circuit 11 in that the multiplexer 211 switches to the fifth connection state as the chip enable signal CE0⁻ is at the active level and the chip enable signal CE1⁻ is at the non-active level, and switches to the sixth connection state as the chip enable signal CE0⁻ is at the non-active level and the chip enable signal CE1⁻ is at the active level.

When the read enable signals RE and RE⁻ are toggled, the frequency dividing circuit 212 divides the frequency of the read enable signals RE and RE⁻ by two to generate read enable signals RE' and RE⁻'. The generated read enable signals RE' and RE⁻' toggle at the half speed of the read enable signals RE and RE⁻. The frequency dividing circuit 212 supplies the read enable signals RE' and RE⁻' to the FIFO circuits 13 and 14.

As the chip enable signal CE0⁻ is at the active level and the chip enable signal CE1⁻ is at the active level, the control circuit 16 generates the read enable signals RE0 and RE0⁻ to be toggled and supplies the signals to the chip MC0, and generates the read enable signals RE1 and RE1⁻ to be toggled and supplies the signals to the chip MC1. As a result, the relay chip IF can change the read enable signals to be supplied to the chip MC via the channel Ch from the read enable signals RE and RE⁻ of the host HA to the read enable signal RE0, RE0⁻, RE1, and RE1 of the control circuit 16.

Figure 18:
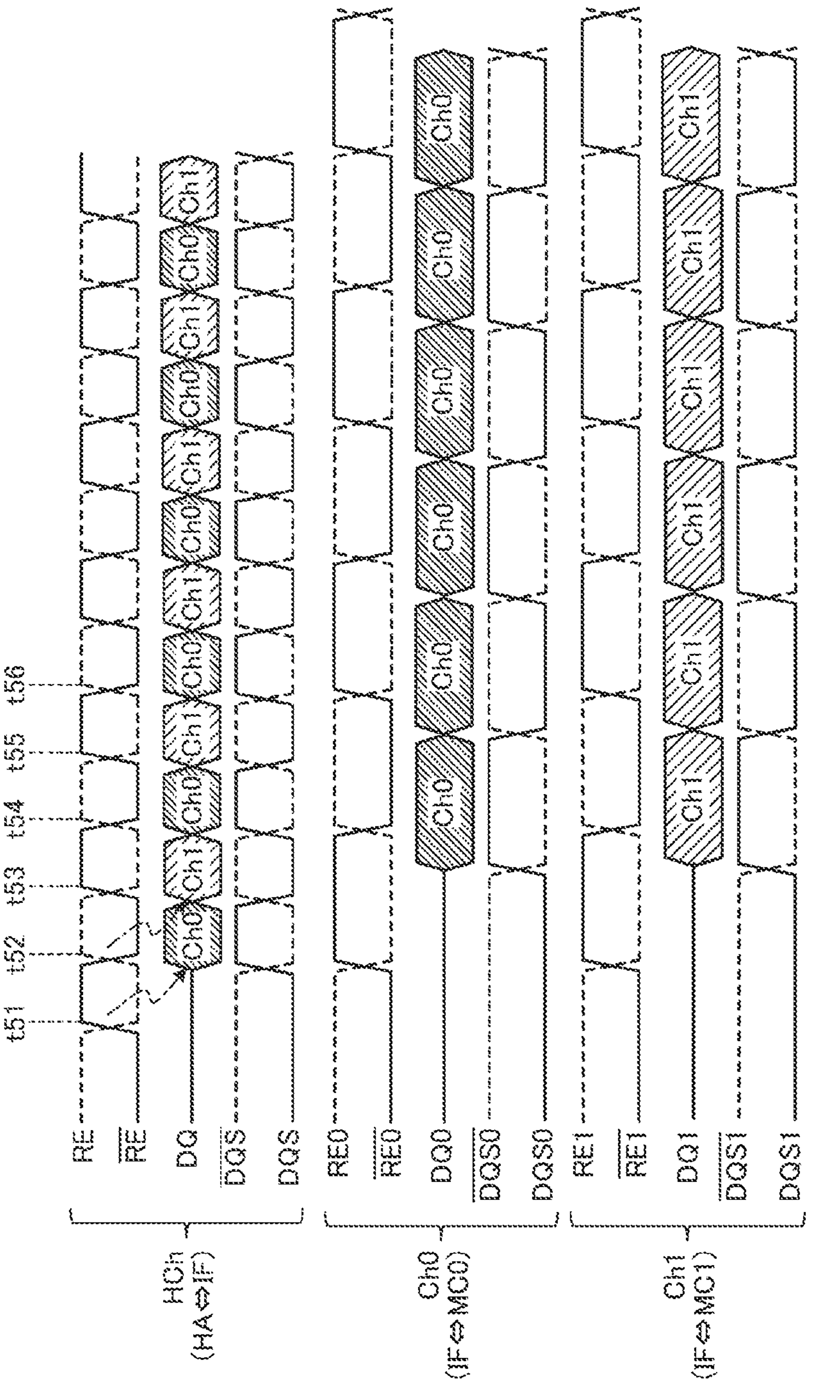
FIG. 18 is a waveform diagram illustrating the operation of the semiconductor device according to the fourth embodiment.

As illustrated in FIGS. 18 and 19A to 19D, the relay chip IF transmits the data signals DQ of the chips MC0 and MC1 to the host HA in a time-division manner in a selection period for the simultaneous access of the channels Ch0 and Ch1. FIG. 18 is a waveform diagram illustrating the operation of the relay chip IF. FIGS. 19A to 19D are diagrams illustrating the operation of the relay chip IF. FIGS. 19A to 19D illustrate the operation of the relay chip IF in the period TP63 illustrated in FIG. 16.

FIG. 18 illustrates a case where the maximum speed of the host channel HCh is twice the maximum speed of each of the channels Ch0 and Ch1.

The toggle frequency of the read enable signals RE and RE⁻ supplied from the host HA to the relay chip IF via the host channel HCh is twice the toggle frequency of the read enable signals RE0 and RE0⁻ generated by the control circuit 16 and supplied to the chip MC0 via the channel Ch0. The toggle frequency of the read enable signals RE and RE⁻ is twice the toggle frequency of the read enable signals RE1 and RE1 generated by the control circuit 16 and supplied to the chip MC1 via the channel Ch1.

The toggle frequency of the data strobe signals DQS and DQS⁻ supplied from the relay chip IF to the host HA via the host channel HCh is twice the toggle frequency of the data strobe signals DQS0 and DQS0⁻ supplied from the chip MC0 to the relay chip IF via the channel Ch0. The toggle frequency of the data strobe signals DQS and DQS⁻ is twice the toggle frequency of the data strobe signals DQS1 and DQS1⁻ supplied from the chip MC1 to the relay chip IF via the channel Ch1.

Immediately before timing t51, the relay chip IF selects the channel Ch0 as the chip enable signal CE0⁻ transitions to the active level, and selects the channel Ch1 as the chip enable signal CE1⁻ transitions to the active level. Thereafter, the selectors 17 and 18 maintain the input nodes 17*a* and 18*a* at the selected state, and supply the chip enable signals CE0⁻ and CE1⁻ from the host HA to the chips MC0 and MC1 via the channels Ch0 and Ch1, respectively.

By this time, in the relay chip IF, the FIFO circuit 13 has prefetched the data signal DQ[Ch0] of the chip MC0 via the channel Ch0, and the FIFO circuit 14 has prefetched the data signal DQ[Ch1] of the chip MC1 via the channel Ch1.

Figure 19A:
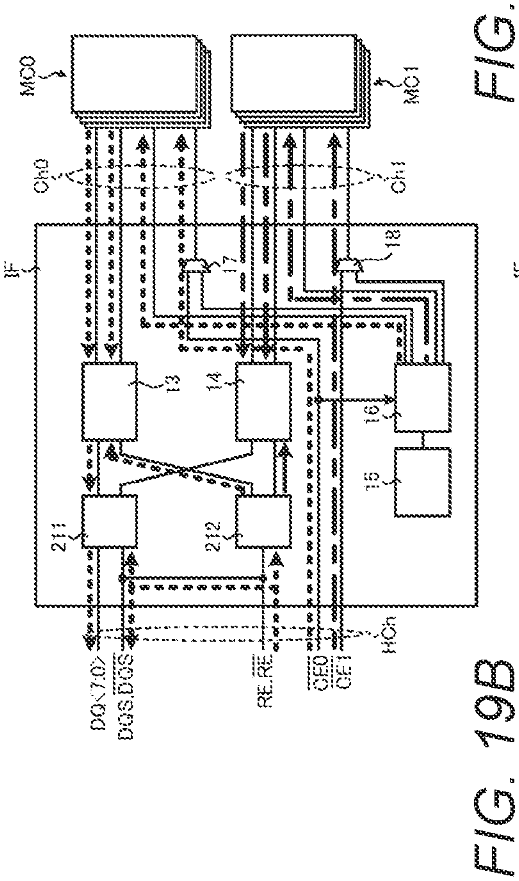
FIGS. 19A to 19D are diagrams illustrating an operation of the relay chip in the fourth embodiment.

At timing t51, the read enable signals RE and RE⁻ start to be toggled. As illustrated in FIGS. 18 and 19A, the relay chip IF transmits the prefetched data signal DQ[Ch0] of the chip MC0 to the host HA, according to the 0th edge of the read enable signals RE and RE⁻.

Figure 19B:
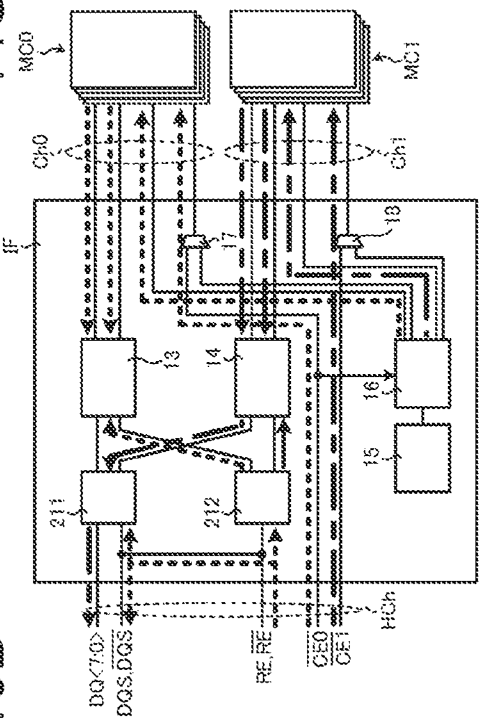

At timing t52, as illustrated in FIGS. 18 and 19B, the relay chip IF transmits the prefetched data signal DQ[Ch1] of the chip MC1 to the host HA, according to the first edge of the read enable signals RE and RE⁻.

At timing t53, as illustrated in FIGS. 18 and 19A, the relay chip IF transmits the prefetched data signal DQ[Ch0] of the chip MC0 to the host HA, according to the second edge of the read enable signals RE and RE⁻.

At this time, in response to the data strobe signals DQS0 and DQS0⁻, the relay chip IF stores in the FIFO circuit 13 the data signal DQ[Ch0] transferred from the chip MC0 via the channel Ch0. Further, in response to the data strobe signals DQS1 and DQS1⁻, the relay chip IF stores in the FIFO circuit 14 the data signal DQ[Ch1] transferred from the chip MC1 via the channel Ch1.

At timing t54, as illustrated in FIGS. 18 and 19B, the relay chip IF transmits the prefetched data signal DQ[Ch1] of the chip MC1 to the host HA, according to the third edge of the read enable signals RE and RE⁻.

Figure 19C:
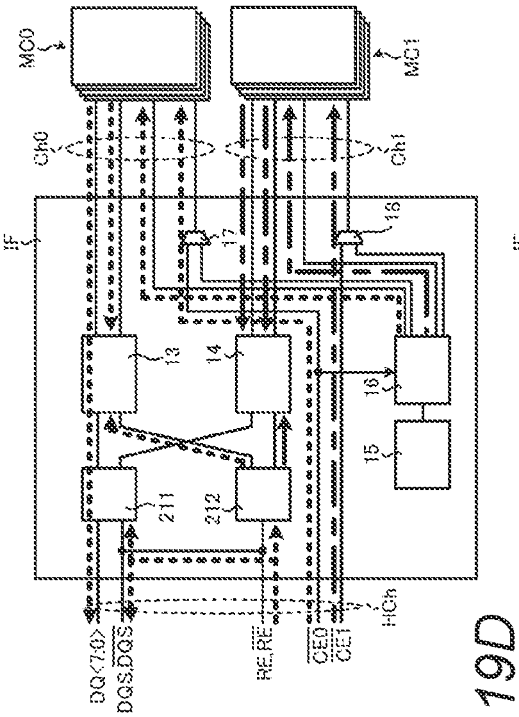

At timing t55, as illustrated in FIGS. 18 and 19C, the relay chip IF transmits the data signal DQ[Ch0] of the chip MC0 transferred via the channel Ch0 to the host HA, according to the fourth edge of the read enable signals RE and RE⁻.

At this time, in response to the data strobe signals DQS0 and DQS0⁻, the relay chip IF stores in the FIFO circuit 13 the data signal DQ[Ch0] transferred from the chip MC0 via the channel Ch0. Further, in response to the data strobe signals DQS1 and DQS1⁻, the relay chip IF stores in the FIFO circuit 14 the data signal DQ[Ch1] transferred from the chip MC1 via the channel Ch1.

Figure 19D:
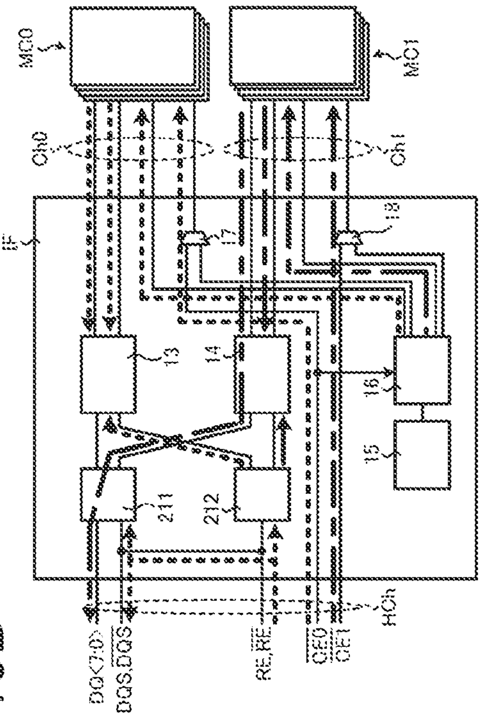

At timing t56, as illustrated in FIGS. 18 and 19D, the relay chip IF transmits the data signal DQ[Ch1] of the chip MC1 transferred via the channel Ch1 to the host HA, according to the fifth edge of the read enable signals RE and RE‾.

Thereafter, the same operations as timings t55 and t56 are alternately repeated for each edge of the read enable signals RE and RE‾ until the transfer of the total amount of data to be transmitted to the host HA is completed.

The amount of data prefetched in the FIFO circuits 13 and 14 immediately before timing t51 may be experimentally obtained in advance based on the amount of data that can be transmitted to the host HA from the FIFO circuits 13 and 14 until the data signal transferred from the chip can be transmitted to the host HA after the timing t51 (in the case of FIG. 18, the data amount corresponding to four toggles of the read enable signals RE and RE‾). As a result, the data transfer from the relay chip IF to the host HA can be started at an early timing.

As described above, in the fourth embodiment, the semiconductor device 1 can speed up the data transfer via the channel Ch in the semiconductor device 1 in the read process beyond the maximum speed of the channel Ch by the function of the simultaneous-access inter-channel interleaving operation.

Figure 20:
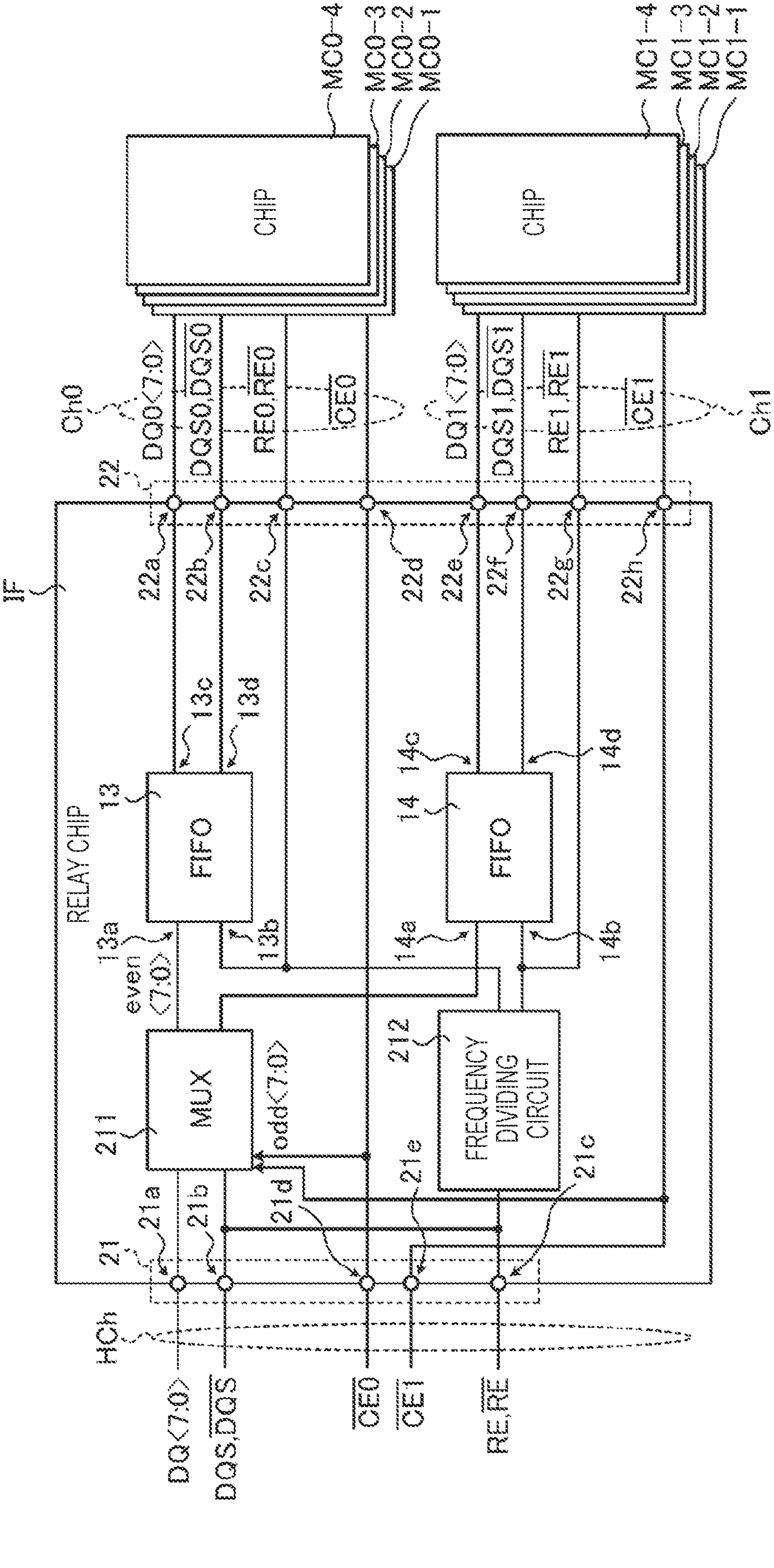
FIG. 20 is a diagram illustrating a configuration of a relay chip in a modification of the fourth embodiment.

As illustrated in FIG. 20, the relay chip IF for performing the simultaneous-access inter-channel interleaving operation in the read process may be configured to pass the read enable signals RE and RE‾ of the host HA. FIG. 20 is a diagram illustrating the configuration of a relay chip IF in a modification of the fourth embodiment. The relay chip IF illustrated in FIG. 20 is different from the relay chip IF illustrated in FIG. 17 in that the oscillator 15, the control circuit 16, the selector 17, and the selector 18 are omitted and lines extending from the frequency dividing circuit 212 to the FIFO circuits 13 and 14 branch and extend to the terminals 22*c* and 22*g*, respectively. The terminal 21*d* is connected to the terminal 22*d*, and the chip enable signal CE0‾ from the host HA is supplied to the chip MC0 via the channel Ch0. The terminal 21*e* is connected to the terminal 22*h*, and the chip enable signal CE1‾ from the host HA is supplied to the chip MC1 via the channel Ch1.

When the read enable signals RE and RE‾ are toggled, the frequency dividing circuit 212 divides the frequency of the read enable signals RE and RE‾ by two according to the even-numbered edges of the toggle of the read enable signals RE and RE‾ to generate the read enable signals RE0 and RE0‾ to be toggled at the half speed of the read enable signals RE and RE‾. The frequency dividing circuit 212 supplies the read enable signals RE0 and RE0‾ to be toggled at the half speed to the FIFO circuit 13, and also supplies them to the chip MC0 via the channel Ch0. That is, the relay chip IF substantially passes the read enable signals RE and RE‾ from the host HA while dividing the frequency thereof, and supplies the divided read enable signals RE and RE‾ to the chip MC0 via the channel Ch0.

Further, the frequency dividing circuit 212 logically inverts the read enable signals RE and RE‾ and divides the frequency thereof by two according to the odd-numbered edges of the toggle of the read enable signals RE and RE‾, to generate the read enable signals RE1 and RE1‾ to be toggled at the half speed of the read enable signals RE and RE‾. The frequency dividing circuit 212 supplies the read enable signals RE1 and RE1‾ to be toggled at the half speed to the FIFO circuit 14, and also supplies them to the chip MC1 via the channel Ch1. That is, the relay chip IF substantially passes the read enable signals RE and RE‾ from the host HA while dividing the frequency thereof, and supplies the divided read enable signals RE and RE‾ to the chip MC1 via the channel Ch1.

Further, as illustrated in FIGS. 21 and 22A to 22D, the operation of the relay chip IF illustrated in FIG. 20 is different from that of the relay chip IF illustrated in FIG. 17 in the following points. FIGS. 21 and 22A to 22D illustrate the operation of the relay chip IF in the period TP63 illustrated in FIG. 16. The description of the same portions as those in FIGS. 18 and 19A to 19D will be omitted.

Figure 21:
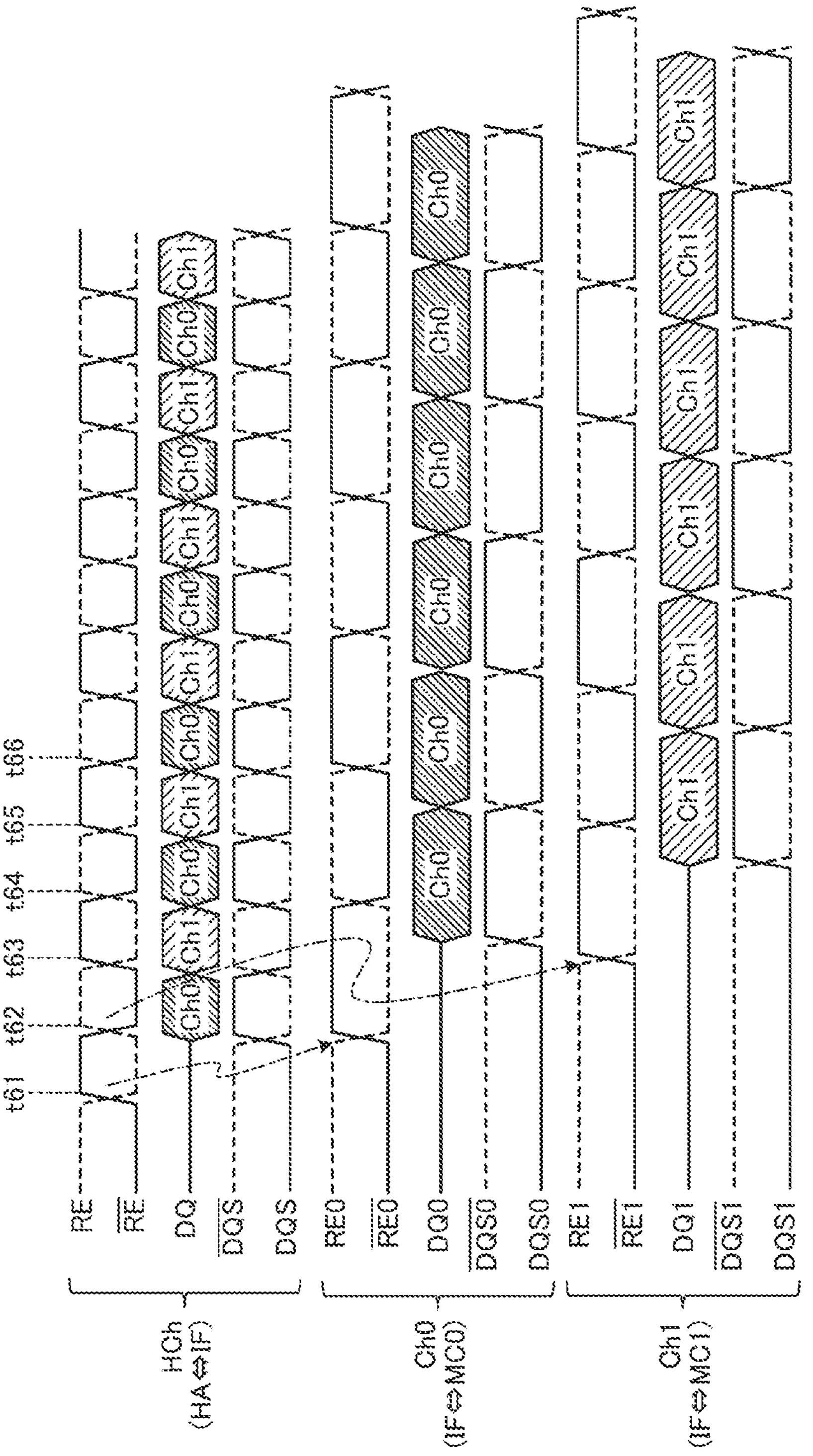
FIG. 21 is a waveform diagram illustrating an operation of a semiconductor device according to the modification of the fourth embodiment.

At timing t61, the read enable signals RE and RE‾ start to be toggled. As illustrated in FIGS. 21 and 22A, the relay chip IF transmits the prefetched data signal DQ[Ch0] of the chip MC0 to the host HA, according to the 0th edge of the read enable signals RE and RE‾.

At this time, the frequency dividing circuit 212 divides the frequency of the read enable signals RE and RE‾ by two to generate the read enable signals RE0 and RE0‾, supplies the read enable signals RE0 and RE0‾ to the FIFO circuit 13, and also supplies them to the chip MC0 via the channel Ch0.

Figure 22C:
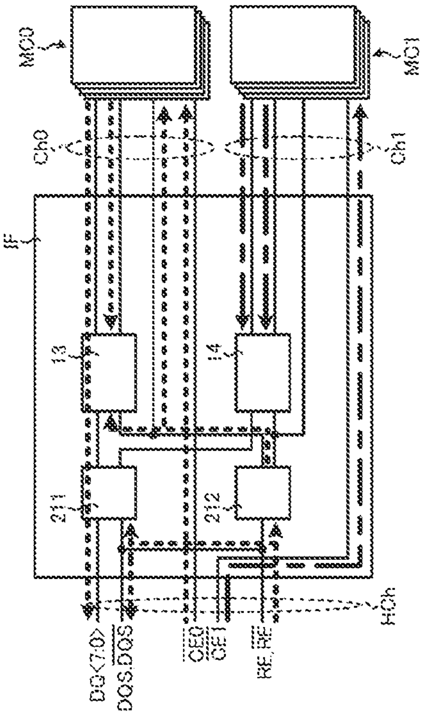
FIGS. 22A to 22D are diagrams illustrating an operation of the relay chip in the modification of the fourth embodiment.
Figure 22D:
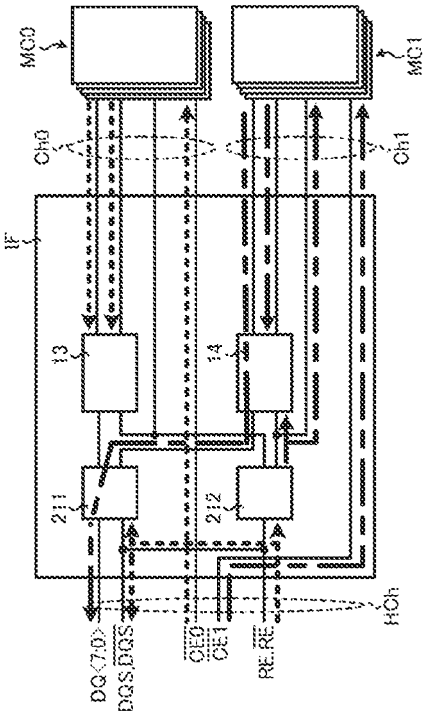
Figure 22A:
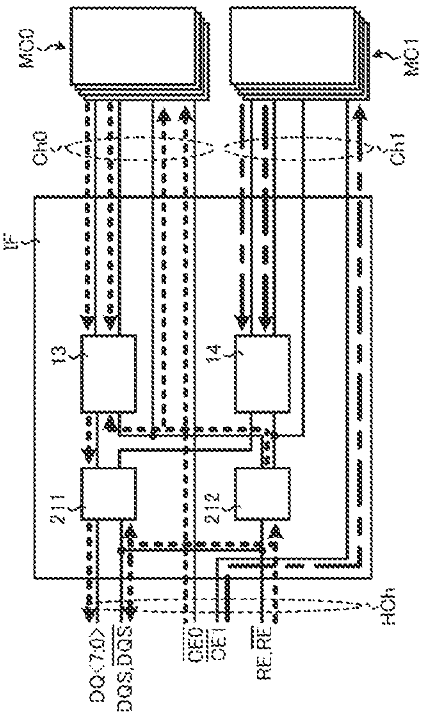
Figure 22B:
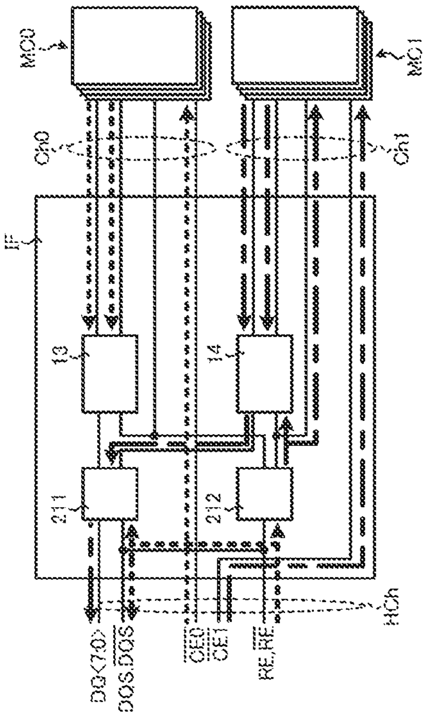

At timing t62, as illustrated in FIGS. 21 and 22B, the relay chip IF transmits the prefetched data signal DQ[Ch1] of the chip MC1 to the host HA, according to the first edge of the read enable signals RE and RE‾.

At this time, the frequency dividing circuit 212 logically inverts the read enable signals RE and RE‾, divides the frequency thereof by two to generate the read enable signals RE1 and RE1‾, supplies the read enable signals RE1 and RE1‾ to the FIFO circuit 14, and also supplies the signals to the chip MC1 via the channel Ch1.

At timing t63, as illustrated in FIGS. 21 and 22A, the relay chip IF transmits the prefetched data signal DQ[Ch0] of the chip MC0 to the host HA, according to the second edge of the read enable signals RE and RE‾.

At this time, in response to the data strobe signals DQS0 and DQS0‾, the relay chip IF stores in the FIFO circuit 13 the data signal DQ[Ch0] transferred from the chip MC0 via the channel Ch0 by the amount of data having been transmitted to the host HA.

At timing t64, as illustrated in FIGS. 21 and 22B, the relay chip IF transmits the prefetched data signal DQ[Ch1] of the chip MC1 to the host HA, according to the third edge of the read enable signals RE and RE‾.

At this time, in response to the data strobe signals DQS1 and DQS1‾, the relay chip IF stores in the FIFO circuit 14 the data signal DQ[Ch1] transferred from the chip MC1 via the channel Ch1 by the amount of data having been transmitted to the host HA.

At timing t65, as illustrated in FIGS. 21 and 22C, the relay chip IF transmits the data signal DQ[Ch0] of the chip MC0 transferred via the channel Ch0 to the host HA, according to the fourth edge of the read enable signals RE and RE‾.

At this time, in response to the data strobe signals DQS0 and DQS0‾, the relay chip IF stores in the FIFO circuit 13 the data signal DQ[Ch0] transferred from the chip MC0 via the channel Ch0 by the amount of data having been transmitted to the host HA.

At timing t66, as illustrated in FIGS. 21 and 22D, the relay chip IF transmits the data signal DQ[Ch1] of the chip MC1 transferred via the channel Ch1 to the host HA, according to the fifth edge of the read enable signals RE and RE‾.

At this time, in response to the data strobe signals DQS1 and DQS1‾, the relay chip IF stores in the FIFO circuit 14 the data signal DQ[Ch1] transferred from the chip MC1 via the channel Ch1 by the amount of data having been transmitted to the host HA.

In this way, the relay chip IF illustrated in FIG. 20 can perform the simultaneous-access inter-channel interleaving operation in the read process.

Fifth Embodiment

Next, a semiconductor device 1 according to a fifth embodiment will be described. Hereinafter, portions different from the first to fourth embodiments will be mainly described.

In the fourth embodiment, the read process by the function of the simultaneous-access inter-channel interleaving operation is illustrated, but in the fifth embodiment, a write process by the function of the simultaneous-access inter-channel interleaving operation will be illustrated.

Figure 23:
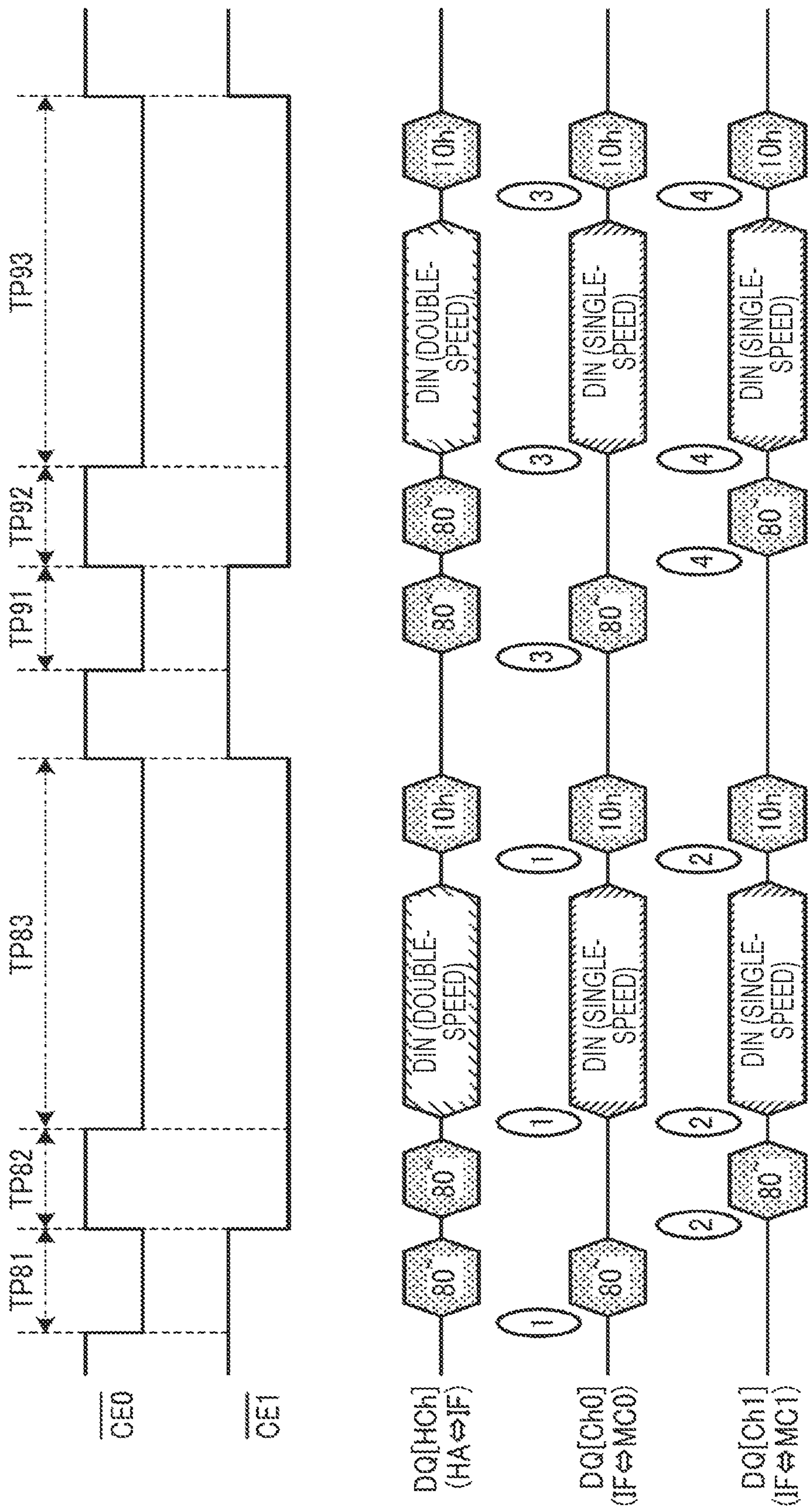
FIG. 23 is a waveform diagram illustrating an operation of a semiconductor device according to a fifth embodiment.

As illustrated in FIG. 23, the semiconductor device 1 may perform the simultaneous-access inter-channel interleaving operation for the write process. FIG. 23 is a diagram illustrating the operation of the semiconductor device 1. FIG. 23 illustrates the inter-channel interleaving operation performed by simultaneously selecting the channels Ch0 and Ch1 for the write process. FIG. 23 illustrates the operation of periods corresponding to the period TP41 to the first half of the period TP43 illustrated in FIG. 12.

Here, it is assumed as an example that the maximum speed of the host channel HCh is twice the maximum speed of each of the channels Ch0 and Ch1.

When a period TP81 starts, the relay chip IF selects the channel Ch0 as the chip enable signal CE0⁻ transitions to the active level, and keeps the channel Ch1 non-selected as the chip enable signal CE1⁻ is maintained at the non-active level. In this state, the relay chip IF transmits the commands "80h–" received via the host channel HCh to the chip (1) as the data signal DQ[Ch0] via the channel Ch0.

When the period TP81 ends and a period TP82 starts, the relay chip IF non-selects the channel Ch0 as the chip enable signal CE0⁻ transitions to the non-active level, and selects the channel Ch1 as the chip enable signal CE1⁻ transitions to the active level. In this state, the relay chip IF transfers the commands "80h–" received via the host channel HCh to the chip (2) as the data signal DQ[Ch1] via the channel Ch1.

When the period TP82 ends and a period TP83 starts, the relay chip IF selects the channel Ch0 as the chip enable signal CE0⁻ transitions to the active level, and keeps the channel Ch1 selected as the chip enable signal CE1⁻ is maintained at the active level. In this state, the relay chip IF receives the write data for the chip (1) and the write data for the chip (2) from the host HA in a time-division manner via the host channel HCh. In parallel, the relay chip IF starts transferring the write data to the chip (1) via the channel Ch0 and transferring the write data to the chip (2) via the channel Ch1 in a time-division manner according to the operation "DIN". As a result, the relay chip IF performs the write data transfer operation to the chip (1) via the channel Ch0 and the write data transfer operation to the chip (2) via the channel Ch1 in parallel with each other.

When the operation "DIN" is completed, the relay chip IF receives the command "10h" for the chip (1) and the command "10h" for the chip (2) from the host HA in a time-division manner via the host channel HCh. In parallel, the relay chip IF starts the transfer of the command "10h" to the chip (1) via the channel Ch0 and the transfer of the command "10h" to the chip (2) via the channel Ch1 in a time-division manner. As a result, the relay chip IF performs the issuing operation of the command "10h" to the chip (1) via the channel Ch0 and the issuing operation of the command "10h" to the chip (2) via the channel Ch1 in parallel with each other.

At the timing when the period TP83 ends, the relay chip IF completes the issuing operation of the command "10h" to the chip (1) and the issuing operation of the command "10h" to the chip (2).

Thereafter, in periods TP91 to TP93 as well, the same operations as in the periods TP81 to TP83 are performed.

Here, for the data signals DQ of the chips (1) and (2), the relay chip IF performs the reception of the write data for the chip (1) and the write data for the chip (2) from the host HA, and performs the transfer of the write data for the chip (1) and the write data of the chip (2) to the chips MC0 and MC1 via the channels Ch0 and Ch1, respectively, in a time-divided manner in a selection period (e.g., during the period TP83) for the simultaneous access of the channels Ch0 and Ch1. As a result, in the write process, the data transfer from the host HA to the semiconductor device 1 can be substantially doubled beyond the maximum speeds of the channels Ch0 and Ch1.

The data transfer for the subsequent chips (i.e., chips (3) to (7)) are the same as that for the chips (1) and (2).

Figure 24:
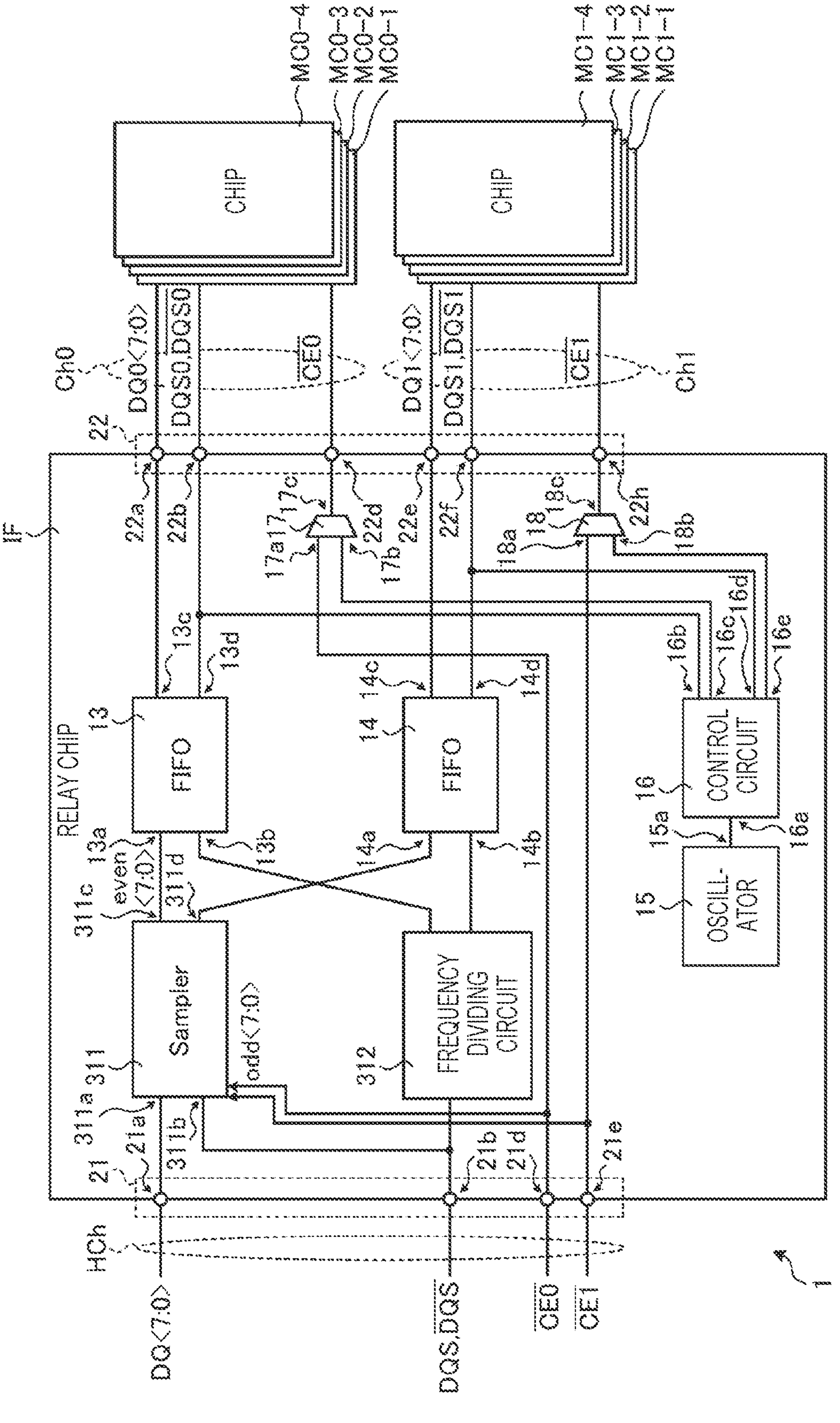
FIG. 24 is a diagram illustrating a configuration of a relay chip according to the fifth embodiment.

As illustrated in FIG. 24, the configuration of the relay chip IF for performing the simultaneous-access inter-channel interleaving operation in the write process is different from that of the third embodiment in the following points. FIG. 24 is a diagram illustrating the configuration of the relay chip IF.

The relay chip IF includes a sampler 311 and a frequency dividing circuit 312, instead of the switching circuit 11 and the switching circuit 12 (see FIG. 13).

On the sampler 311, a data node 311*a* is connected to the terminal group 21*a*, a clock node 311*b* is connected to the terminal group 21*b*, an output node 311*c* is connected to the FIFO circuit 13, and an output node 311*d* is connected to the FIFO circuit 14. The sampler 311 samples the data signal DQ and switches an output destination of the sampled data signal DQ according to the chip enable signal CE0⁻, the chip enable signal CE1⁻, and the data strobe signals DQS and DQS⁻.

When the chip enable signal CE0⁻ is at the active level, the chip enable signal CE1⁻ is at the active level, and the data strobe signals DQS and DQS⁻ are toggled, the sampler 311 switches the output destination to the FIFO circuit 13 according to the even-numbered edge of the toggle of the data strobe signals DQS and DQS⁻, and switches the output destination to the FIFO circuit 14 according to the odd-numbered edges of the toggle of the data strobe signals DQS and DQS⁻.

The sampler 311 also switches the output destination to the FIFO circuit 13 as the chip enable signal CE0⁻ is at the active level and the chip enable signal CE1⁻ is at the non-active level, and also switches the output destination to the FIFO circuit 14 as the chip enable signal CE0⁻ is at the non-active level and the chip enable signal CE1⁻ is at the active level to transfer the data signal DQ. This is the same as the operation of the switching circuit 11.

When the data strobe signals DQS and DQS⁻ are toggled, the frequency dividing circuit 312 divides the frequency of the data strobe signals DQS and DQS⁻ by two to generate data strobe signals DQS' and DQS⁻'. The generated data strobe signals DQS' and DQS⁻' toggle at the half speed of the data strobe signals DQS and DQS⁻. The frequency dividing circuit 312 supplies the data strobe signals DQS' and DQS⁻' to the FIFO circuits 13 and 14.

As the chip enable signal CE0⁻ is at the active level and the chip enable signal CE1⁻ is at the active level, the control circuit 16 generates the data strobe signals DQS0 and DQS0⁻ to be toggled and supplies the signals to the chip MC0, and generates the data strobe signals DQS1 and DQS1⁻ to be toggled and supplies the signals to the chip MC1. As a result, the relay chip IF can change the data strobe signals to be supplied to the chip MC via the channel Ch from the data strobe signals DQS and DQS⁻ of the host HA to the data strobe signals DQS0, DQS0⁻, DQS1, and DQS1 of the control circuit 16.

Figure 25:
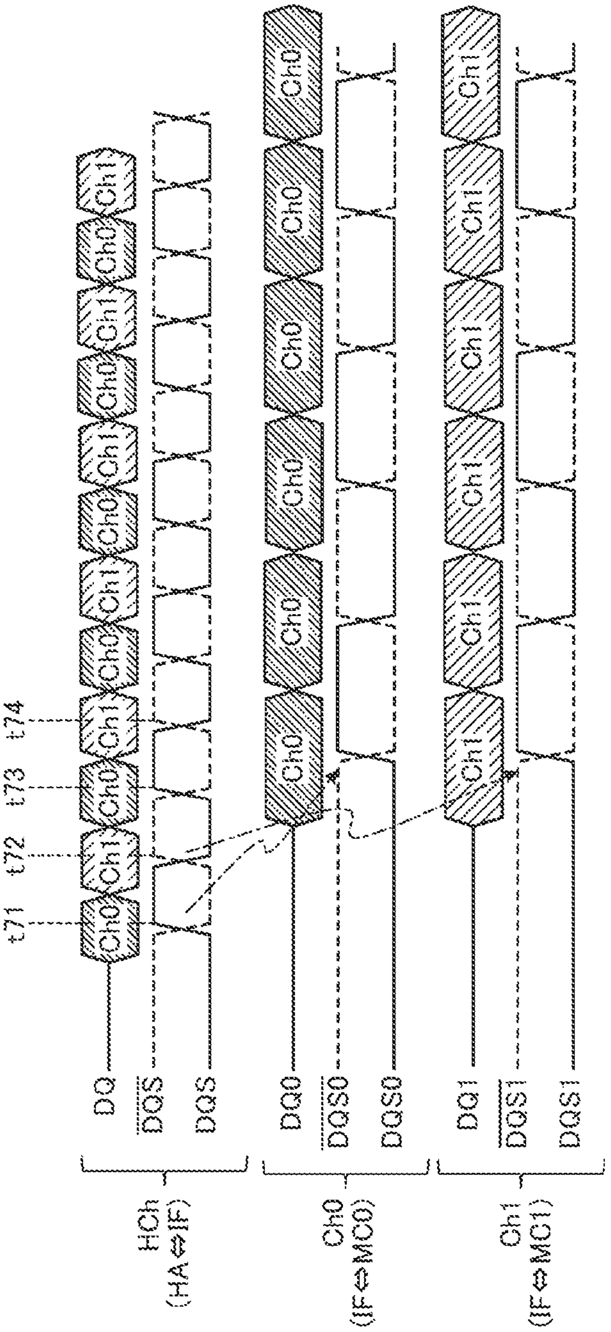
FIG. 25 is a waveform diagram illustrating an operation of the semiconductor device according to the fifth embodiment.

As illustrated in FIGS. 25 and 26A to 26D, the relay chip IF receives the data signals DQ for the chips MC0 and MC1 from the host HA in a time-division manner and transfers them to the chips MC0 and MC1 in a time-division manner in a selection period for the simultaneous access of the channels Ch0 and Ch1. FIG. 25 is a waveform diagram illustrating the operation of the relay chip IF. FIGS. 26A to 26D are diagrams illustrating the operation of the relay chip IF. FIGS. 26A to 26D illustrate the operation "DIN" of the relay chip IF in the period TP83 illustrated in FIG. 23.

FIG. 25 illustrates a case where the maximum speed of the host channel HCh is twice the maximum speed of each of the channels Ch0 and Ch1.

The toggle frequency of the data strobe signals DQS and DQS⁻ supplied from the host HA to the relay chip IF via the host channel HCh is twice the toggle frequency of the data strobe signals DQS0 and DQS0⁻ supplied from the control circuit 16 to the FIFO circuit 13 and the chip MC0 via the channel Ch0. The toggle frequency of the data strobe signals DQS and DQS⁻ is twice the toggle frequency of the data strobe signals DQS1 and DQS1 supplied from the control circuit 16 to the FIFO circuit 14 and the chip MC1 via the channel Ch1.

Immediately before timing t71, the relay chip IF selects the channel Ch0 as the chip enable signal CE0⁻ transitions to the active level, and selects the channel Ch1 as the chip enable signal CE1⁻ transitions to the active level. Thereafter, the selectors 17 and 18 maintain the input nodes 17*a* and 18*a* at the selected state, and supply the chip enable signals CE0⁻ and CE1⁻ from the host HA to the chips MC0 and MC1 via the channels Ch0 and Ch1, respectively.

Figure 26A:
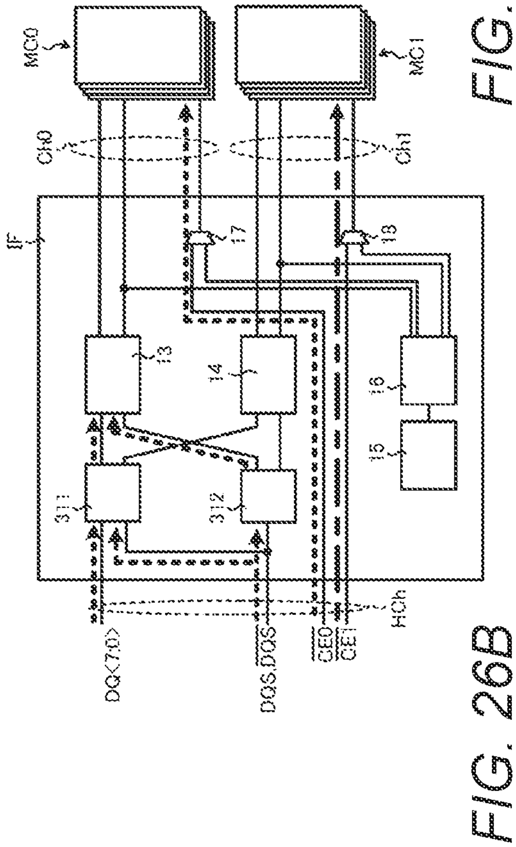
FIGS. 26A to 26D are diagrams illustrating an operation of the relay chip in the fifth embodiment.

At the timing t71, the data strobe signals DQS and DQS start to be toggled. As illustrated in FIGS. 25 and 26A, the relay chip IF receives the write data for the chip MC0 via the host channel HCh and stores the write data in the FIFO circuit 13, according to the 0th edge of the data strobe signals DQS and DQS⁻.

Figure 26B:
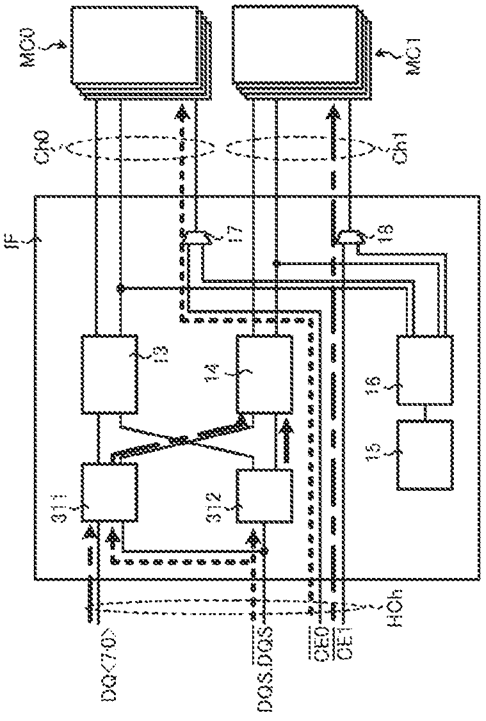

At timing t72, as illustrated in FIGS. 25 and 26B, the relay chip IF receives the write data for the chip MC1 via the host channel HCh and stores the write data in the FIFO circuit 14, according to the first edge of the data strobe signals DQS and DQS⁻. At this time, the FIFO circuit 13 keeps the write data of the chip MC0 stored therein.

Figure 26C:
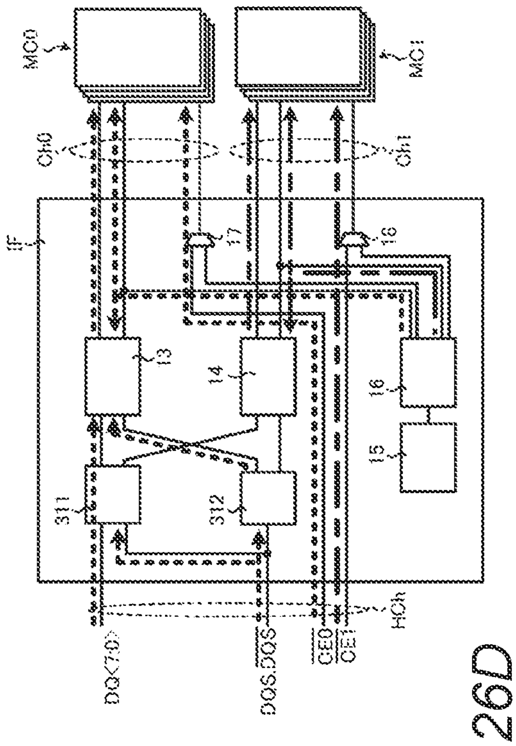

At timing t73, as illustrated in FIGS. 25 and 26C, the relay chip IF receives the write data for the chip MC0 via the host channel HCh and stores the write data in the FIFO circuit 13, according to the second edge of the data strobe signals DQS and DQS⁻.

At this time, the relay chip IF transfers the write data for the chip MC0 stored in the FIFO circuit 13 to the chip MC0 via the channel Ch0 in response to the data strobe signals DQS0 and DQS0⁻. Further, the relay chip IF transfers the write data for the chip MC1 stored in the FIFO circuit 14 to the chip MC1 via the channel Ch1 in response to the data strobe signals DQS1 and DQS1⁻.

Figure 26D:
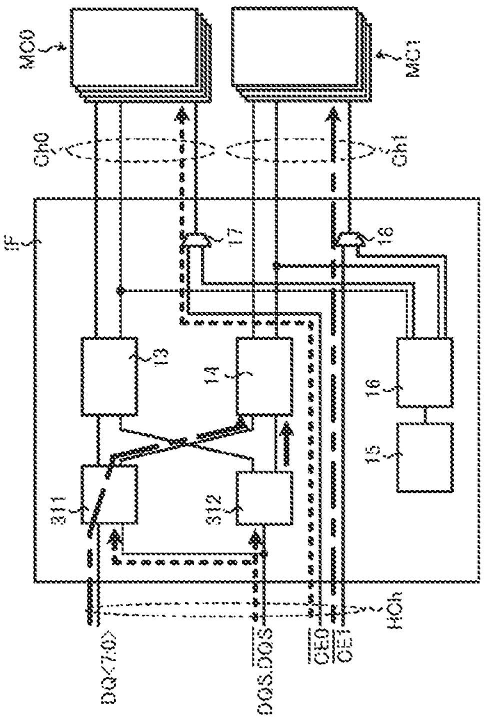

At timing t74, as illustrated in FIGS. 25 and 26D, the relay chip IF receives the write data for the chip MC1 via the host channel HCh and stores the write data in the FIFO circuit 14, according to the third edge of the data strobe signals DQS and DQS⁻. At this time, the FIFO circuit 13 keeps the write data of the chip MC0 stored therein.

Thereafter, until the transfer of the total amount of data received from the host HA is completed, the same operations as the timings t73 and t74 are alternately repeated for each edge of the toggle of the data strobe signals DQS and DQS⁻.

The start timing of the toggle of the data strobe signals DQS0, DQS0⁻, DQS1, and DQS1⁻ by the control circuit 16 may be experimentally obtained in advance based on a period in which the data received from the host HA can be output from the FIFO circuits 13 and 14 (in the case of FIG. 25, the period corresponding to two toggles of the data strobe signals DQS and DQS). As a result, the data transfer from the relay chip IF to each chip MC can be started at an early timing.

As described above, in the fifth embodiment, the semiconductor device 1 can speed up the data transfer via the channel Ch in the semiconductor device 1 in the write process beyond the maximum speed of the channel Ch by the function of the simultaneous-access inter-channel interleaving operation.

Figure 27:
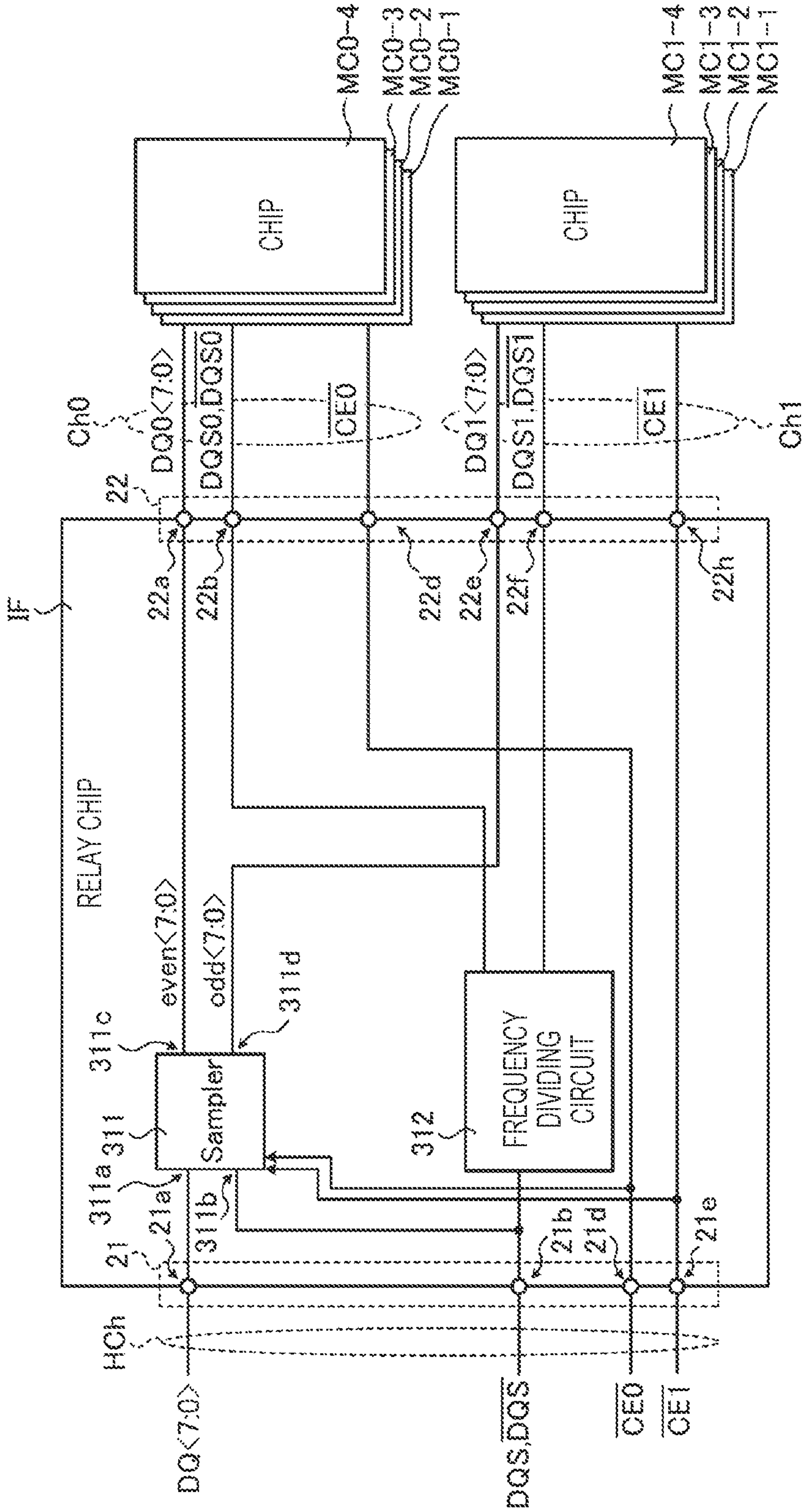
FIG. 27 is a diagram illustrating a configuration of a relay chip in a modification of the fifth embodiment.

As illustrated in FIG. 27, the relay chip IF for performing the simultaneous-access inter-channel interleaving operation in the write process may be configured to pass the data strobe signals DQS and DQS⁻ of the host HA. FIG. 27 is a diagram illustrating the configuration of a relay chip IF in a modification of the fifth embodiment. The relay chip IF illustrated in FIG. 27 is different from the relay chip IF illustrated in FIG. 24 in that the FIFO circuit 13, the FIFO circuit 14, the oscillator 15, the control circuit 16, the selector 17, and the selector 18 are omitted and lines extend from the frequency dividing circuit 312 to the terminals 22*b* and 22*f*. The terminal 21*d* is connected to the terminal 22*d*, and the chip enable signal CE0⁻ from the host HA is supplied to the chip MC0 via the channel Ch0. The terminal 21*e* is connected to the terminal 22*h*, and the chip enable signal CE1⁻ from the host HA is supplied to the chip MC1 via the channel Ch1.

When the data strobe signals DQS and DQS⁻ are toggled, the frequency dividing circuit 312 divides the frequency of the data strobe signals DQS and DQS⁻ by two according to the even-numbered edges of the toggle of the data strobe signals DQS and DQS⁻ to generate the data strobe signals DQS0 and DQS0⁻ to be toggled at the half speed of the data strobe signals DQS and DQS⁻. The frequency dividing circuit 312 supplies the data strobe signals DQS0 and DQS0⁻ to be toggled at the half speed to the chip MC0 via the channel Ch0. That is, the relay chip IF substantially passes the data strobe signals DQS and DQS from the host HA while dividing the frequency thereof, and supplies the divided data strobe signals DQS and DQS⁻ to the chip MC0 via the channel Ch0.

Further, the frequency dividing circuit 312 logically inverts the data strobe signals DQS and DQS⁻ and divides the frequency thereof by two according to the odd-numbered edges of the toggle of the data strobe signals DQS and DQS⁻, to generate the data strobe signals DQS1 and DQS1⁻ to be toggled at the half speed of the data strobe signals DQS and DQS⁻. The frequency dividing circuit 312 supplies the data strobe signals DQS1 and DQS1⁻ to be toggled at the half speed to the chip MC1 via the channel Ch1. That is, the relay chip IF substantially passes the data strobe signals DQS and DQS⁻ from the host HA while dividing the frequency thereof, and supplies the divided data strobe signals DQS and DQS⁻ to the chip MC1 via the channel Ch1.

Figure 28:
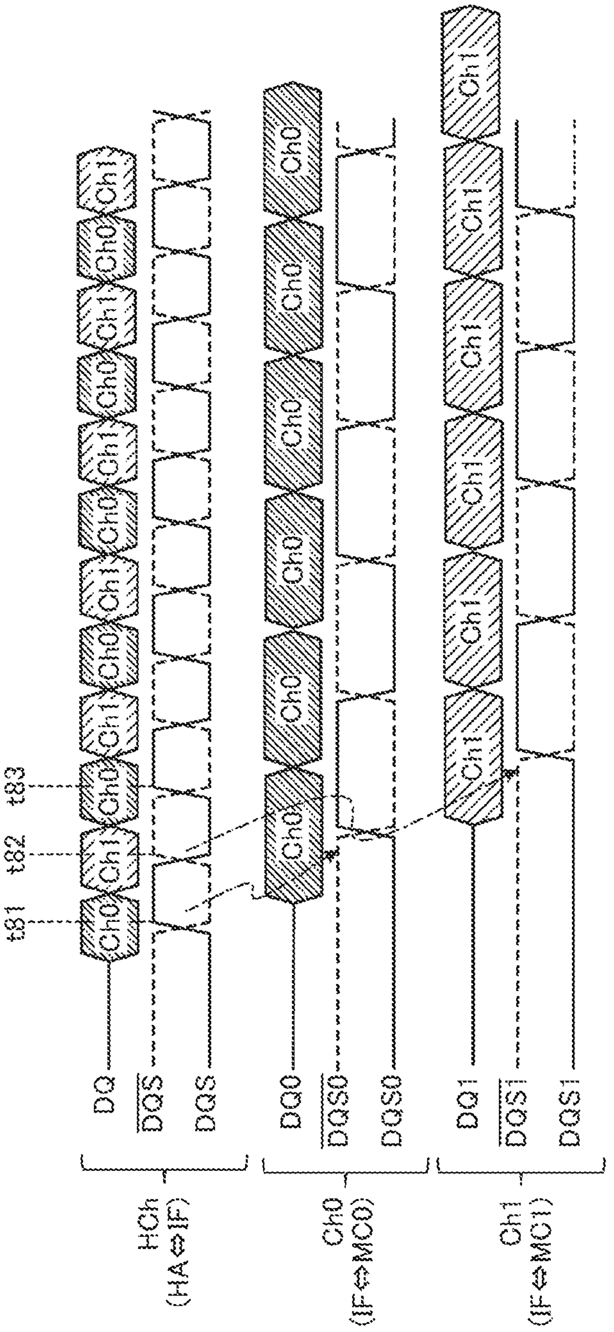
FIG. 28 is a waveform diagram illustrating an operation of a semiconductor device according to the modification of the fifth embodiment.
Figure 29A:
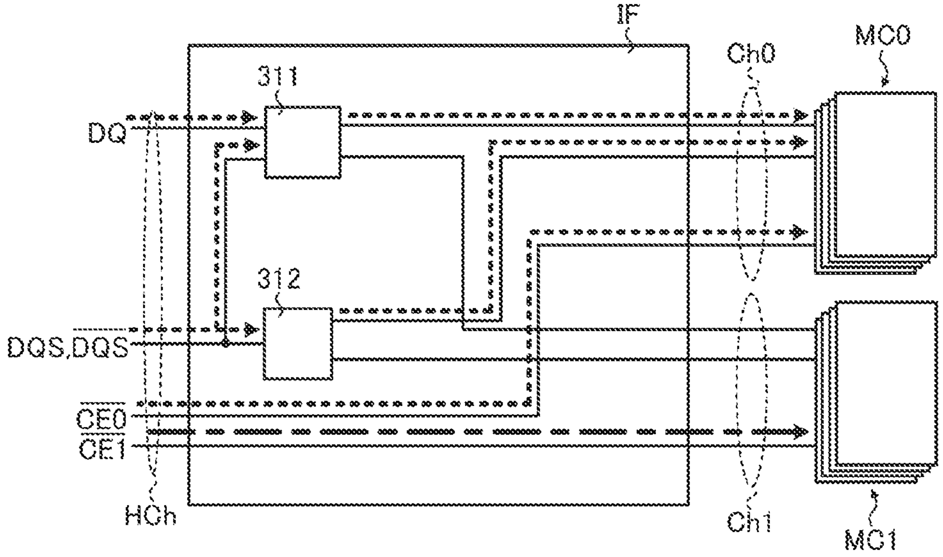
FIGS. 29A and 29B are diagrams illustrating an operation of the relay chip in the modification of the fifth embodiment.
Figure 29B:
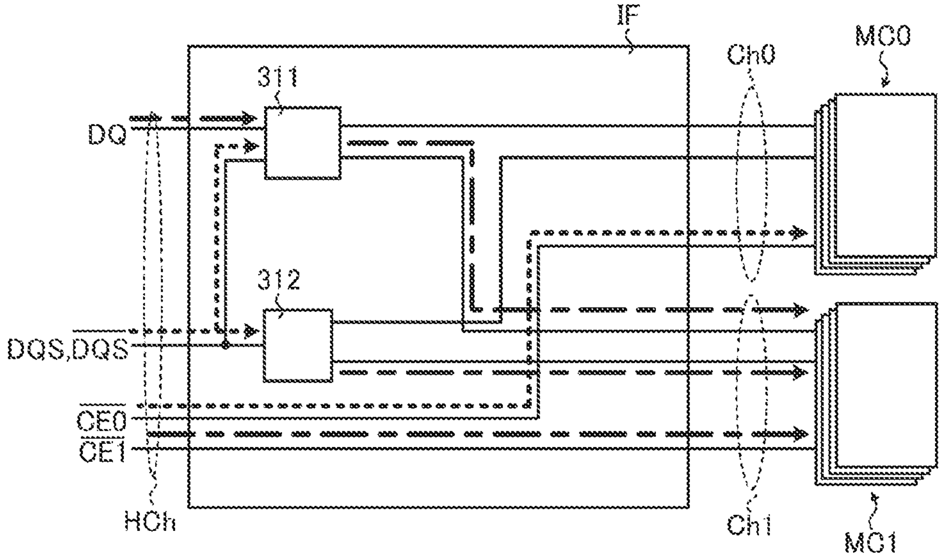

Further, as illustrated in FIGS. 28, 29A, and 29B, the operation of the relay chip IF illustrated in FIG. 27 is different from that of the relay chip IF illustrated in FIG. 24 in the following points. FIGS. 28, 29A, and 29B illustrate the operation "DIN" of the relay chip IF in the period TP83 illustrated in FIG. 23. The description of the same portions as those in FIGS. 25 and 26A to 26C will be omitted.

At timing t81, the data strobe signals DQS and DQS⁻ start to be toggled. As illustrated in FIGS. 28 and 29A, the relay chip IF transfers the data signal DQ for the chip MC0 received via the host channel HCh to the chip MC0, according to the 0th edge of the data strobe signals DQS and DQS⁻.

At this time, the frequency dividing circuit 312 divides the frequency of the data strobe signals DQS and DQS⁻ by two to generate the data strobe signals DQS0 and DQS0⁻. The frequency dividing circuit 312 transfers the data strobe signals DQS0 and DQS0⁻ to the chip MC0 via the channel Ch0.

At timing t82, as illustrated in FIGS. 28 and 29B, the relay chip IF transfers the data signal DQ for the chip MC1 received via the host channel HCh to the chip MC1 via the channel Ch1, according to the first edge of the data strobe signals DQS and DQS⁻.

At this time, the frequency dividing circuit 312 logically inverts the data strobe signals DQS and DQS⁻ and divides the frequency thereof by two to generate the data strobe signals DQS1 and DQS1⁻. The frequency dividing circuit 312 transfers the data strobe signals DQS1 and DQS1⁻ to the chip MC1 via the channel Ch1.

At timing t83, as illustrated in FIGS. 28 and 29A, the relay chip IF transfers the data signal DQ for the chip MC0 received via the host channel HCh to the chip MC0 via the channel Ch0, according to the second edge of the data strobe signals DQS and DQS⁻.

At this time, the frequency dividing circuit 312 divides the data strobe signals DQS and DQS⁻ by two to generate the data strobe signals DQS0 and DQS0⁻. The frequency dividing circuit 312 transfers the data strobe signals DQS0 and DQS0⁻ to the chip MC0 via the channel Ch0.

Thereafter, the same operations as the timings t82 and t83 are alternately repeated for each edge of the data strobe signals DQS and DQS⁻ until the transfer of the total amount of data received from the host HA is completed.

In this way, the relay chip IF illustrated in FIG. 27 can also perform the simultaneous-access inter-channel interleaving operation in the write process.

Sixth Embodiment

Next, a semiconductor device 1 according to a sixth embodiment will be described. Hereinafter, portions different from the first to fifth embodiments will be mainly described.

In the first embodiment, the simplified configuration of the relay chip IF is illustrated, but in the sixth embodiment, another example of the configuration of the relay chip IF will be illustrated.

The relay chip IF is configured to store a command when the command is to be issued to a chip MC via a selected channel Ch. Thereby, it is possible to control the data transfer according to the command with respect to the chip MC after the channel Ch becomes non-selected. Further, it is possible to control the data transfer according to the command with the host HA after the channel Ch becomes selected again.

Figure 30:
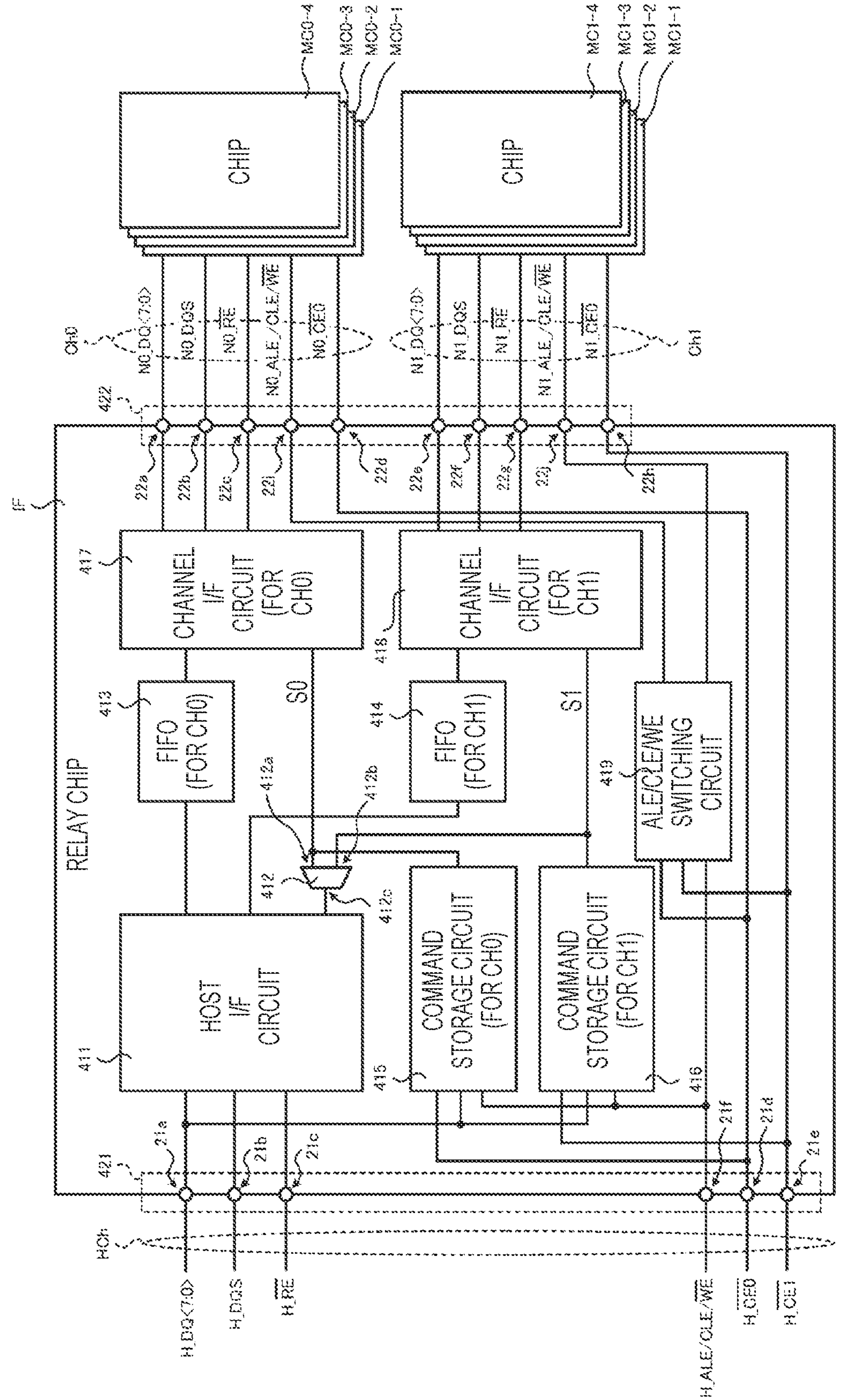
FIG. 30 is a diagram illustrating a configuration of a relay chip in a sixth embodiment.

For example, the relay chip IF may be configured as illustrated in FIG. 30. FIG. 30 is a diagram illustrating the configuration of the relay chip IF.

The relay chip IF includes a host interface (I/F) circuit 411, a selector 412, a FIFO circuit 413, a FIFO circuit 414, a command storage circuit 415, a command storage circuit 416, a channel interface (I/F) circuit 417, a channel interface (I/F) circuit 418, an ALE/CLE/WE⁻ switching circuit 419, a terminal group 421, and a terminal group 422.

The terminal group 421 further includes a terminal group 21*f* in addition to the terminal group 21 (see FIG. 6). The terminal group 21*f* includes a terminal for an address latch enable signal H_ALE, a terminal for a command latch enable signal H_CLE, and a terminal for a write enable signal H_WE⁻.

The terminal group 422 further includes terminal groups 22*i* and 22*j* in addition to the terminal group 22 (see FIG. 6). The terminal group 22*i* includes a terminal for an address latch enable signal N0_ALE, a terminal for a command latch enable signal N0_CLE, and a terminal for a write enable signal N0_WE⁻. The terminal group 22*j* includes a terminal for an address latch enable signal N1_ALE, a terminal for a command latch enable signal N1_CLE, and a terminal for a write enable signal N1_WE⁻.

The ALE/CLE/WE⁻ switching circuit 419 is disposed between the terminal group 21*f* and the terminal groups 22*i* and 22*j*. The ALE/CLE/WE⁻ switching circuit 419 switches the connection between the terminal group 21*f* and the terminal groups 22*i* and 22*j* according to chip enable signals H_CE0⁻ and H_CE1⁻. The ALE/CLE/WE⁻ switching circuit 419 connects the terminal group 21*f* to the terminal group 22*i* when the chip enable signal H_CE0 is at the active level and the chip enable signal H_CE1⁻ is at the non-active level. The ALE/CLE/WE⁻ switching circuit 419 connects the terminal group 21*f* to the terminal group 22*j* when the chip enable signal H_CE0⁻ is at the non-active level and the chip enable signal H_CE1⁻ is at the active level.

The FIFO circuit 413 is electrically connected between the host interface circuit 411 and the channel interface circuit 417. The FIFO circuit 413 is a circuit for the channel Ch0 and has the same function as the FIFO circuit 13 (see FIG. 6).

The FIFO circuit 414 is electrically connected between the host interface circuit 411 and the channel interface circuit 418. The FIFO circuit 414 is a circuit for the channel Ch1 and has the same function as the FIFO circuit 14 (see FIG. 6).

The command storage circuit 415 is electrically connected between the terminal group 421, the selector 412, and the channel interface circuit 417. The command storage circuit 415 is a circuit for the channel Ch0. When the command latch enable signal H_CLE is at the active level and the chip enable signal H_CE0⁻ is at the active level, the command storage circuit 415 stores a command in a data signal DQ<7:0> from the host HA. The command storage circuit 415 generates a control signal S0 corresponding to the channel Ch0 according to the stored command and supplies the control signal S0 to the selector 412 and the channel interface circuit 417.

The command storage circuit 416 is electrically connected between the terminal group 421, the selector 412, and the channel interface circuit 418. The command storage circuit 416 is a circuit for the channel Ch1. When the command latch enable signal H_CLE is at the active level and the chip enable signal H_CE1¯ is at the active level, the command storage circuit 416 stores a command in the data signal DQ<7:0> from the host HA. The command storage circuit 416 generates a control signal S1 corresponding to the channel Ch1 according to the stored command and supplies the control signal S1 to the selector 412 and the channel interface circuit 418.

On the selector 412, an input node 412*a* is connected to the command storage circuit 415, an input node 412*b* is connected to the command storage circuit 416, and an output node 412*c* is connected to the host interface circuit 411. The selector 412 supplies the control signal S0 to the host interface circuit 411 by selecting the input node 412*a*, and supplies the control signal S1 to the host interface circuit 411 by selecting the input node 412*b*.

The host interface circuit 411 is electrically connected among the terminal group 421, the selector 412, the FIFO circuit 413, and the FIFO circuit 414, and performs an interface operation for the host HA.

The host interface circuit 411 switches between the first connection state and the second connection state according to the control signal S0 and the control signal S1. The first connection state is a state in which the terminal group 21*a* and the FIFO circuit 413 are connected to each other. The second connection state is a state in which the terminal group 21*a* and the FIFO circuit 414 are connected to each other. The host interface circuit 411 switches to the first connection state in response to an instruction by the control signal S0 to select the channel Ch0 and to perform data transfer, and switches to the second connection state in response to an instruction by the control signal S1 to select the channel Ch1 and to perform data transfer.

The host interface circuit 411 also switches between the third connection state and the fourth connection state according to the control signal S0 and the control signal S1. The third connection state is a state in which the terminal group 21*c* and the FIFO circuit 413 are connected to each other. The fourth connection state is a state in which the terminal group 21*c* and the FIFO circuit 414 are connected to each other. The host interface circuit 411 switches to the third connection state in response to an instruction by the control signal S0 to select the channel Ch0 and to perform the data transfer, and switches to the fourth connection state in response to an instruction by the control signal S1 to select the channel Ch1 and to perform the data transfer.

The channel interface circuit 417 is electrically connected among the FIFO circuit 413, the command storage circuit 415, and the terminal group 422. The channel interface circuit 417 is a circuit for the channel Ch0 and performs an interface operation for the channel Ch0. The channel interface circuit 417 issues a command in response to an instruction by the control signal S0 to select the channel Ch0 and to issue o the command, and supplies it as a data signal N0_DQ<7:0> to the chip MC0 via the channel Ch0. The channel interface circuit 417 generates a read enable signal N0_RE¯ to be toggled in response to an instruction to non-select the channel Ch0 and to perform the data transfer, supplies the signal to the chip MC0 via the channel Ch0, and transfers the data signal N0_DQ<7:0> and a data strobe signal NO DQS, which are transferred from the chip MC0 via the channel Ch0, to the FIFO circuit 413. The channel interface circuit 417 also generates the read enable signal NO RE to be toggled in response to an instruction to select the channel Ch0 and to perform the data transfer, supplies the signal to the chip MC0 via the channel Ch0, and transfers the data signal NO DQ<7:0> and the data strobe signal NO DQS, which are transferred from the chip MC0 via the channel Ch0, to the FIFO circuit 413.

The channel interface circuit 418 is electrically connected among the FIFO circuit 414, the command storage circuit 416, and the terminal group 422. The channel interface circuit 418 is a circuit for the channel Ch1 and performs an interface operation for the channel Ch1. The channel interface circuit 418 issues a command in response to an instruction by the control signal S1 to select the channel Ch1 and to issue the command, and supplies it as a data signal N1_DQ<7:0> to the chip MC1 via the channel Ch1. The channel interface circuit 418 generates a read enable signal N1_RE¯ to be toggled in response to an instruction to non-select the channel Ch0 and to perform the data transfer, supplies the signal to the chip MC1 via the channel Ch1, and transfers the data signal N1_DQ<7:0> and a data strobe signal N1_DQS, which are transferred from the chip MC1 via the channel Ch1, to the FIFO circuit 414. The channel interface circuit 418 also generates the read enable signal N1_RE¯ to be toggled in response to an instruction to select the channel Ch1 and to perform the data transfer, supplies the signal to the chip MC1 via the channel Ch1, and transfers the data signal N1_DQ<7:0> and the data strobe signal N1_DQS, which are transferred from the chip MC1 via the channel Ch1, to the FIFO circuit 414.

As described above, in the sixth embodiment, the semiconductor device 1 can implement the inter-channel interleaving operation with the configuration as illustrated in FIG. 30.

Seventh Embodiment

Next, a semiconductor device 1 according to a seventh embodiment will be described. Hereinafter, portions different from the first to sixth embodiments will be mainly described.

In the fifth embodiment, the configuration in the case where the maximum speed of the channel Ch in the semiconductor device 1 is lower than (e.g., ½ times) the maximum speed of the host channel HCh is illustrated, but in the seventh embodiment, a configuration in a case where the maximum speed of the channel Ch in the semiconductor device 1 is equal to or higher than the maximum speed of the host channel HCh is illustrated.

In order to take advantage of the high speed of the channel Ch in the semiconductor device 1, it is desired to reduce the number lines between the relay chip IF and chips MC to speed up a data transfer timing signal.

Figure 31:
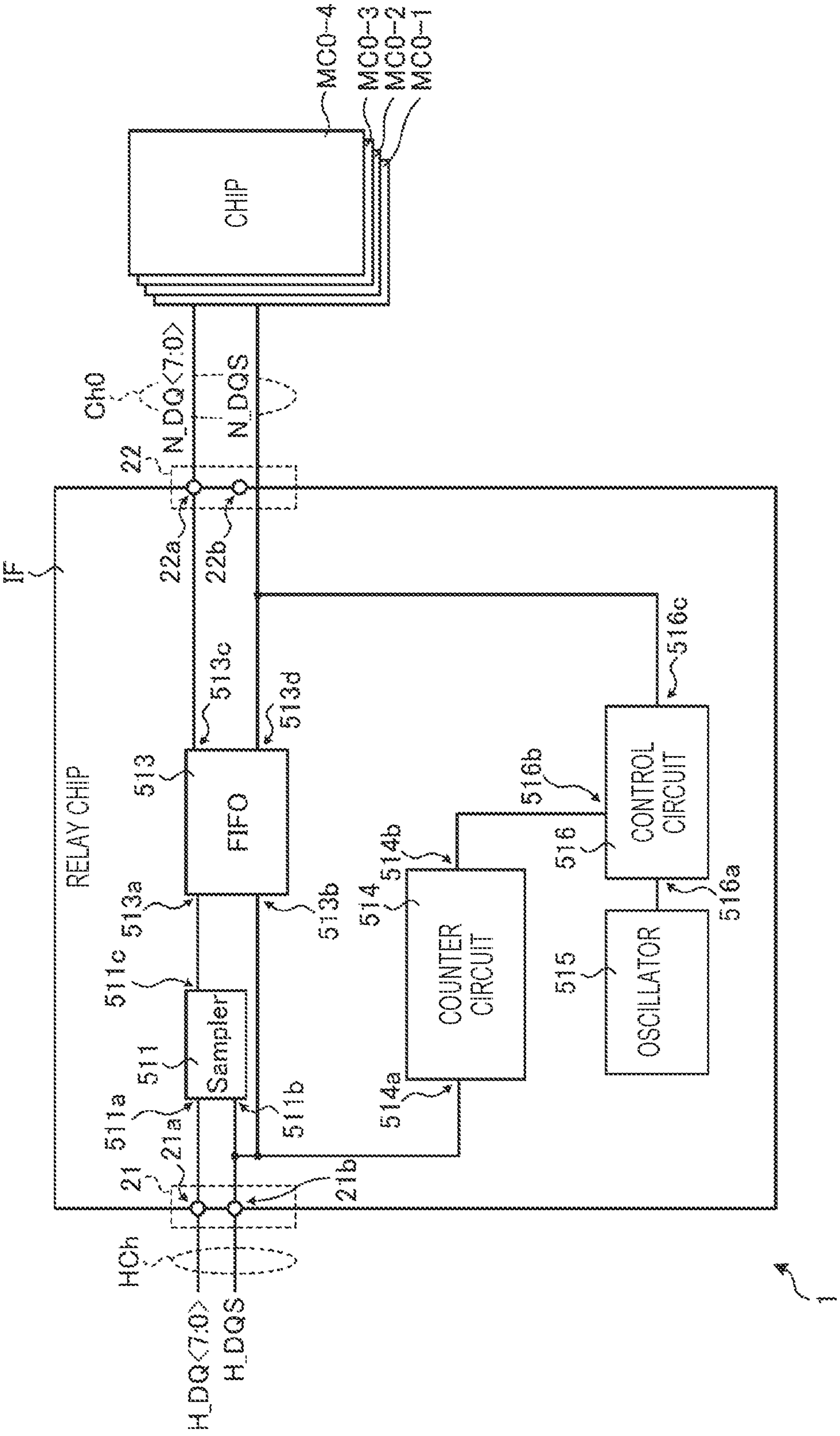
FIG. 31 is a diagram illustrating a configuration of a relay chip in a seventh embodiment.

For example, the relay chip IF may be configured as illustrated in FIG. 31. FIG. 31 is a diagram illustrating the configuration of the relay chip IF.

In the semiconductor device 1 according to the seventh embodiment, the channel Ch1 and the chips MC1-1 to MC1-4 are omitted. The relay chip IF includes a sampler 511, a FIFO circuit 513, a counter circuit 514, an oscillator 515, a control circuit 516, a terminal group 21, and a terminal group 22.

The sampler 511 is electrically connected between the terminal group 21 and the FIFO circuit 513. On the sampler 511, a data node 511*a* is connected to the terminal group 21*a*, a clock node 511*b* is connected to the terminal group 21*b*, and an output node 511*c* is connected to the FIFO circuit 513. The sampler 511 samples a data signal H_DQ and outputs the sampled data signal H_DQ to the FIFO circuit 513 in response to a data strobe signal H_DQS.

The FIFO circuit 513 is electrically connected between the terminal group 21, the sampler 511, and the terminal group 22. On the FIFO circuit 513, a data node 513*a* is connected to the sampler 511, a clock node 513*b* is connected to the terminal group 21*b*, a data node 513*c* is connected to the terminal group 22*a*, and a clock node 513*d* is connected to the terminal group 22*b*. The FIFO circuit 513 has the same function as the FIFO circuit 13 (see FIG. 24), but differs from the FIFO circuit 13 in that the FIFO circuit 513 receives the data signal H_DQ in response to the data strobe signal H_DQS from the host HA.

The counter circuit 514 is electrically connected between the terminal group 21 and the control circuit 516. On the counter circuit 514, an input node 514*a* is connected to the terminal group 21*b*, and an output node 514*b* is connected to the control circuit 516. When the data strobe signal H_DQS is toggled, the counter circuit 514 counts the number of toggles of the data strobe signal H_DQS and outputs the count result to the control circuit 516.

The oscillator 515 performs an oscillation operation to generate an oscillation signal. The frequency of the oscillation signal may be equal to the toggle frequency of the data strobe signal H_DQS, or may be higher than the frequency of the data strobe signal H_DQS. The oscillator 515 outputs the oscillation signal to the control circuit 516.

The control circuit 516 is electrically connected among the counter circuit 514, the oscillator 515, the FIFO circuit 513, and the terminal group 22. On the control circuit 516, an input node 516*a* is connected to the oscillator 515, an input node 516*b* is connected to the counter circuit 514, and an output node 516*c* is connected to the FIFO circuit 513 and the terminal group 22.

The control circuit 516 uses the oscillation signal to generate a data strobe signal N_DQS to be toggled at a frequency equal to or higher than the frequency of the data strobe signal H_DQS, supplies the data strobe signal N_DQS to the FIFO circuit 513 and to the chip MC0 via the channel Ch0. In response to the data strobe signal N_DQS, the FIFO circuit 513 can internally shift the data signal N_DQ between the plurality of queue entries, and transfer the data signal N_DQ to the chip MC0 via the channel Ch0.

Further, when it is determined based on the count value of the counter circuit 514 that the FIFO circuit 513 is empty, the control circuit 516 stops the toggle of the data strobe signal N_DQS. When it is determined based on the count value of the counter circuit 514 that the FIFO circuit 513 starts storing the data signal H_DQ again, the control circuit 516 restarts the toggle of the data strobe signal N_DQS. As a result, the power consumption of the relay chip IF can be reduced.

Figure 32:
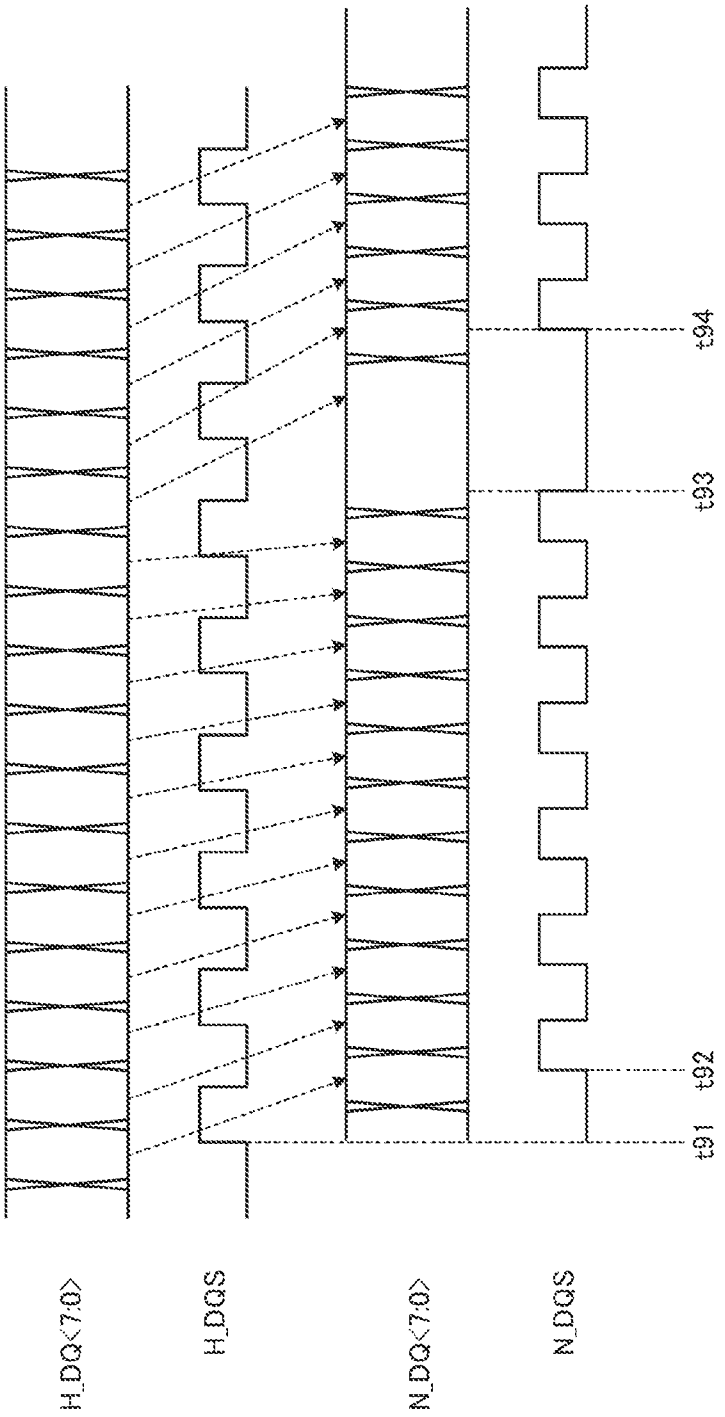
FIG. 32 is a waveform diagram illustrating an operation of a semiconductor device according to the seventh embodiment.

For example, when the maximum speed of the channel Ch in the semiconductor device 1 is higher than the maximum speed of the host channel HCh, the relay chip IF may operate as illustrated in FIG. 32. FIG. 32 is a waveform diagram illustrating the operation of the relay chip IF.

At timing t91, the data strobe signal H_DQS starts to be toggled, and the counter circuit 514 starts counting the number of toggles of the data strobe signal H_DQS. The relay chip IF receives the data signal H_DQ for the chip MC0 via the host channel HCh according to the edge of the data strobe signal H_DQS and stores the data signal in the FIFO circuit 513.

At timing t92, the control circuit 516 starts toggling the data strobe signal N_DQS, supplies the data strobe signal N_DQS to the FIFO circuit 513, and supplies the data strobe signal N_DQS to the chip MC0 via the channel Ch0.

At timing t93, the control circuit 516 determines that the FIFO circuit 513 becomes empty in response to the fact that the number of toggles of the data strobe signal H_DQS becomes equal to the number of toggles of the data strobe signal N_DQS generated by the control circuit 516, and stops the toggle of the data strobe signal N_DQS.

At timing t94, the control circuit 516 determines that the FIFO circuit 513 starts storing the data signal H_DQ again in response to the fact that the number of toggles of the data strobe signal H_DQS becomes larger than the number of toggles of the data strobe signal N_DQS, and restarts the toggle of the data strobe signal N_DQS.

Thereafter, the same operations as the timings t92 to t94 are repeated. By this operation, as indicated by a dotted arrow, it may be seen that the data signal H_DQ is transferred as the data signal N_DQ from the host HA to the chip MC0 without excess or deficiency.

As described above, in the seventh embodiment, the semiconductor device 1 can increase the data transfer speed in the semiconductor device 1 beyond the maximum speed of the host channel HCh.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a relay chip configured to be connected to a host;
a first chip connected to the relay chip via a first channel; and
a second chip connected to the relay chip via a second channel,
wherein the relay chip is configured to:
receive, from the host, a first enable signal for selecting the first channel and a second enable signal for selecting the second channel; and
during a first period in which the first enable signal is maintained at a non-active level and the second enable signal is maintained at an active level, perform, in parallel, a first data transfer operation via the first channel and a first command issuing operation via the second channel.

2. The semiconductor device according to claim 1, wherein
the relay chip is further configured to:
be connected to the host via a third channel; and
after the first period, during a second period in which the first enable signal is maintained at the active level and the second enable signal is maintained at the non-active level, perform, in parallel, a second data transfer operation via the first channel, a third data transfer operation via the second channel, and a fourth data transfer operation via the third channel.

3. The semiconductor device according to claim 2, wherein
the relay chip is further configured to:
communicate a first timing signal via the first channel, and perform the second data transfer operation in response to the first timing signal;
communicate a second timing signal via the second channel, and perform the third data transfer operation in response to the second timing signal; and communicate a third timing signal via the third channel, and perform the fourth data transfer operation in response to the third timing signal, wherein a frequency of the third timing signal is different from a frequency of the first timing signal and a frequency of the second timing signal.

4. The semiconductor device according to claim 3, wherein the relay chip includes a first queue and a second queue, and the relay chip is further configured to:

in the second data transfer operation, transfer data between the first chip and the first queue in response to the first timing signal;

in the third data transfer operation, transfer data between the second chip and the second queue in response to the second timing signal; and in the fourth data transfer operation, transfer data between the host and the first queue in response to the third timing signal.

5. The semiconductor device according to claim 4, wherein the relay chip further includes a switch circuit configured to switch, based on the first enable signal and the second enable signal, a connection destination of the third timing signal between the first queue and the second queue.

6. The semiconductor device according to claim 5, wherein the switch circuit is configured to:

while the first enable signal is maintained at the active level and the second enable signal is maintained at the non-active level, connect the third timing signal to the first queue; and while the first enable signal is maintained at the non-active level and the second enable signal is maintained at the active level, connect the third timing signal to the second queue.

7. The semiconductor device according to claim 1, wherein the relay chip is further configured to:

in the first data transfer operation, transfer first data from the first chip;

after the first period, during a second period in which the first enable signal is maintained at the non-active level and the second enable signal is maintained at the non-active level, perform a second data transfer operation to transfer second data from the first chip.

8. The semiconductor device according to claim 7, wherein the relay chip is further configured to:

be connected to the host via a third channel; and after the second period, during a third period in which the first enable signal is maintained at the active level and the second enable signal is maintained at the non-active level, perform a third data transfer operation to transfer third data from the first chip.

9. The semiconductor device according to claim 8, wherein the relay chip is further configured to:

during the third period, perform, in parallel with the third data transfer operation, a fourth data transfer operation to transfer fourth data to the host.

10. The semiconductor device according to claim 9, wherein the amount of the fourth data is equal to a sum of the amount of the first data, the amount of the second data, and the amount of the third data.

11. A semiconductor device comprising:

a relay chip configured to be connected to a host;

a first chip connected to the relay chip via a first channel; and a second chip connected to the relay chip via a second channel, wherein the relay chip is configured to:

receive, from the host, a first enable signal for selecting the first channel and a second enable signal for selecting the second channel; and while the first enable signal is maintained at an active level and the second enable signal is maintained at an active level, perform, in parallel, a first data transfer operation via the first channel and a second data transfer operation via the second channel.

12. The semiconductor device according to claim 11, wherein the relay chip is further configured to:

be connected to the host via a third channel; and while the first enable signal is maintained at the active level and the second enable signal is maintained at the active level, perform, in parallel with the first data transfer operation and the second data transfer operation, a third data transfer operation via the third channel.

13. The semiconductor device according to claim 12, wherein the relay chip is further configured to:

communicate a first timing signal via the first channel, and perform the first data transfer operation in response to the first timing signal;

communicate a second timing signal via the second channel, and perform the second data transfer operation in response to the second timing signal; and communicate a third timing signal via the third channel, and perform the third data transfer operation in response to the third timing signal, wherein a frequency of the third timing signal is different from a frequency of the first timing signal and a frequency of the second timing signal.

14. The semiconductor device according to claim 13, wherein the relay chip includes a first queue and a second queue, and the relay chip is further configured to:

in the first data transfer operation, transfer data between the first chip and the first queue in response to the first timing signal;

in the second data transfer operation, transfer data between the second chip and the second queue in response to the second timing signal; and in the third data transfer operation, transfer data between the host and the first queue in response to an odd-numbered edge of the third timing signal, and transfer data between the host and the second queue in response to an even-numbered edge of the third timing signal.

15. The semiconductor device according to claim 11, wherein the relay chip is further configured to:

during a first period in which the first enable signal is maintained at the active level and the second enable signal is maintained at a non-active level, issue a first command to the first chip via the first channel.

16. The semiconductor device according to claim 15, wherein the relay chip includes a first queue, and the relay chip is further configured to:

after the first period, during a second period in which the first enable signal is maintained at the non-active level and the second enable signal is maintained at the active level, perform a fourth data transfer operation via the first channel to transfer first data from the first chip to the first queue.

17. The semiconductor device according to claim 16, wherein the relay chip is further configured to:

during the second period, in parallel with the fourth data transfer operation via the first channel, issue a second command to the second chip via the second channel.

18. The semiconductor device according to claim 17, wherein the relay chip further includes a second queue, and the relay chip is further configured to:

after the second period, during a third period in which the first enable signal is maintained at the non-active level and the second enable signal is maintained at the non-active level, perform a fifth data transfer operation via the second channel to transfer second data from the second chip to the second queue.

19. The semiconductor device according to claim 18, wherein the relay chip is further configured to:

after the third period, during a fourth period in which the first enable signal is maintained at the active level and the second enable signal is maintained at the active level, perform, in parallel, (A) the first data transfer operation in response to the first command via the first channel to transfer third data from the first chip to the first queue, and (B) the second data transfer operation in response to the second command via the second channel to transfer fourth data from the second chip to the second queue.

20. The semiconductor device according to claim 19, wherein the relay chip is further configured to:

be connected to the host via a third channel, and during the fourth period, perform, in parallel with the first data transfer operation and the second data transfer operation, a sixth data transfer operation via the third channel to transfer (C) the first data and the third data from the first queue to the host and (D) the second data and the fourth data from the second queue to the host.

* * * * *